(12) United States Patent
Bottoms et al.

(10) Patent No.: US 7,579,848 B2
(45) Date of Patent: Aug. 25, 2009

(54) HIGH DENSITY INTERCONNECT SYSTEM FOR IC PACKAGES AND INTERCONNECT ASSEMBLIES

(75) Inventors: Wilmer R. Bottoms, Palo Alto, CA (US); Fu Chiung Chong, Saratoga, CA (US); Sammy Mok, Cupertino, CA (US); Douglas Modlin, Palo Alto, CA (US)

(73) Assignee: Nanonexus, Inc., San Jose, CA (US)

( * ) Notice: Subject to any disclaimer, the term of this patent is extended or adjusted under 35 U.S.C. 154(b) by 0 days.

(21) Appl. No.: 11/350,049

(22) Filed: Feb. 7, 2006

(65) Prior Publication Data

US 2006/0186906 A1    Aug. 24, 2006

Related U.S. Application Data

(63) Continuation-in-part of application No. 11/133,021, filed on May 18, 2005, now Pat. No. 7,382,142, which is a continuation-in-part of application No. 10/870,095, filed on Jun. 16, 2004, now Pat. No. 7,349,223, which is a continuation-in-part of application No. 10/178,103, filed on Jun. 24, 2002, now Pat. No. 6,917,525, which is a continuation-in-part of application No. 09/980,040, filed on Nov. 27, 2001, now Pat. No. 6,799,976.

(60) Provisional application No. 60/651,294, filed on Feb. 8, 2005, provisional application No. 60/718,137, filed on Sep. 16, 2005.

(51) Int. Cl.
G01R 31/02    (2006.01)

(52) U.S. Cl. ..................................... 324/754

(58) Field of Classification Search ............... 324/754, 324/761–762, 765, 758, 158.1, 760; 439/66, 439/91, 877, 358, 752, 352, 350
See application file for complete search history.

(56) References Cited

U.S. PATENT DOCUMENTS 3,806,800 A    4/1974    Bove et al.

(Continued)

FOREIGN PATENT DOCUMENTS

AU    5964196 A    12/1996

(Continued)

OTHER PUBLICATIONS

Advanced Component Labs, Inc., "Semiconductor Packaging Substrates," Quickturn Source for Semiconductor Substrates, 2 pages.

(Continued)

Primary Examiner—Ha Nguyen
Assistant Examiner—Tung X. Nguyen
(74) Attorney, Agent, or Firm—Michael A. Glenn; Glenn Patent Group

(57) ABSTRACT

An improved interconnection system is described, such as for electrical contactors and connectors, electronic device or module package assemblies, socket assemblies, and/or probe card assembly systems. An exemplary connector comprises a first connector structure comprising a contactor substrate having a contact surface and a bonding surface, and one or more electrically conductive micro-fabricated spring contacts extending from the probe surface, a second connector structure comprising at least one substrate and having a set of at least one electrically conductive contact pad located on a connector surface and corresponding to the set of spring contacts, and means for movably positioning and aligning the first connector structure and the second connector structure between at least a first position and a second position, such that in at least one position, at least one electrically conductive micro-fabricated spring contact is electrically connected to at least one electrically conductive contact pad.

50 Claims, 22 Drawing Sheets

U.S. PATENT DOCUMENTS

| | | |
|---|---|---|
| 3,806,801 A | 4/1974 | Bove |
| 3,810,017 A | 5/1974 | Wiesler et al. |
| 3,835,381 A | 9/1974 | Garretson et al. |
| 3,842,189 A | 10/1974 | Southgate |
| 3,856,647 A | 12/1974 | Blachman |
| 3,939,414 A | 2/1976 | Roch |
| 4,035,046 A | 7/1977 | Kloth |
| 4,038,599 A | 7/1977 | Bove et al. |
| 4,177,425 A | 12/1979 | Lenz |
| 4,195,259 A | 3/1980 | Reid et al. |
| 4,201,393 A | 5/1980 | Kawashima et al. |
| 4,214,201 A | 7/1980 | Kern |
| 4,320,438 A | 3/1982 | Ibrahim et al. |
| 4,362,991 A | 12/1982 | Carbine |
| 4,416,759 A | 11/1983 | Harra |
| 4,423,376 A | 12/1983 | Byrnes et al. |
| 4,423,401 A | 12/1983 | Mueller |
| 4,436,602 A | 3/1984 | Harra |
| 4,480,223 A | 10/1984 | Aigo |
| 4,508,612 A | 4/1985 | Blackwell et al. |
| 4,518,910 A | 5/1985 | Hottenrott et al. |
| 4,522,893 A | 6/1985 | Bohlen et al. |
| 4,548,451 A | 10/1985 | Benarr et al. |
| 4,567,432 A | 1/1986 | Buol et al. |
| 4,599,559 A | 7/1986 | Evans |
| 4,622,514 A | 11/1986 | Lewis |
| 4,636,722 A | 1/1987 | Ardezzone |
| 4,647,852 A | 3/1987 | Smith et al. |
| 4,661,233 A | 4/1987 | Glasser |
| 4,667,154 A | 5/1987 | Allerton et al. |
| 4,686,464 A | 8/1987 | Elsasser et al. |
| 4,716,500 A | 12/1987 | Payne |
| 4,719,417 A | 1/1988 | Evans |
| 4,724,377 A | 2/1988 | Maelzer et al. |
| 4,758,927 A | 7/1988 | Berg |
| 4,764,723 A | 8/1988 | Strid |
| 4,816,754 A | 3/1989 | Buechele et al. |
| 4,834,855 A | 5/1989 | Bloomquist et al. |
| 4,837,622 A | 6/1989 | Whann et al. |
| 4,908,571 A | 3/1990 | Stoehr |
| 4,924,589 A | 5/1990 | Leedy |
| 4,933,045 A | 6/1990 | DiStefano et al. |
| 4,942,076 A | 7/1990 | Panicker et al. |
| 4,956,923 A | 9/1990 | Pettingell et al. |
| 4,965,865 A | 10/1990 | Trenary |
| 4,970,106 A | 11/1990 | DiStefano et al. |
| 4,973,903 A | 11/1990 | Schemmel |
| 4,975,638 A | 12/1990 | Evans et al. |
| 5,032,896 A | 7/1991 | Little et al. |
| 5,055,778 A | 10/1991 | Okubo et al. |
| 5,070,297 A | 12/1991 | Kwon et al. |
| 5,084,672 A | 1/1992 | Ikeuchi et al. |
| 5,103,557 A | 4/1992 | Leedy |
| 5,109,596 A | 5/1992 | Driller et al. |
| 5,121,298 A | 6/1992 | Sarma et al. |
| 5,144,228 A | 9/1992 | Sorna et al. |
| 5,148,103 A | 9/1992 | Pasiecznik, Jr. |
| 5,148,265 A | 9/1992 | Khandros et al. |
| 5,148,266 A | 9/1992 | Khandros et al. |
| 5,152,695 A | 10/1992 | Grabbe et al. |
| 5,154,810 A | 10/1992 | Kamerling et al. |
| 5,166,774 A | 11/1992 | Banerji et al. |
| 5,189,363 A | 2/1993 | Bregman et al. |
| 5,191,708 A | 3/1993 | Kasukabe et al. |
| 5,208,531 A | 5/1993 | Aton |
| 5,210,485 A | 5/1993 | Kreiger et al. |
| 5,214,375 A | 5/1993 | Ikeuchi et al. |
| 5,225,037 A | 7/1993 | Elder et al. |
| 5,227,718 A | 7/1993 | Stowers et al. |
| 5,240,583 A | 8/1993 | Ahonen |
| 5,255,079 A | 10/1993 | Kageyama |
| 5,258,648 A | 11/1993 | Lin |
| 5,278,442 A | 1/1994 | Prinz et al. |
| 5,280,139 A | 1/1994 | Suppelsa et al. |
| 5,313,157 A | 5/1994 | Pasiecznik, Jr. |
| 5,326,428 A | 7/1994 | Farnworth et al. |
| 5,347,159 A | 9/1994 | Khandros et al. |
| 5,352,266 A | 10/1994 | Erb et al. |
| 5,354,205 A | 10/1994 | Feigenbaum |
| 5,367,764 A | 11/1994 | DiStefano et al. |
| 5,373,627 A | 12/1994 | Grebe |
| 5,385,477 A | 1/1995 | Vaynkof et al. |
| 5,395,253 A | 3/1995 | Crumly |
| 5,412,866 A | 5/1995 | Woith et al. |
| 5,416,429 A | 5/1995 | McQuade et al. |
| 5,433,797 A | 7/1995 | Erb et al. |
| 5,440,241 A | 8/1995 | King et al. |
| 5,473,254 A | 12/1995 | Asar |
| 5,476,211 A | 12/1995 | Khandros |
| 5,489,852 A | 2/1996 | Gomez |
| 5,521,518 A | 5/1996 | Higgins |
| 5,521,523 A | 5/1996 | Kimura et al. |
| 5,523,697 A | 6/1996 | Farnworth et al. |
| 5,530,371 A | 6/1996 | Perry et al. |
| 5,532,612 A | 7/1996 | Liang |
| 5,534,784 A | 7/1996 | Lum et al. |
| 5,546,012 A | 8/1996 | Perry et al. |
| 5,558,928 A | 9/1996 | DiStefano et al. |
| 5,563,521 A | 10/1996 | Crumly |
| 5,568,054 A | 10/1996 | Iino et al. |
| 5,570,032 A | 10/1996 | Atkins et al. |
| 5,600,257 A | 2/1997 | Leas et al. |
| 5,613,861 A | 3/1997 | Smith et al. |
| 5,621,333 A | 4/1997 | Long et al. |
| 5,621,373 A | 4/1997 | McCormick |
| 5,629,631 A | 5/1997 | Perry et al. |
| 5,635,846 A | 6/1997 | Beaman et al. |
| 5,656,138 A | 8/1997 | Scobey et al. |
| 5,657,394 A | 8/1997 | Schwartz et al. |
| 5,663,596 A | 9/1997 | Little |
| 5,665,648 A | 9/1997 | Little |
| 5,694,050 A | 12/1997 | Noguchi |
| 5,703,494 A | 12/1997 | Sano |
| 5,707,575 A | 1/1998 | Litt et al. |
| 5,744,283 A | 4/1998 | Spierings et al. |
| 5,756,021 A | 5/1998 | Hedrick et al. |
| 5,763,941 A | 6/1998 | Fjelstad |
| 5,764,070 A | 6/1998 | Pedder |
| 5,772,451 A | 6/1998 | Dozier, II et al. |
| 5,786,701 A | 7/1998 | Pedder |
| 5,798,027 A | 8/1998 | Lefebvre et al. |
| 5,800,184 A | 9/1998 | Lopergolo et al. |
| 5,801,441 A | 9/1998 | Smith et al. |
| 5,806,181 A | 9/1998 | Khandros et al. |
| 5,820,014 A | 10/1998 | Dozier, II et al. |
| 5,821,763 A | 10/1998 | Beaman et al. |
| 5,821,764 A | 10/1998 | Slocum et al. |
| 5,828,226 A | 10/1998 | Higgins et al. |
| D401,250 S | 11/1998 | Tudhope |
| D401,251 S | 11/1998 | Tudhope |
| D401,252 S | 11/1998 | Tudhope |
| 5,829,128 A | 11/1998 | Eldridge et al. |
| 5,830,327 A | 11/1998 | Kolenkow |
| 5,832,598 A | 11/1998 | Greenman et al. |
| 5,832,601 A | 11/1998 | Eldridge et al. |
| D403,002 S | 12/1998 | Tudhope |
| D403,334 S | 12/1998 | Tudhope |
| 5,844,421 A | 12/1998 | Lee et al. |
| 5,847,572 A | 12/1998 | Iwasaki et al. |
| 5,848,685 A | 12/1998 | Smith et al. |
| 5,852,871 A | 12/1998 | Khandros |
| 5,864,946 A | 2/1999 | Eldridge et al. |
| 5,869,974 A | 2/1999 | Akram et al. |
| 5,878,486 A | 3/1999 | Eldridge et al. |

| | | | |
|---|---|---|---|
| 5,884,395 A | 3/1999 | Dabrowiecki et al. | |
| 5,884,398 A | 3/1999 | Eldridge et al. | |
| 5,886,535 A | 3/1999 | Budnaitis et al. | |
| 5,896,038 A | 4/1999 | Budnaitis et al. | |
| 5,897,326 A | 4/1999 | Eldridge et al. | |
| 5,900,738 A | 5/1999 | Khandros et al. | |
| 5,905,305 A | 5/1999 | Fogal et al. | |
| 5,912,046 A | 6/1999 | Eldridge et al. | |
| 5,914,218 A | 6/1999 | Smith et al. | |
| 5,917,707 A | 6/1999 | Khandros et al. | |
| 5,926,951 A | 7/1999 | Khandros et al. | |
| 5,944,537 A | 8/1999 | Smith et al. | |
| 5,968,327 A | 10/1999 | Kobayashi | |
| 5,973,504 A | 10/1999 | Chong et al. | |
| 5,974,662 A | 11/1999 | Eldridge et al. | |
| 5,977,787 A | 11/1999 | Das et al. | |
| 5,983,493 A | 11/1999 | Eldridge et al. | |
| 5,993,616 A | 11/1999 | Suwabe et al. | |
| 5,994,152 A | 11/1999 | Khandros et al. | |
| 5,994,222 A | 11/1999 | Smith et al. | |
| 5,994,781 A | 11/1999 | Smith | |
| 5,998,228 A | 12/1999 | Eldridge et al. | |
| 5,998,864 A | 12/1999 | Khandros et al. | |
| 6,001,671 A | 12/1999 | Fjelstad | |
| 6,002,168 A | 12/1999 | Bellaar et al. | |
| 6,007,349 A | 12/1999 | Distefano et al. | |
| 6,012,224 A | 1/2000 | DiStefano et al. | |
| 6,014,032 A | 1/2000 | Maddix et al. | |
| 6,020,220 A | 2/2000 | Gilleo et al. | |
| 6,023,103 A | 2/2000 | Chang et al. | |
| 6,028,437 A | 2/2000 | Potter | |
| 6,029,344 A | 2/2000 | Khandros et al. | |
| 6,030,856 A | 2/2000 | DiStefano et al. | |
| 6,032,356 A | 3/2000 | Eldridge et al. | |
| 6,033,935 A | 3/2000 | Dozier, II et al. | |
| 6,042,712 A | 3/2000 | Mathieu | |
| 6,043,563 A | 3/2000 | Eldridge et al. | |
| 6,044,548 A | 4/2000 | Distefano et al. | |
| 6,045,395 A | 4/2000 | Saito | |
| 6,045,396 A | 4/2000 | Tighe | |
| 6,045,655 A | 4/2000 | DiStefano et al. | |
| 6,046,076 A | 4/2000 | Mitchell et al. | |
| 6,049,972 A | 4/2000 | Link et al. | |
| 6,049,976 A | 4/2000 | Khandros | |
| 6,050,829 A | 4/2000 | Eldridge et al. | |
| 6,054,337 A | 4/2000 | Solberg | |
| 6,054,756 A | 4/2000 | DiStefano et al. | |
| 6,060,891 A | 5/2000 | Hembree et al. | |
| 6,063,648 A | 5/2000 | Beroz et al. | |
| 6,064,213 A | 5/2000 | Khandros et al. | |
| 6,075,289 A | 6/2000 | Distefano | |
| 6,078,186 A | 6/2000 | Hembree et al. | |
| 6,078,189 A | 6/2000 | Noel | |
| 6,080,603 A | 6/2000 | Distefano et al. | |
| 6,080,605 A | 6/2000 | Distefano et al. | |
| 6,080,932 A | 6/2000 | Smith et al. | |
| 6,081,035 A | 6/2000 | Warner et al. | |
| 6,090,261 A | 7/2000 | Mathieu | |
| 6,091,256 A | 7/2000 | Long et al. | |
| 6,110,823 A | 8/2000 | Eldridge et al. | |
| 6,114,864 A | 9/2000 | Soejima et al. | |
| 6,117,694 A | 9/2000 | Smith et al. | |
| 6,118,894 A | 9/2000 | Schwartz et al. | |
| 6,137,297 A | 10/2000 | McNair et al. | |
| 6,147,876 A | 11/2000 | Yamaguchi et al. | |
| 6,150,186 A | 11/2000 | Chen et al. | |
| 6,169,411 B1 | 1/2001 | Johnson | |
| 6,183,267 B1 | 2/2001 | Marcus et al. | |
| 6,184,053 B1 | 2/2001 | Eldridge et al. | |
| 6,184,065 B1 | 2/2001 | Smith et al. | |
| 6,184,699 B1 | 2/2001 | Smith et al. | |
| 6,190,513 B1 | 2/2001 | Forster | |
| 6,192,982 B1 | 2/2001 | Divis et al. | |
| 6,203,331 B1 | 3/2001 | McHugh et al. | |
| 6,204,674 B1 | 3/2001 | Dabrowiecki et al. | |
| 6,213,789 B1 | 4/2001 | Chua et al. | |
| 6,215,320 B1 | 4/2001 | Parrish | |
| 6,215,321 B1 | 4/2001 | Nakata | |
| 6,218,033 B1 | 4/2001 | Cao et al. | |
| 6,218,910 B1 | 4/2001 | Miller | |
| 6,232,143 B1 | 5/2001 | Maddix et al. | |
| 6,246,247 B1 | 6/2001 | Eldridge et al. | |
| 6,255,126 B1 | 7/2001 | Mathieu et al. | |
| 6,264,477 B1 | 7/2001 | Smith et al. | |
| 6,265,888 B1 | 7/2001 | Hsu | |
| 6,274,823 B1 | 8/2001 | Khandros et al. | |
| 6,277,249 B1 | 8/2001 | Gopalraja et al. | |
| 6,288,560 B1 | 9/2001 | Wohlfarth | |
| 6,290,510 B1 | 9/2001 | Fork et al. | |
| 6,292,003 B1 | 9/2001 | Fredrickson et al. | |
| 6,292,007 B1 | 9/2001 | Potter | |
| 6,300,783 B1 | 10/2001 | Okubo et al. | |
| 6,306,265 B1 | 10/2001 | Fu et al. | |
| 6,336,269 B1 | 1/2002 | Eldridge et al. | |
| 6,340,320 B1 | 1/2002 | Ogawa | |
| 6,351,133 B1 | 2/2002 | Jones et al. | |
| 6,352,454 B1 | 3/2002 | Kim et al. | |
| 6,356,098 B1 | 3/2002 | Akram et al. | |
| 6,358,376 B1 | 3/2002 | Wang et al. | |
| 6,361,331 B2 | 3/2002 | Fork et al. | |
| 6,396,677 B1 | 5/2002 | Chua et al. | |
| 6,398,929 B1 | 6/2002 | Chiang et al. | |
| 6,419,500 B1 | 7/2002 | Kister | |
| 6,424,166 B1 | 7/2002 | Henry et al. | |
| 6,425,988 B1 | 7/2002 | Montcalm et al. | |
| 6,426,686 B1 | 7/2002 | Douriet et al. | |
| 6,429,671 B1 | 8/2002 | Duckworth et al. | |
| 6,439,898 B2 | 8/2002 | Chua et al. | |
| 6,476,626 B2 | 11/2002 | Aldaz et al. | |
| 6,483,328 B1 | 11/2002 | Eldridge et al. | |
| 6,489,795 B1 | 12/2002 | Klele et al. | |
| 6,497,799 B1 | 12/2002 | McLeod | |
| 6,501,343 B2 | 12/2002 | Miller | |
| 6,509,751 B1 | 1/2003 | Mathieu et al. | |
| 6,520,778 B1 | 2/2003 | Eldridge et al. | |
| 6,525,555 B1 | 2/2003 | Khandros et al. | |
| 6,528,350 B2 | 3/2003 | Fork | |
| 6,528,984 B2 | 3/2003 | Beaman et al. | |
| 6,534,856 B1 | 3/2003 | Dozier, II et al. | |
| 6,544,814 B1 | 4/2003 | Yasunaga et al. | |
| 6,586,956 B2 * | 7/2003 | Aldaz et al. | 324/758 |
| 6,600,334 B1 | 7/2003 | Hembree et al. | |
| 6,616,966 B2 | 9/2003 | Mathieu et al. | |
| 6,624,648 B2 | 9/2003 | Eldridge et al. | |
| 6,640,415 B2 | 11/2003 | Eslamy et al. | |
| 6,645,257 B1 | 11/2003 | Schacht | |
| 6,651,325 B2 | 11/2003 | Lee et al. | |
| 6,684,499 B2 | 2/2004 | Romano et al. | |
| 6,734,688 B1 | 5/2004 | Castellano et al. | |
| 6,741,085 B1 * | 5/2004 | Khandros et al. | 324/754 |
| 6,751,850 B2 | 6/2004 | Hu | |
| 6,791,171 B2 | 9/2004 | Mok et al. | |
| 6,799,976 B1 | 10/2004 | Mok | |
| 6,812,718 B1 | 11/2004 | Chong et al. | |
| 6,815,961 B2 | 11/2004 | Mok et al. | |
| 6,827,584 B2 | 12/2004 | Mathieu et al. | |
| 6,844,214 B1 | 1/2005 | Mei et al. | |
| 6,847,218 B1 | 1/2005 | Nulty et al. | |
| 6,856,150 B2 | 2/2005 | Sporck et al. | |
| 6,856,225 B1 | 2/2005 | Chua et al. | |
| 6,888,362 B2 * | 5/2005 | Eldridge et al. | 324/757 |
| 6,888,364 B2 | 5/2005 | Cram | |
| 6,920,689 B2 | 7/2005 | Khandros et al. | |
| 7,009,412 B2 | 3/2006 | Chong et al. | |
| 7,048,548 B2 | 5/2006 | Mathieu et al. | |
| 7,116,119 B2 | 10/2006 | Sporck et al. | |

| | | | |
|---|---|---|---|
| 7,138,818 B2 | 11/2006 | Chong et al. | |
| 7,247,035 B2 | 7/2007 | Mok et al. | |
| 2001/0009305 A1 | 7/2001 | Fjelstad | |
| 2001/0009724 A1 | 7/2001 | Chen et al. | |
| 2001/0021483 A1 | 9/2001 | Mathieu et al. | |
| 2002/0000013 A1 | 1/2002 | Sugaya et al. | |
| 2002/0000016 A1 | 1/2002 | Hsieh | |
| 2002/0013070 A1 | 1/2002 | Fork et al. | |
| 2002/0016095 A1 | 2/2002 | Fork et al. | |
| 2002/0055282 A1 | 5/2002 | Eldridge et al. | |
| 2002/0075105 A1 | 6/2002 | Douriet et al. | |
| 2002/0132501 A1 | 9/2002 | Eldridge et al. | |
| 2002/0164893 A1 | 11/2002 | Mathieu et al. | |
| 2002/0171133 A1 | 11/2002 | Mok et al. | |
| 2003/0000010 A1 | 1/2003 | Shimizu | |
| 2003/0010615 A1 | 1/2003 | Fork et al. | |
| 2003/0071348 A1 | 4/2003 | Eguchi et al. | |
| 2003/0075795 A1 | 4/2003 | Hashimoto | |
| 2003/0197285 A1 | 10/2003 | Strandberg et al. | |
| 2004/0058487 A1 | 3/2004 | Eslamy et al. | |
| 2004/0102064 A1 | 5/2004 | Mathieu | |
| 2004/0155337 A1 | 8/2004 | Strandberg et al. | |
| 2005/0012513 A1 | 1/2005 | Cheng et al. | |
| 2005/0212540 A1 | 9/2005 | Nulty et al. | |
| 2005/0280430 A1 | 12/2005 | Cram | |

FOREIGN PATENT DOCUMENTS

| | | |
|---|---|---|
| AU | 6028796 A | 12/1996 |
| AU | 6377796 A | 12/1996 |
| AU | 6635296 A | 12/1996 |
| CN | 1171167 A | 1/1998 |
| CN | 1191500 A | 8/1998 |
| CN | 1208368 A | 2/1999 |
| DE | 3630548 | 3/1988 |
| DE | 69431565 | 6/2003 |
| DE | 69633334 | 2/2005 |
| EP | 0369112 | 7/1989 |
| EP | 0623826 | 11/1994 |
| EP | 0681186 A2 | 11/1995 |
| EP | 0731369 A2 | 9/1996 |
| EP | 0792462 A | 9/1997 |
| EP | 0792463 A | 9/1997 |
| EP | 0795200 A | 9/1997 |
| EP | 0802419 A | 10/1997 |
| EP | 0828582 A | 3/1998 |
| EP | 0837750 | 4/1998 |
| EP | 0859686 | 8/1998 |
| EP | 0886894 | 12/1998 |
| EP | 0792519 A | 3/2003 |
| EP | 0792517 | 10/2003 |
| FR | 2518358 A | 10/1981 |
| JP | 02064091 | 3/1990 |
| JP | 3058919 | 3/1991 |
| JP | 3267763 | 11/1991 |
| JP | 5335746 | 12/1993 |
| JP | 7301642 A | 11/1995 |
| JP | 9512139 T | 2/1997 |
| JP | 1995-292471 | 5/1997 |
| JP | 9508241 T | 8/1997 |
| JP | 9281144 A | 10/1997 |
| JP | 10506197 T | 6/1998 |
| JP | 10506238 T | 6/1998 |
| JP | 10510107 T | 9/1998 |
| JP | 1164386 | 3/1999 |
| JP | 2892505 | 5/1999 |
| JP | 11126800 A | 5/1999 |
| JP | 11506829 T | 6/1999 |
| JP | 11508407 T | 7/1999 |
| JP | 2968051 | 10/1999 |
| JP | 11514493 T | 12/1999 |
| JP | 3022312 | 3/2000 |
| JP | 2000067953 A | 3/2000 |
| JP | 2000513499 T | 10/2000 |
| JP | 2001020067 | 8/2002 |
| KR | 252457 B | 4/2000 |
| SG | 55303 A | 12/1998 |
| WO | WO9425987 | 11/1994 |
| WO | WO9514314 | 5/1995 |
| WO | WO9615458 | 5/1996 |
| WO | WO9615459 A | 5/1996 |
| WO | WO9615551 | 5/1996 |
| WO | WO9616440 | 5/1996 |
| WO | WO9617378 | 6/1996 |
| WO | WO9637331 A | 11/1996 |
| WO | WO9637332 | 11/1996 |
| WO | WO9638858 | 12/1996 |
| WO | WO9641506 A | 12/1996 |
| WO | WO9743656 | 11/1997 |
| WO | WO9744676 | 11/1997 |
| WO | WO9801906 | 1/1998 |
| WO | WO9852224 | 11/1998 |
| WO | WO9914404 | 3/1999 |
| WO | WO9918445 | 4/1999 |
| WO | WO0052487 | 9/2000 |
| WO | WO0052488 | 9/2000 |
| WO | WO0052703 | 9/2000 |
| WO | WO0073905 | 12/2000 |
| WO | WO0074110 A2 | 12/2000 |
| WO | WO0075677 | 12/2000 |
| WO | WO0109623 | 2/2001 |
| WO | WO0109952 | 2/2001 |
| WO | WO0113130 | 2/2001 |
| WO | WO0148818 | 7/2001 |
| WO | WO0148870 | 7/2001 |
| WO | WO0198793 | 12/2001 |
| WO | WO03018865 | 3/2003 |
| WO | WO03081725 | 10/2003 |
| WO | WO2005091996 | 10/2005 |

OTHER PUBLICATIONS

Advanced Technology Program, Project Brief-98-06-0025, "Membrane Probes for Wafer, Package and Substrate Testing," Microelectronics Manufacturing Infrastructure, 2 pages, Oct. 1998.

Anderson, J., "High-Performance Multi-DUT Interfacing for Wafer Sort," Sep. 1997.

Anderson, J., "Integrated Probe Card/Interface Solutions for Specific Test Applications," International Test Conference, 1998.

Anthony, T.R., "Diodes formed by laser drilling and diffusion," 1982 American Institute of Physics, J.Appl. Physics 53(12), Dec. 1982.

Anthony, T.R., "To Fabricate Electrical Interconnections," 1981 American Institute of Physics, J.Appl. Physics 52(8), Aug. 1981.

Artisanplating.com, "Characteristics of electroplated rhodium finishes," Jan. 15, 2002.

Artisanplating.com, "Chart B: Basics of Electroplating Principles," Jan. 15, 2002.

Asai, S. et al., "Probe Card with Probe Pins Grownby the Vapor-Liquid-Solid (VLS) Method," IEEE Trans, On Components, Packaging, & Manufacturing Technology, Jun. 1996.

ATP Proposers Conference, 1 page, May 8, 2002.

Bakir, M. et al., "Sol-Compliant Wafer-level Package Technologies," Semiconductor International Apr. 2002.

Bakir, M.S., "Sea of Polymer Pillars Electrical and Optical Chip I/O Interconnections for Gigascale Integration," IEEE Transactions on Electron Devices, vol. 51, No. 7, pp. 1069-1077, Jul. 2004.

Barsotti, C. et al., "Very High Density Probing; International Test Conference Proceedings of the New Frontiers in Testing," 1988.
Barsotti, C., et al., "New Probe Cards Replace Needle Types; Semiconductor International," Aug. 1988.
Bastani, B. et al., "Intellectual Property Rights in Nanotechnology."
Bates, R.D. et al., "Search for the Universal Probe Card Solution," International Test Conference, 1997.
Beiley, M. et al., "A Micromachined Array Probe Card-Fabrication Process," IEEE Transactions on Components, Packaging, and Manufacturing Technology, Feb. 1995.
Beiley, M. et al., "Array Probe Card," Proceedings of the IEEE Multi-Chip Module Conference, 1992.
Beiley, M. et al., "Micro-Machined Array Probe Card; Procedure of the IEEE International Electronics Devices Meeting," 1992.
Bell Labs Innovations, "Lucent Technologies Electroplating Chemicals & Services Venture Develops High-Performance Material For Connector Contacts," http://www.bell-labs.com/news/1998/October/23/1.html, Jan. 15, 2002.
Bergman, D., "Forming Microvias," wwww.pcfab.com; vol. 24. No. 3, Mar. 2001.
Bilenberg, B., "PMMA to SU-8 bonding for polymer based lab-on-a-chip systems with integrated optics," Submitted to: J. Micromech., Microengineering, pp. 1-10.
Bogatin, E., "Semiconductor Packaging," Technology News, Jan. 2003.
Bonham, M. et al., "Wafer-Probe Testing of High-Pin-Count ICs," Microelectronic Manufacturing and Testing, Nov. 1988.
Broz, J.J. et al., "Understanding Probe-Contact a-Spot Oxidation During Elevated-Temperature Wafer Test," Elevated Engineering, Sep. 1999.
Carbonero, J., "Comparison Between Beryllium-Copper and Tungsten High Frequency Air Coplanar Probes," IEEE Transactions on Microwave Theory and Techniques, vol. 43, No. 12, Dec. 1995, pp. 2786-2792.
Cascade Microtech, Cleaning Pyramid Probe Cards for Aluminum Pads, PPD-CLEAN-APP-0702 (p/n 121-710) 2002.
Cascade Microtech, Innovating Test Technologies, VLSR Pyramid Probe Series, Pyramid-DS-1201, 2001.
Cascade Microtech, LSI Pyramid Probe Series, LSIDS-1200, 2001.
Cascade Microtech, Pyramid Probe Cards, PRYPROBE-App-0604, pp. 1-5, 2004.
Cascade Microtech, Pyramid Probe Core Geometries, PPCORETB18-0401, 2001.
Cascade Microtech, Pyramid Probe Family, VLSR-DS-1001, 2001.
Cascade Microtech, Technical Brief, Mechanical Differences Between Pyramid and Cantilever Probes, PPDIFFTB20-0901, 2001.
Cascade Microtech/Advantages, www.cmicro.com/index.cfm/fuseaction/pg.view/plD/297, Nov. 15, 2004, 2 pages.
Center for Tribology, Inc., "Characterization of Overcoat Durability for MEMS," Application Note, www.cetr.com.
Chen, Y., "Men for Feminism—an Effort to Cure 'Taiwanese Cultural Schzophrenia.'"
Chen, K. et al., "Microstructure Examination of Copper Wafer Bonding," Massachusetts Institute of Technology, Cambridge, MA 02139, 18 pages.
Cheng, C. H. et al., "Electrical Through-Wafer Interconnects with Sub-PicoFarad Parasitic Capacitance," Publication from Ginzton Labs, Stanford, CA.
Cheng, C.H. et. al., "An Efficient Electrical Addressing Method using Through-Wafer Vias for Two-Dimensional Ultrasonic Arrays," Ginzton Lab, Stanford, CA.
Chiang, C., "Wafer Level Backside Emission Microscopy: Dynamics and Effects," Microelectronics Reliability, May 1999.
Chow, E. et al., Electrical Through-Wafer Interconnects for Released Silicon Sensors, Ginzton Lab, Stanford, CA.
Chow, E. et al., "Through-Wafer Electrical Interconnects Compatible with Standard Semiconductor Processing," Standford University, Stanford, CA.
Chow, E.M., "Process Compatible Polysilicon-Based Electrical Through-Wafer Interconnection in Silicon Substrates," Journal of Microelectromechanical Systems, vol. 11, No. 6, Dec. 2002.
Cobra, "Probe Cards," Array Probe Card Product; pp. 1-3, Nov. 9, 2001.
"Comparisons of Materials: Coefficient of Thermal Expansion," www.handyharmancanada.com/The BrazingBrook/comparis.htm, Sep. 4, 2002.
Composite Beams 5.11, pp. 301-305.
Comtois, J.H., et al., "Fabricating Micro-Instruments in Surface-Micromachined Polycrystalline Silicon," The $43^{rd}$ International Instrumentation Symposium, 1997.
Connector Specifier, "Electrically Conductive Adhesives," Feb. 1999.
Douglas Plating Limited, "www.douglas-plating.co.uk/top.html," Jan. 16, 2002.
Dudley, D., "Emerging Digital Micromirror Device (DMD) Applications," DLP Products New Applications, Texas Instruments, Inc. P.O. Box 869305, MS 8477, Plano, Texas 75086.
DuraProbe, "DuraProbe Specifications," Kulick & Soffa Industries, Inc., 1 page, 2001.
"Efunds: Surface Treatments," Electroplating. Jan. 15, 2002.
Ehlermann, E., "Matched Expansion Probe Cards," Hiten 99 $3^{rd}$ European Conference on High Temperature Electronics, 1999.
Ehrlich, D.J. et al., Fabrication of Through-Wafer Via Conductors in Si by Laser, IEEE Transactions, 0148-6411/821200-0520, 1982 IEEE.
"Electroplating of Hard Glassy Metals," National Aeronautics and Space Administration; www.nasasolutions.com, Feb. 27, 2001.
"Electroplating Properties by Solution by Type," Types of Plating Services We Provide, www.epson-platingcom.sg/wegtop/proper1.html, Feb. 15, 2002.
Emery, R., "Novel Microelectronic Packaging Method for reduced Thermomechanica Stresses on Low Dielectric Constant Materials," Advanced Metabolism Conf; Montreal, Canada, Oct. 9, 2001.
Evans, U.R., "The Corrosion and Oxidation of Metals: Scientific Principles and Practice Applications," London, Edward Arnold (Publishers) Ltd., Chapter II, pp. 18-29, 32-35 & 820&821.
Final Patent Report, PARC; Nov. 21, 2003.
Formfactor Business, Overview.
"Fundamentals of Contact Resistance," Part 1—Contact Theory; Advanced probing Systems, Inc. Technical Bulletin, May 1999.
Goldstein, H., "Packages, Stacking different chips," IEEE Spectrum, Aug. 2001.
Grosjean, C. et al., A Practical Thermopneumatic Valve; Caltech EE 136-96; Pasadena, CA.

Haemer, J.M., et al., "Flexible Mico-Spring Interconnects for High Performance Probing," Electronic Components and Technology Conference, 2000 Proceedings, 50th Volume, pp. 1157-1163, 2002.

Hah, D., "A Low-Voltage Actuated Micromachined Microwave Switch Using Torsion Spings and Leverage," IEEE Transaction on Microwave Theory and Techniques, vol. 48, No. 12, pp. 2540-2545, Dec. 2000.

Ho, M,Y. et al., "Morphology and Crystallization Kinetics in HfO2 Thin Films Grown by Atomic Layer Deposition," pp. 1-18, Jun. 1, 2002.

Ho, M.Y. et al., "Suppressed Crystallization Of Hf-Gate Dielectrics By Controlled Addition Of Al2O3 Using Atomic Layer Deposition," Applied Physics Letters; American Institute of Physics, pp. 4218-4220, 2002.

Hong, S. et al., "Design & Fabrication of a MonolothicHigh-Density Probe Card for High-Frequency On-Wafer Testing," International Electronic Devices Meeting Technical Digest, 1989.

Huges, P., "Science Over Art," Our New IC Membrane Test Probe.

IBM Research, Conclusion, p. 24, Jun. 4, 2001.

Intel Develops Breakthrough Packaging Technology, Intel Labs, 2002.

International Technology Roadmap for Semiconductors, Executive Summary, 2001 Edition.

International Technology Roadmap for Semiconductors; Assembly and Packaging, 2001 Edition.

Itoh, T. et al., "Characteristics of Fritting Contacts Utilized for Micromachined Wafer Probe Cards," Review of Scientific Instruments, May 2000.

Itoh, T., "Contact Properties of Micromachines Ni Probes," IEEE vol. 8:2, pp. 223-227, 2003.

Jacob, G., "Contacting a Multitude of Miniscule Nodes," Evaluation Engineering, Aug. 1991.

Jacob, G., "Shrinking Geometry Issues," Probe Cards and Station Cope with Submicron IC Features, www.evaluationengineering.com/archive/articles/0398wafr.htm, 6 pages, Nov. 8, 2004.

Kataoka, K., et al., "Low contact-force and compliant MEMS probe card utilizing fritting contact," 0-7803-7185-2/02, IEEE, 2002.

Kataoka, K., Contact Properties of Ni Micro-Springs for MEMS Probe Card, vol. 8.4, pp. 231-235.

Kim, B. et al., "A Novel MEM Silicon Probe Card," 0-7803-7185-2/0, IEEE, 2002.

Kim, B.,"A Vertically Guided MEMS Probe Card with Deeply Recessed Trench-Type Cantilever," pp. 271-274, IEEE, 2005.

Kruger, C. et al., "Electroplated Micro-Springs for Demountable Chip Connections 13th European Conf," Sep. 12-15, 1999.

Landis, D.L., "A Self-Test System Architecture for Reconfigurable WSI," International Test Conference Procedure Meeting the Tests of Time, 1989.

Landis, D.L., "Self-Test Methodology for Restructurable WSI," Procedure of the International Conference on Wafer Scale Integration, 1990.

Landis, D.L., "A Test Methodology for Wafer Scale Systems," IEEE Transactions on Computer-Aided Design of Integrated Circuits & Systems, Jan. 1992.

Lecklider, T., "Technical Editor: Multiple Area-Array Devices Challenge Wafter Probing" Wafer Test EE, www.evaluationengineering, pp. 25-28, 31&34, 37&38, Mar. 1999.

Lee, K.M., "SEM/EDS evaluation of porcelain adherence to gold-coated cast titanium," Journal of Biomedical Materials Research Part B: Applied Biomaterials, vol. 68B, Issue 2, pp. 165-173.

Lee, S., "Curled Micro-Cantilevers using Benzocyclobutene Polymer and Mo for Wafer Level probing," Sensors and Actuators A 121, pp. 472-479, 2005.

Leslie, B. et al., "Membrane Probe Card Technology (The future for high performance test)," ITC Proceedings, p. 601, 1988.

Leslie, B., et al., "Wafer-Level Testing with a Membrane Probe," IEEE Design & Test of Computers, Feb. 1989.

Leung, J. et al., "Active Substrate Membrane Probe Card; International Electron Devices Meeting Technical Digest," 1995.

Levy, L., "WaferProbe System," Jun. 1997.

Li, X. et al., "Fabrication of High-Density Electrical Feed-Throughs by Deep-Reactive-Ion Etching of Pyrex Glass," Journal of Microelectromechanical Systems, vol. 11, No. 6, Dec. 2002.

Li, X. et al., "High Density Electrical Feedthrough Fabricated," 0-7803-5998-4/01 IEEE 2001.

Lin, C. et al., "Universal Substrate Development Project," Nexus Proprietary and Confidential, Aug. 12, 2002.

Linder, C. et al., "Nanosprings—New Dimensions in Sputtering Chips."

Liu, C., "Through-Wafer Electrical Interconnects by Sidewall Photolithographic Pattering," IEEE Tech Conf. May 19/21, 1998.

Lloyd, J.R., "Reliability of Copper Metallization," 20 pages.

Lumbantobing, A., Electrical Contact Resistance as a Diagnostic Tool for MEMS Contact Interfaces, Journal of Microelectromechanical Systems, vol. 13, No. 6, Dec. 2004, pp. 977-987.

Ma, L., et al., "J-Springs-Innovative Compliant Interconnects for Next-Generation Packaging," PARC, Inc. ECTC02002.

Mann, W.R., "Introduction to Wafer Test Technology," Southwest Test Workshop, Jun. 3, 2001, pp. 1-31.

Martinez, S., TEA & John Pitts Motorola, Inc., "Wafer Level Tech & Burn In," Accomplishments Challenges.

Matta, F., "Advances in IC Testing: The Membrane Probe Card," Hewelett-Packard Journal, Jun. 1990.

Matteo, D.C., Hewlett Packard Corporate Intellectual Property Licensing, May 31, 2002.

McGraw-Hill Encyclopedia of Science and Technology, 8th Ed., Part 3, p. 124, USA, 1997.

Metric Conversion Factors, pp. 1-16, Jan. 8, 2003.

Xerox Palo Alto Research Center, "Micro-Contact Springs for High Performance Probing and Packaging," Apr. 8, 1998.

MTBSolutions, "The AMITEC Substrate Advantage: Design Rules & Electrical Properties," May 5, 2002.

Myung, N.V. et al., "Electrodeposited Hard Magnetic Thin Films for MEMS," $6^{th}$ Int'l Symp on Magnetic Materials, PV 2000-29, 2002.

Nadeau, N. et al., "An Analysis of Tungsten Probes' Effect on Yield in a Production Wafer Probe Environment," International Test Conference Procedure Meeting the Tests of Time, 1989.

Nadeau, N. et al., "Effect of Tungsten Probes on Wafer-Probe Yield in a Production Environment," Microelectronic Manufacturing & Testing, Sep. 1989.

Natter, H., et al., "Nanocrystalline Nickel And Nickel-Copper Alloys," J.Mater Res., vol. 13, No. 5, May 1998.

"New Build-up HDI technique using copper bumps," Victory Circuit Co., Ltd., Sep. 2002.

Newboe, B., "The Probe Card Dilemma," Semiconductor International, Sep. 1992.

Ok, S.J., et al., "High Aspect Ratio, Through-Wafer Electrical," IPACK'01 proceedings, Hawaii, USA, Jul. 8-13, 2001.

Pacific Rim Technology, Representing Tong Hsing Electronics, Cirocomm Technology, Koartan, "Turnkey Manufacturing, Micro Printing, Chipbond Technology," www.pacificrimtech.com.

Pandey, R., et al., "P4 Probe Card-A Solution for At-Speed, High Density, Wafer Probing," Proc. International Test Conference, 1998.

Dennis S. Fernandez, "Patent Strategies and Portfolio Development," Fernandez & Associates. 16 pages, 2002.

Pena, D.J., et al., "Electromechanical Synthesis of Multi Material," Mat. Res. Soc. Symp. vol. 636, Materials Research Society, 2001.

Petefish, W.G., "High Performance Laminated Chip Package Technology," W.L. Gore & Associates, Inc., Electronic Products Division.

Pham, N.P. et al., "A Micromachining Post-Process Module for RF Silicon Technology," IEEE, Feldmannweg 17, 2628 CT Delft, 2000.

Phillips, M.A., "Stress And Microstructure Evolution During Initial Growth Of Pt On Amorphous Substrates," J. Mater, Res., vol. 15, No. 11, Nov. 2000.

Pruitt, B.L., "Measurement System for Low Force and Small Displacement Contacts," Journal of Microelectromechanical Systems, vol. 13, No. 2, Apr. 2004, pp. 220-229.

Reagan, J. et al., "Thin Film Hybrid Technology for On-Wafer Probing of Integrated Circuits," Hybrid Circuit Technology, Apr. 1990.

Renard, S., et al., Expanding MEMS with low-cost SOI wafers, Sep. 23, 2002.

Renz, U., "Multipoint Test Probe for Printed Cards," IBM Technical Disclosure Bulletin, vol. 17, No. 2, 2 pages, Jul. 1974.

Robertazzi, R., "Area Array Probe Card Interposer," IBM Research, pp. 1-23, Jun. 4, 2001.

Saha, R. et al., "Effects Of The Substrate On The Determination Of Thin Film Mechanical Properties By Nanoindentation," Acta Materialia 50, vol. 23-38, 2002.

Santner, E., et al., "Adhesion and Deformation on a Microscopic Scale," Federal Institute for Material Research and Testing (BAM), D-1200 Berlin, Germany.

Sasho, S. et al., "Four Multi Probing Test for 16 Bit DAC with vertical contact Probe Card," 1996.

Schleifer, S., "Improving Wafer Sort Yields with Radius-Tip Probes; Procedure of International Test Conference," 1990.

Schwartz, R., "Measurement Repeatability Key to Probe-Card Metrology," EE-Evaluation Engineering, Sep. 1998.

Shi, B, "Intrinsic Stress Development in Ti-C:H Ceramic Nanocomposite Coatings," Applied Physics Letters, vol. 81, No. 2, pp. 352-354. Jul. 8, 2002.

Singer, P., "The Dual Challenges of Wafer Probing," Semiconductor International, Dec. 1989.

Slade, P.G., "Electrical Contacts, Principles and Applications," pp. 603-605, Marchel Dekker, New York, Basel, 1999.

Smit, K., "Customer Experiences with the Pyramid Probe," A Second Generation Membrane Probe, Cascade Microtech, Beaverton, Oregon, USA.

Soejima, K. et al., "New Probe Microstructure for Full-Wafer," Contact-Probe Cards; 49th Electronic Components & Technology Conference, 1999.

Soh, H.T., "Ultra-Low Ressitance, Through-Wafer VIA (TWV) Technology," 1998 Int'l Conf. on Solid Sate Devices and Materials, Hiroshima, pp. 284-285, 1998.

"Solution to Problems that Don't Exit."

Stanley, J.K., "Electrical and Magnetic Properties of Metals, American Society for Metals," Metals Park, Ohio, Electrical Conduction, Chapter 11, table 11.2, figure 11-10, 11-11 & 11-12, pp. 439 & 440, 1963.

Strohm, K. M. et al., "Via hole technology for Microstrip Transmission," IEEE MTT-S Digest, 1999.

Subramanian, E., et al., "Enhanced Probe Card Facilities At-Speed Wafer Probing in Very High Density Applications," Procedure of International Test Conference, 1992.

Table of Contents, EDGAR Online, Inc., p. 17, 2002.

Tabor, Fred of IBM and Infineon, "Estimating L and C Parasitics, Shorter Length Probe Tips Required for Lower Inductance, Contact Resistance Probing Copper Pads with Cantilever and Pyramid, Increased Switching Currents, Power Supply "Bounce" Calculator, Alternate Pad/Bump Metallurgies, Pad Damage of Probe Technologies (Pad damage v. Technology), Probing Low-K DielectricProbing Copper Posts."

Tada, T. et al., "Fine Pitch Probe Technology for VLSI Wafer Testing" Procedure of International Test Conference, 1990.

Takahiro, I., et al., "Fabrication of Micro IC Probe for LSI Testing," Sensors & Actuators A, Mar. 10, 2000.

Tamura, T., "Probing Techniques for Ultra-High Pin Counts," NEC Research and Development, Apr. 2000.

Tan, Q. et al., "Reliability Evaluation of Probe-Before-Bump Technology," 24th IEEE/CPMT International Electronics Manufacturing Technology Symposium, 1999.

Texas Instruments, DMD 0.7 XGA 12 DDR DMD Discovery, Product Preview Data Sheet, TI DN 2505686 REV C, Aug. 2004, 22 pages.

"The Final Test Report," vol. 13, No. 07, Jul. 2002.

Tonnies, D., "A Review and Trends in Flip Chip Technology," Germany, Chip Scale Review, Apr. 2004, pp. 55, 57 & 59.

Towle, S. et al., "Bumpless Build-Up Layer Packaging," Intel Corporation, Components Research, Presented at ASME International Mechanical Engineering Congress and Exposition (IMECE), New York, Nov. 12, 2001.

U.S. Environment Protection Agency Region 9 Pollution Prevention Program: Extending Electroless Nickel Bath Life Using Electrodialysis, Jul. 1998.

VC Task Force Breakfast Workshop, May 31, 2002.

Joseph Fletcher, VC Task Forces, May 31, 2002.

"Venom, Probe Cards, a Cobra Card Product," Powerful Interface Technology, pp. 1-3, Nov. 9, 2001.

"Wizard qualification for PC," Monitor JG01w, Process 255, Target 240-280.

Wu, J.H., et al., "A High Aspect-Silicon Substrate-Via technology and Applications: Through-Wafer," 0-7803-6441-4/00, 2000 IEEE.

Yassine, A.M., "Characterization of Probe Contact Noise for Probes Used in Wafer-Level Testing," IEEE Electron Device Letter, vol. 12, No. 5, Mary 1991, pp. 200-202.

Yin, W.M., "Creep in Boron-Doped Nanocrystalline Nickel," Scripta Matter 44, vol. 44, No. 4, pp. 569-574, 2001.

Zhang, Y. et al., "A New MEMS Wafer Probe Card," Systems. An Investigation of Micro Structures, Sensors, Acuators, Machines and Robots, 1997.

Zhang, Y., "Design, Simulation, Fabrication and testing of Microprobes for a New MEMS Wafer Probe Card," Dissertation, Dept. of Electrical and Computer Engineering, New Jersey Institute of Technology, May 1997.

Zhang, Y., et al., "Thermally Actuated Microprobes for a New Wafer Probe Card," Journal of Microelectromechanical Systems, Mar. 1999.

Zheng, Y., "Study of Copper Applications and Effects of Copper Oxidation in Microelectronic Package," In Partial Fulfillment of MatE 234, 26 pages, May 10, 2003.

Zhu, S., "Joining Of Ain Ceramic To Metals Using Sputtered Al Or Ti Film," Journal of Materials Processing Technology, vol. 109, Issue 3, pp. 277-282, Feb. 15, 2001.

* cited by examiner

HIGH DENSITY INTERCONNECT SYSTEM FOR IC PACKAGES AND INTERCONNECT ASSEMBLIES

CROSS REFERENCE TO RELATED APPLICATIONS

This Application claims priority to U.S. Provisional Application No. 60/651,294, entitled Nano-Contactor Embodiments for IC Packages and Interconnect Components, filed 8 Feb. 2005, and to U.S. Provisional Application No. 60/718,137, entitled Compliant Nanocontactors for Application in Portable and High Density Electronic Systems, filed 16 Sep. 2005, each of which are incorporated herein in its entirety by this reference thereto.

This Application is also a Continuation In Part of U.S. patent application Ser. No. 11/133,021, entitled High Density Interconnect System Having Rapid Fabrication Cycle, US Filing Date 18 May 2005, now U.S. Pat. No. 7,382,142 which is a Continuation In Part of U.S. patent application Ser. No. 10/870,095, entitled Enhanced Compliant Probe Card Systems Having Improved Planarity, US Filing Date 16 Jun. 2004, now U.S. Pat. No. 7,349,223, which is a Continuation In Part of U.S. patent application Ser. No. 10/178,103, entitled Construction Structures and Manufacturing Processes for Probe Card Assemblies and Packages Having Wafer Level Springs, US Filing Date 24 Jun. 2002, now U.S. Pat. No. 6,917,525, which is a Continuation In Part of U.S. patent application Ser. No. 09/980,040, entitled Construction Structures and Manufacturing Processes for Integrated Circuit Wafer Probe Card Assemblies, US Filing Date 27 Nov. 2001, now U.S. Pat. No. 6,799,976, which is a national stage of PCT Patent Application Serial No. PCT/US00/21012, filed Jul. 27, 2000, each of which are incorporated herein in its entirety by this reference thereto.

This Application also claims priority to PCT Patent Application Serial No. PCT/US05/17881, entitled High Density Interconnect System Having Rapid Fabrication Cycle, filed 20 May 2005, which claims priority from U.S. patent application Ser. No. 11/133,021, entitled High Density Interconnect System Having Rapid Fabrication Cycle, claims priority to:

U.S. Provisional Application No. 60/573,541, entitled Quick-Change Probe Chip, filed 20 May 2004;

U.S. Provisional Application No. 60/592,908, entitled Probe Card Assembly with Rapid Fabrication Cycle, filed 29 Jul. 2004;

U.S. Provisional Application No. 60/651,294, entitled Nano-Contactor Embodiments for IC Packages and Interconnect Components, filed 8 Feb. 2005;

and is a Continuation In Part of U.S. patent application Ser. No. 10/870,095, entitled Enhanced Compliant Probe Card Systems Having Improved Planarity, US Filing Date 16 Jun. 2004;

each of which are incorporated herein in its entirety by this reference thereto.

FIELD OF THE INVENTION

The present invention relates generally to the field of high density interconnect assembly systems, and more specifically to the fields of semiconductor device testing and packaging. More particularly, the present invention relates to high density interconnect assembly and test systems incorporating micro-fabricated spring contacts and improvements thereto, which improve performance, reliability, ease of use and/or lower the cost of ownership.

BACKGROUND OF THE INVENTION

Advances in semiconductor integrated circuit (IC) design, processing, and packaging technologies have resulted in increases in the number and density of input/output (I/O) pads on each die. Nonetheless, the size of portable electronic systems such as portable computers, cell phones, PDAs, etc. continues to shrink despite the addition of new features and functions. New features and functionalities, such as digital cameras and camcorders, global positioning systems, and removable memory cards are continually being integrated into modern portable and/or high density electronic systems. It is desirable to decrease the thickness of the components within portable electronic systems to provide size reduction as well as additional space to add new components.

Although the length and width of portable electronic systems are constrained by the need to provide a comfortable user interface typically including an easy to use keypad and/or an easy to read display, there is a range in the acceptable physical sizes for each class of system at any point in time. However, over time, the size of most portable electronics systems tends to decrease.

As the manufactured sizes of systems and components continue to decrease, management of energy consumption and heat dissipation become increasingly important both at the level of the system and at the individual components level. Less space is available for power sources and heat dissipation structures. At the level of packaging and interconnect, this means that strategies and solutions are required to provide adequate thermal management and to accommodate the stresses generated by mismatches in thermal coefficient of expansion (TCE) occurring at the interfaces between components.

Reductions in size and thickness of components are also consistent with performance improvements due to reductions in signal path lengths between components. Despite increases in the number and density of input/output (I/O) pads on each die, the footprint and thickness of electronic systems continues to shrink since the individual components and/or devices integrated into these systems tend to decrease with each successive technology generation. Historically, electrical interconnections were formed as individual components, e.g. contacts, using conventional fabrication technologies such as metal stamping and bending. Using conventional assembly methods, individual contacts are assembled into a finished contactor and/or connector. Conventional fabrication and assembly methods become increasingly complex and expensive as the number and density of the contacts increases.

Micro-fabricated spring contacts are capable of overcoming many of the limitations associated with conventionally fabricated spring contacts. Micro-fabricated spring contacts can be fabricated using a variety of photolithography based techniques known to those skilled in the art, e.g. Micro-Electro-Mechanical Systems (MEMS) fabrication processes and hybrid processes such as using wire bonds to create spring contact skeletons and MEMs or electroplating processes to form the complete spring contact structure. Arrays of spring contacts can be either be mounted on a contactor substrate by pre-fabricating and transferring them (either sequentially or in mass parallel) to the contactor substrate or by assembling each element of the spring contact array directly on the contactor substrate using a wire bonder along with subsequent batch mode processes, e.g. electroplating, as disclosed in U.S. Pat. No. 6,920,689 (Khandros et al.), U.S. Pat. No. 6,827,584 (Mathieu et al.), U.S. Pat. No. 6,624,648 (Eldridge et al.); U.S. Pat. No. 6,336,269 (Eldridge et al.), U.S. Pat. No. 5,974,662 (Eldridge et al.), U.S. Pat. No. 5,917,707 (Khandros et al.), U.S. Pat. No. 5,772,452 (Dozier et al.), and U.S. Pat. No. 5,476,211 (Khandros et al.).

Alternatively, an array of micro-fabricated spring contacts can be fabricated directly on a contactor substrate utilizing thick or thin film photolithographic batch mode processing techniques such as those commonly used to fabricate semiconductor integrated circuits. Numerous embodiments of monolithically micro-fabricated photolithographic spring contacts have been disclosed such as those by Smith et al in U.S. Pat. No. 6,184,699, Mok et al. in U.S. Pat. Nos. 6,791,171 and 6,917,525, and Lahari et al in US Patent Pub. No. US-2003-0214045-A1.

Semiconductor wafer probe card assembly systems are used in integrated circuit (IC) manufacturing and testing to provide an array of spring contact probes for making contact to the electrical interconnection pads on each of the semiconductor devices on the wafer. An additional function of probe card assembly systems is to translate electrical signal paths from the tightly spaced electrical interconnection pads on ICs to the coarsely spaced electrical interconnection pads on printed circuit boards that interface to IC test systems.

Semiconductor wafer probe cards are typically required to accommodate increases in the density and number of input/output (I/O) pads on each die, as well as increases in the diameter of the silicon wafers used in IC fabrication processes. With more die to test per wafer and each die having more I/O pads at higher densities, the cost of testing each die becomes a greater and greater fraction of the total device cost. This trend can be minimized or even reversed by reducing the test time required for each die or by testing multiple die simultaneously. If multiple die are tested simultaneously, then the requirements for parallelism between the probe tips and the semiconductor wafer and the co-planarity of the probe tips become increasingly stringent since all of the probe tips are required to make good electronic contact at the same time over a large area on the wafer or the entire wafer in the case of wafer level test and/or burn-in.

To test more than one die on a semiconductor wafer simultaneously, simultaneous low-resistance electrical contacts must be established with positionally matching sets of spring contact probes for each die to be tested and maintained over a broad temperature range. The more die to be tested simultaneously, the greater the degree of parallelism that is required between the spring probes and the surface of the semiconductor wafer, to insure that the probe tip "scrub", and hence electrical contact, is uniform across the wafer. However, as higher numbers of die are tested in parallel, the number of simultaneous interconnects from the IC to the probe card assembly to the IC tester increases (not assuming pin multiplexing). Since probe tips for contacting the bonding pads on IC wafers require sufficient mechanical force on a per connection basis to assure a reliable low resistance connection, the total force between the probe card assembly and the wafer increases in proportion to the number of connections.

Similar trends are seen in connector, device packaging, and socketing applications, although specific requirements may vary for each specific application. For example, probe scrub damage requirements for probe cards which contact the bonding pads, e.g. such as comprising aluminum, gold, copper, solder, etc., on bare die are different those for sockets which contact the leads, terminals, bumps, etc., e.g. such as comprising gold, copper, solder, etc., or solder balls, of packaged die or those for packaged devices or connectors in which contact is made to contact pads, e.g. such as comprising gold, copper, solder, etc. on a printed circuit board. Nonetheless, increases in die size and/or the density and number of input/output (I/O) pads on each die, and/or use case temperature extremes tend to drive up the complexity and cost of the electrical interconnect structures required in all of the above applications. Compensation for lack of co-planarity is also an important requirement for connectors, packages and sockets, particularly as connection areas and die size increases and/or as component thicknesses decrease.

In some types of IC devices such as memory and microprocessors, die sizes continue to increase whereas for other types of devices such as mixed signal and analog, die sizes have decreased as a result of numerous technological advances. Nonetheless, in many cases, decreases in bond pad sizes, and/or increases in the density and/or number of (I/O) pads is driving the need for cost effective and high performance miniaturized interconnects for connector, device packaging, and socketing applications.

Additionally, there is a need for improved methods for providing temporary electrical connections in which a connection is made for a short time, for example, in probe card or system testing applications. There is also a need for improvements in demountable electrical connections in which it is desirable to maintain a reliable connection for extended time periods but it may be desired to non-destructively beak the connections, for example, in system in package or memory module applications where it is desirable to be able to demount and remount a device or modular package within a larger system for the purposes including but not limited to product development, field or depot upgrade, configuration change, or repair. Additionally, there is a need for improved methods of providing reliable and low cost permanent electrical connections.

It would be advantageous to provide micro-fabricated spring contacts at a relatively low cost per contact that maintain low resistance electrical connections for a variety of contact geometries and metallurgies, at high connection densities, over large or small areas, over a wide temperature range, and/or at high frequencies. Such micro-fabricated spring contacts would constitute a major technical advance.

It would be advantageous to provide micro-fabricated spring contacts at a relatively low cost per contact that maintain low resistance electrical connections for a variety of contact geometries and metallurgies with relatively low contact forces, at high connection densities, over large areas, over a wide temperature range, and/or at high frequencies. Such micro-fabricated spring contacts would constitute a major technical advance.

It would be advantageous to provide contactors incorporating micro-fabricated spring contacts at a relatively low cost per contact that maintain low resistance electrical connections, at high connection densities, over large areas, over a wide temperature range, and/or at high frequencies. Such a contactor would constitute a major technical advance.

It would be advantageous to provide contactors incorporating micro-fabricated spring contacts at a relatively low cost per contact that accommodate mismatches in the thermal coefficient of expansion (TCE) between integrated circuit devices and the next level of interconnect while providing and efficient means for meeting all thermal management requirements. Such contactors would constitute a further major technical advance.

It would be further advantageous to provide contactors incorporating micro-fabricated spring contacts having sufficient mechanical compliance to perform functions including but not limited to accommodating the planarity requirements of one or more electronic devices with the same or multiple or varying thicknesses, multiple devices across a wafer, one or more devices or device types in a single package or module, meeting planarity compliance requirements for high-density sockets and connectors, as well providing simultaneous electrical connections and Z-compliance with spring forces appropriate to meet the requirements of electronic systems including but not limited to adjustable optical interfaces such as auto focus mechanisms for cameras and projectors and other applications in electronic systems including but not limited to computers, portable computers, personal digital assistants (PDAs), medical devices, cameras, printers, imaging devices, cell phones, and the like. Such contactors would constitute a further major technical advance.

Furthermore, it would be advantageous to provide means for latching between assembly structures incorporating micro-fabricated spring contacts in temporary, demountable, and permanent applications. Such assembly structure latching means would constitute a further technical advance.

SUMMARY OF THE INVENTION

An improved interconnection system and method is described, such as for electrical contactors and connectors, electronic device or module package assemblies, socket assemblies and/or probe card assembly systems. An exemplary interconnection system comprises a first connector structure comprising a contactor substrate having a contactor surface and a bonding surface, and a set of at least one electrically conductive micro-fabricated spring contact extending from the contact surface, a second connector structure having a set of at least one electrically conductive contact pad located on a connector surface and corresponding to the set of at least one spring contact, and means for movably positioning and aligning the first connector structure and the second connector structure between at least a first position and a second position, such that in at least one position, at least one of the electrically conductive micro-fabricated spring contacts is electrically connected to at least one electrically conductive contact pad. Some preferred embodiments of the connector system comprise temporary, demountable, or permanent latching means between the first connector structure and the second connector structure.

DETAILED DESCRIPTION OF PREFERRED EMBODIMENTS

Figure 1:
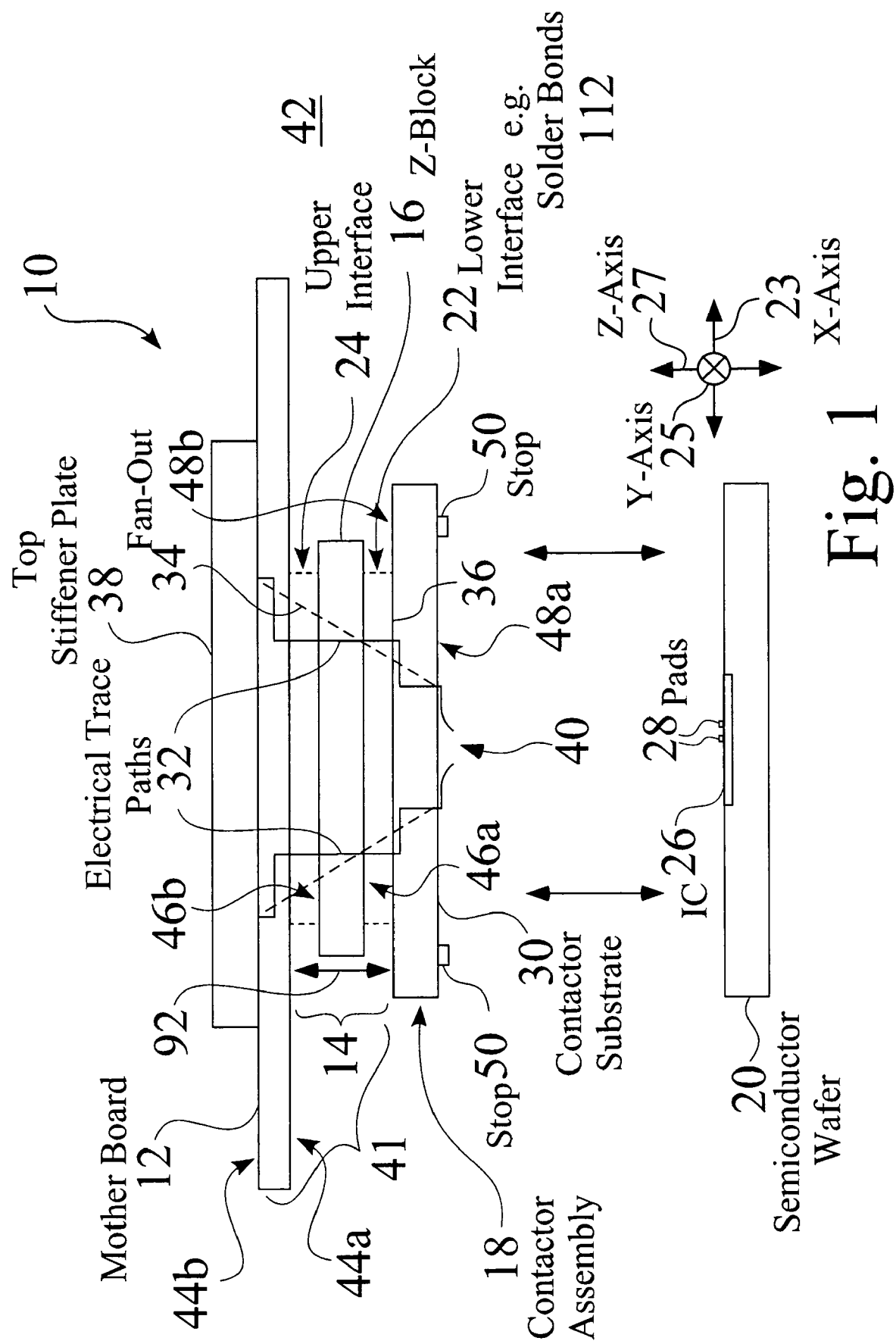
FIG. 1 is a detailed schematic diagram of a probe card assembly.

Introductory disclosure regarding structures, processes and systems disclosed herein is seen in: U.S. Provisional Application No. 60/136,636, entitled Wafer Interface for High Density Probe Card, filed 27 May 1999; U.S. Provisional Application No. 60/146,241, entitled Method of Massively Parallel Testing of Circuits, filed 28 Jul. 1999; U.S. Provisional Application No. 60/573,541, entitled Quick-Change Probe Chip, filed 20 May 2004; U.S. Provisional Application No. 60/592,908, entitled Probe Card Assembly with Rapid Fabrication Cycle, filed 29 Jul. 2004; U.S. Provisional Application No. 60/651,294, entitled Nano-Contactor Embodiments for IC Packages and Interconnect Components, filed 8 Feb. 2005; U.S. patent application Ser. No. 10/870,095, entitled Enhanced Compliant Probe Card Systems Having Improved Planarity, US Filing Date 16 Jun. 2004; U.S. patent application Ser. No. 10/178,103, entitled Construction Structures and Manufacturing Processes for Probe Card Assemblies and Packages Having Wafer Level Springs, US Filing Date 24 Jun. 2002; U.S. patent application Ser. No. 09/980,040, entitled Construction Structures and Manufacturing Processes for Integrated Circuit Wafer Probe Card Assemblies, US Filing Date 27 Nov. 2001; PCT Patent Application Serial No. PCT/US00/21012, filed 27 Jul. 2000; PCT Patent Application Serial No. PCT/US00/14164, entitled Construction Structures and Manufacturing Processes for Integrated Circuit Wafer Probe Card Assemblies, US Filing Date 23 May 2000; and U.S. patent application Ser. No. 10/069,902, entitled Systems for Testing and Packaging Integrated Circuits, filed 28 Jun. 2002, each of which are incorporated herein in its entirety by this reference thereto.

Micro-fabricated spring contacts, as described previously, may be fabricated with variety of processes known to those skilled in the art. Exemplary monolithic micro-fabricated spring contacts may comprise stress metal springs which are photolithographically patterned and fabricated on a substrate using batch mode semiconductor manufacturing processes. As a result, the spring contacts are fabricated en masse, and can be fabricated with spacings equal to or less than that of semiconductor bonding pads or with spacings equal to or greater than those of printed circuit boards, i.e. functioning as an electrical signal space transformer.

Figure 2:
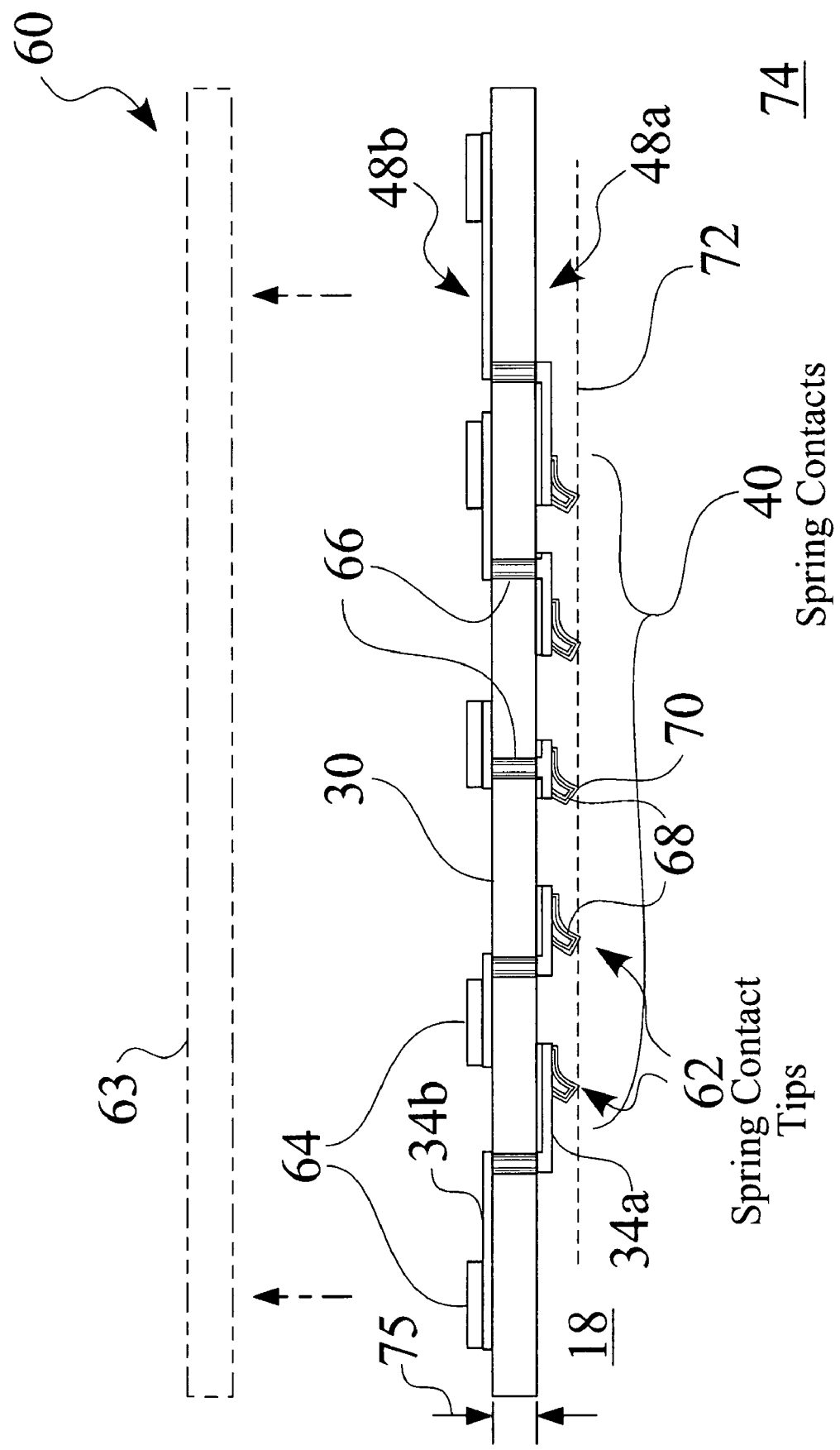
FIG. 2 is a detailed schematic view of a contactor assembly comprising an array of compliant micro-fabricated spring contacts.

Monolithic micro-fabricated spring contacts 40, such as seen in FIG. 2, comprise a unitary, i.e. integral construction or initially fabricated using planar semiconductor processing methods, whereas non-monolithic spring contacts are typically assembled from separate pieces, elements, or components. Non-monolithic or monolithic micro-fabricated spring contacts can be fabricated on one or both sides of rigid or flexible contactor substrates having electrically conductive through-vias and multiple electrical signal routing layers on each side of the substrate to provide electrically conductive paths for electrical signals running from spring contacts on one side of the substrate to spring contacts or other forms of electrical connection points on the opposite side of the substrate through signal routing layers on each side of the substrate and one or more electrically conductive vias fabricated through the substrate.

Additionally, optical signals can be transmitted through the contactor substrate by fabricating openings of sufficient size through the substrate through which the optical signals can be transmitted. The holes may be unfilled or filled with optically conducting materials including but not limited to polymers, glasses, air, vacuum, etc. Lenses, diffraction gratings and other optical elements can be integrated to improve the coupling efficiency or provide frequency discrimination when desired.

An exemplary monolithic micro-fabricated spring contact comprising a stress metal spring is fabricated by sputter depositing a titanium adhesion/release layer having a thickness of 1,000 to 5,000 angstrom on a ceramic or silicon substrate (approximately 10-40 mils thick) having 1-10 mil diameter electrically conductive vias pre-fabricated in the substrate. Electrically conductive traces fabricated with conventional photolithographic processes connect the spring contacts to the conductive vias and to the circuits to which they ultimately connect. A common material used to fabricate stress metal springs is MoCr, however other metals with similar characteristics, e.g. elements or alloys, may be used. An exemplary stress metal spring contact is formed by depositing a MoCr film in the range of 1-5 μm thick with a built-in internal stress gradient of about 1-5 GPa/μm. An exemplary MoCr film is fabricated by depositing 2-10 layers of MoCr, each layer about 0.2-1.0 μm thick. Each layer is deposited with varying levels of internal stress ranging from up to 1.5 GPa compressive to up to 2 GPa tensile.

Individual micro-fabricated stress metal spring contact "fingers" are photolithographically patterned and released from the substrate, using an etchant to dissolve the release layer. The sheet resistance of the finger can be reduced by electroplating with a conductive metal layer (such as copper or gold). The force generated by the spring contact can be increased by electrodepositing a layer of a material, such as nickel, on the finger to increase the spring constant of the finger. In interposer applications (see FIG. 3), the quality of the electrical contact can be improved by electrodepositing depositing a material, such as Rhodium 104, onto the tip 86 through a photomask, prior to releasing the finger from the substrate.

The lift height of the spring contacts is a function of the thickness and length of the spring and the magnitude of the stress gradient within the spring. The lift height is secondarily a function of the stress anisotropy and the width of the spring and the crystal structure and stress in the underlying stress metal film release layer. The spring constant of the spring is a function of the Young's Modulus of the material used to fabricate the spring and the length, width, and thickness of the spring. The spring constant of the spring can be increased by enveloping the springs 40 with a coating of a metal including but not limited to electroplated, or sputtered, or CVD deposited nickel or a nickel alloy, gold, or a palladium alloy such as palladium cobalt (see FIG. 1).

Methods for depositing coatings of both insulating and conductive materials are well known to those with ordinary skill in the art and numerous examples are discussed in the patent applications cited above. The spring constant can be varied over many orders of magnitude by controlling the thickness of the deposited coating layer, the geometrical characteristics of the spring, and the choice of metal and the thickness and number of coatings. Making the springs thicker both increases the contact force and the robustness of the physical and electrical contact between the spring and its contact pad.

The above teachings describe the manufacture of an exemplary monolithic micro-fabricated stress metal spring, however, those skilled in the art will understand that spring contacts having the characteristics required to practice the present invention could be designed with many possible variations in design and/or fabrication processes. Such variations may include but would not be limited to, for example, choice of processes, process chemicals, process step sequence, base spring metal, release layer metal, coating metals, spring geometry, etc. Numerous additional embodiments of monolithic micro-fabricated spring contacts have been disclosed such as those by U.S. Pat. No. 6,184,699 (Smith et al.); U.S. Pat. No. 6,791,171 (Mok et al.); U.S. Pat. No. 6,917,525 (Mok et al.); and U.S. Patent Pub. No. US/2003-

0214045 A1 (Lahari et al.), each of which is also incorporated herein in its entirety by this reference thereto.

FIG. 1 is a detailed schematic diagram 10 of a probe card assembly 42. As seen in FIG. 1, the probe card assembly 42 comprises a probe card interface assembly (PCIA) 41 and a contactor assembly 18, wherein the probe card interface assembly (PCIA) 41 comprises a motherboard 12 having electrical connections 132 (FIG. 4) extending there through, and an integrated contactor mounting system 14. Electrical trace paths 32 extend through the motherboard 12, the contactor mounting system 14, and the contactor assembly 18, to spring contacts, i.e. spring probes 40, such as to establish contacts with pads 28 on one or more ICs 26 on a semiconductor wafer 20. Fan-out 34 may preferably be provided at any point for the electrical trace paths 32 in a probe card assembly 42 (or in other embodiments of the systems disclosed herein), such as to provide transitions between small pitch components or elements, e.g. contactors 18, and large pitch components or elements, e.g. tester contact pads 126 (FIG. 4) on the mother board 12. For example, fan-out may typically be provided by the mother board 12, the contactor 30, by a Z-block 16, by an upper interface 24 comprising a motherboard Z-Block, or anywhere within the lower interface 22 and/or the upper interface 24.

Figure 4:
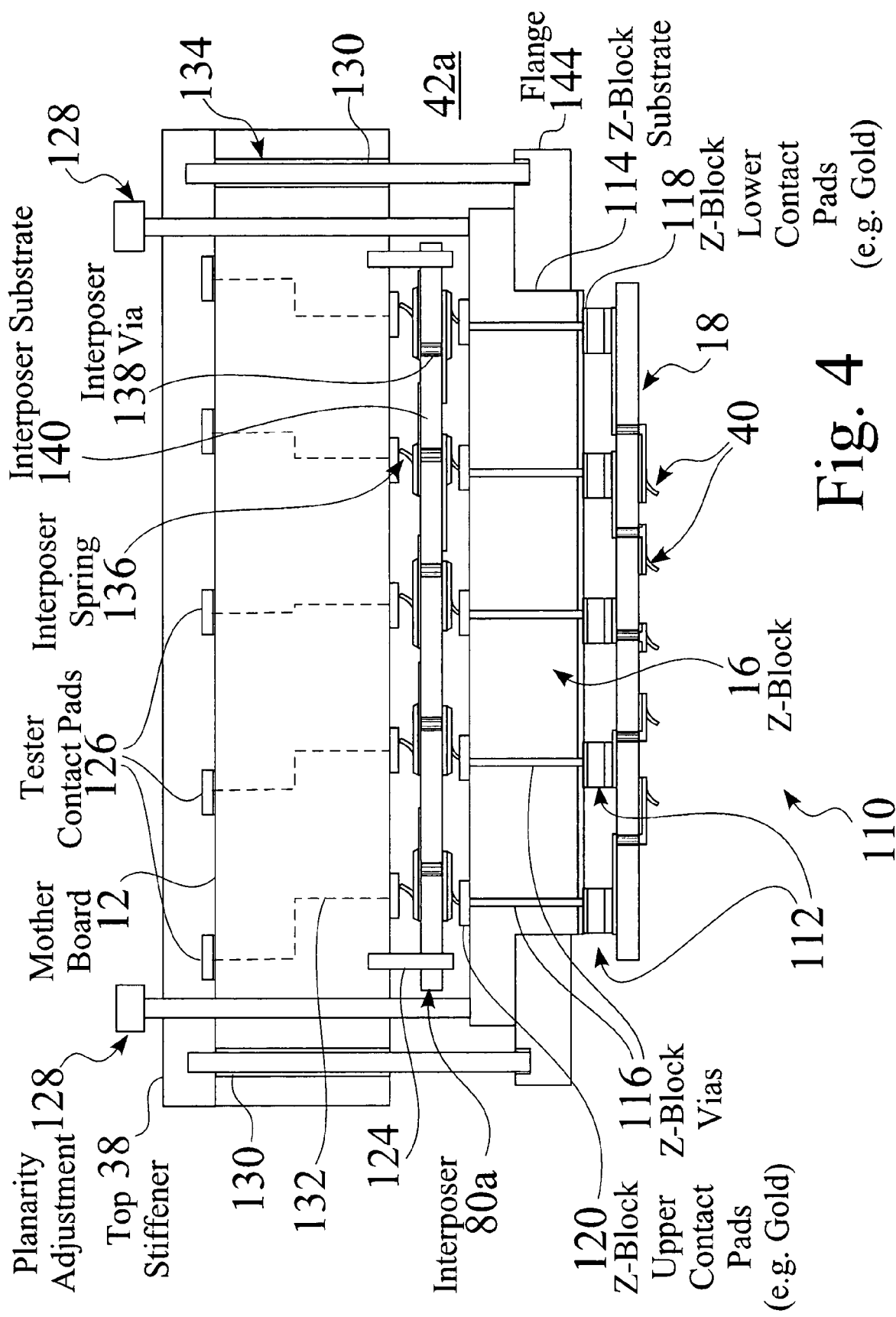
FIG. 4 shows a soldered contactor probe card embodiment having a double-sided upper interposer.

As seen in FIG. 1, the contactor mounting system 14 typically comprises a Z-block 16, a lower interface 22 between the Z-block 16 and the contactor substrate 30, and an upper interface 24 between the Z-block 16 and the motherboard 12. In some quick change probe card assemblies 42, the lower interface 22 comprises a plurality of solder bonds 112 (FIG. 4). As well, in some quick change probe card assemblies 42, the upper interface 24 comprises a combination of componentry and connections, such as an interposer 122, e.g. 122a (FIG. 8) or 122b (FIG. 5), solder bonds and/or a motherboard Z-block.

FIG. 2 is a detailed schematic view 60 of a contactor assembly 18, in which the non-planar portions of compliant spring probes 40 are preferably planarized and/or plated. As seen in FIG. 2, a contactor 18 comprises a contactor substrate 30 having a probing surface 48a and a bonding surface 48b opposite the probing surface 48a, a plurality of spring probes 40 on the probing surface 48a, typically arranged to correspond to the bonding pads 28 (FIG. 1) of an integrated circuit 26 on a semiconductor wafer 20, and extending from the probing surface 48a to define a plurality of probe tips 62, a corresponding second plurality of bonding pads 64 located on the bonding surface 48b and typically arranged in the second standard configuration, and electrical connections 66, e.g. vias, extending from each of the spring probes 40 to each of the corresponding second plurality of bonding pads 64.

While the contacts 40 are described herein as spring contacts 40, for purposes of clarity, the contacts 40 may alternately be described as contact springs, spring probes or probe springs.

Preferred embodiments of the spring contacts 40 may comprise either non-monolithic micro-fabricated spring contacts 40 or monolithic micro-fabricated spring contacts 40, depending on the application. Non-monolithic micro-fabricated spring contacts utilize one or more mechanical (or micro-mechanical) assembly operations, whereas monolithic micro-fabricated spring contacts exclusively utilize batch mode processing techniques including but not limited to photolithographic processes such as those commonly used to fabricate MEMs devices and semiconductor integrated circuits.

In some embodiments of the spring contacts 40, the electrically conductive monolithically formed contacts 40 are formed in place on the contactor substrate 30. In other embodiments of the spring contacts 40, the electrically conductive monolithically formed contacts 40 are formed on a sacrificial or temporary substrate 63, and thereafter are removed from the sacrificial or temporary substrate 63, e.g. such as by etchably removing the sacrificial substrate 63, or by detaching from a reusable or disposable temporary substrate 63, and thereafter affixing to the contactor substrate 30.

Both non-monolithic and monolithic micro-fabricated spring contacts can be utilized in a number of applications including but not limited to semiconductor wafer probe cards, electrical contactors and connectors, sockets, and IC device packages.

Sacrificial or temporary substrates 63 may be used for spring fabrication, using either monolithic or non-monolithic processing methods. Spring contacts 40 can be removed from the sacrificial or temporary substrate 63 after fabrication, and used in either free standing applications or in combination with other structures, e.g. contactor substrate 30.

In embodiments of contactor assemblies that are planarized, a plane 72 of optimum probe tip planarity is determined for a contactor 18 as fabricated. Non-planar portions of spring contacts 40 located on the substrate 30 are preferably plated 60, and are then planarized, such as by confining the probes 40 within a plane within a fixture, and heat treating the assembly. The non-planar portions of the spring probes 40 may also be plated after planarization, to form an outer plating layer 70.

The contactor assembly 18 shown in FIG. 2 further comprises fan-out 34, such as probe surface fan-out 34a on the probe surface 48a of the contactor substrate 18 and/or rear surface fan-out 34b on the bonding surface 48b of the contactor substrate 18.

Figure 3:
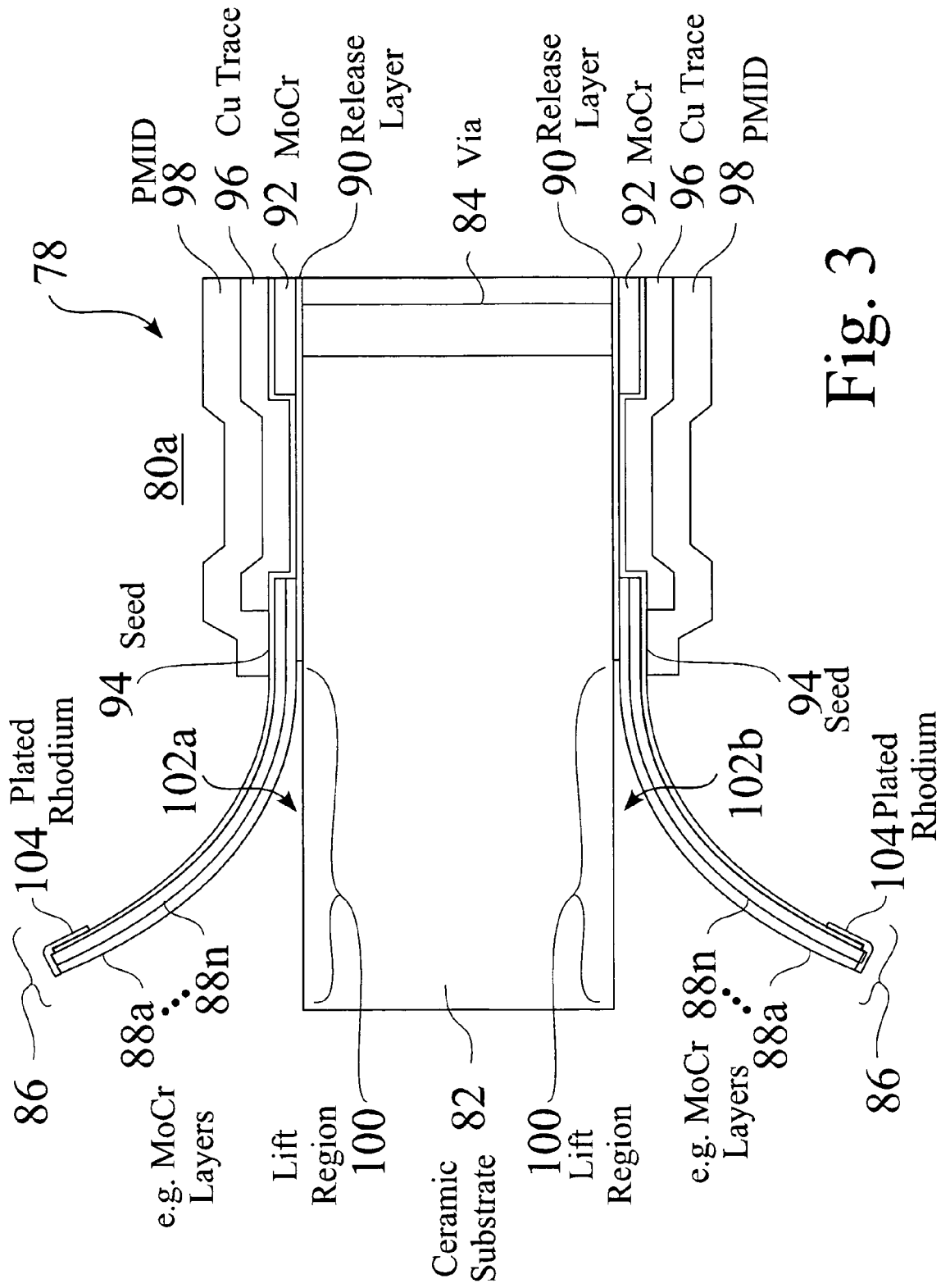
FIG. 3 is a detailed partial cross sectional view of an interposer structure.
Figure 5:
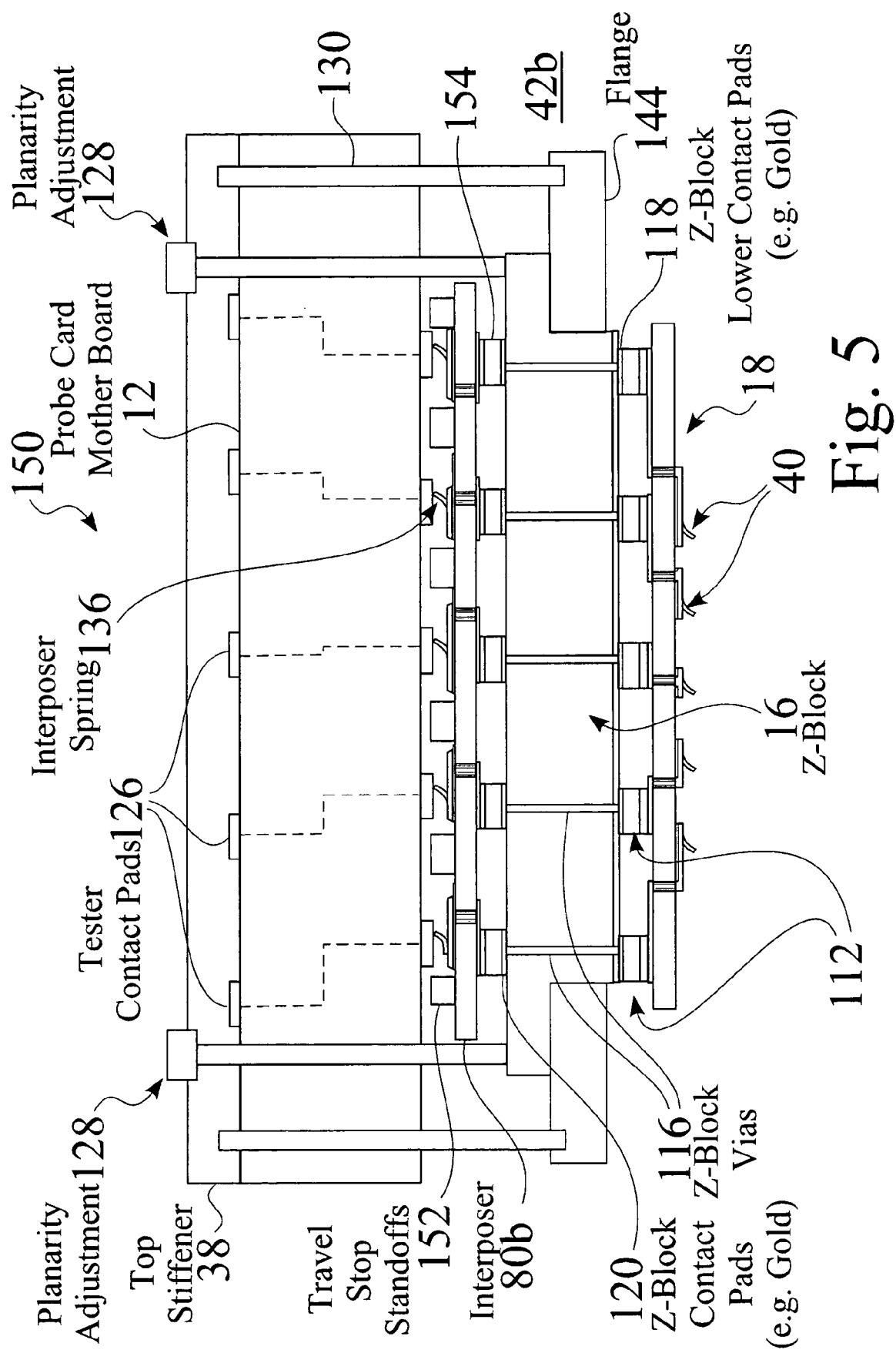
FIG. 5 shows a soldered contactor probe card embodiment having a soldered upper interposer.

FIG. 3 is a partial cross sectional view 78 of an interposer structure 80, such as for a dual-sided interposer 80a, Similar construction details are preferably provided for a single-sided interposer 80b (FIG. 5).

Interposer springs 86, such as photolithographically formed probe springs 86, are generally arranged within an interposer grid array, to provide a plurality of standardized connections. For example, in the dual-sided interposer 80a shown in FIG. 4, the interposer springs 86 provide connections between a motherboard 12 and a Z-block 16. Similarly, in the single-sided interposer 80b shown in FIG. 5, the interposer springs 86 provide connections between a motherboard 12 and an interposer 80b.

Interposer vias 84 extend through the interposer substrate 82, from the first surface 102a to the second surface 102b. The interposer vias 84 may preferably be arranged in redundant via pairs, such as to increase the manufacturing yield of the interposer 80, and/or to promote electrical conduction, particularly for power traces.

The opposing surfaces 102a,102b are typically comprised of a release layer 90, such as comprising titanium, and a composite layer 88,92, typically comprising a plurality of conductive layers 88a-88n, having different inherent levels of stress. Interposer vias 84, e.g. such as CuW or gold filled, extend through the central substrate 82, typically ceramic, and provide an electrically conductive connection between the release layers 90. The composite layers 88,92 typically comprise MoCr (however other metals with similar characteristics, e.g. elements or alloys, may be used), in which the interposer probe springs 86 are patterned and subsequently to be later released within a release region 100.

A seed layer 94, such as a 0.5 to 1 um thick gold layer, is preferably formed over the composite layers 88,92. In some embodiments, a tip coating 104, such as rhodium or palladium alloy, is controllably formed at least over the tips of spring fingers 86, such as to provide wear durability and/or contact reliability. Traces 96, typically comprising copper, are selectably formed by plating over the structure 78, as shown, such as to provide reduced resistance. As well polyimide PMID layers 98 are typically formed over the structure 78, as shown, to define the spring finger lift regions. A seed layer 94, such as comprising a thick layer of gold, remains on the lifted fingers 86, so as to reduce sheet resistance of the fingers 86.

FIG. 4 is a detailed partial schematic view 110 of a probe card assembly system 42a comprising a soldered contactor probe card 18 having a double-sided upper interposer 80a. FIG. 5 is a detailed partial schematic view 150 of a probe card assembly system 42b comprising a soldered contactor probe card embodiment having a single sided upper interposer 80b. One or more travel stops 152 can preferably be included on an interface having compliant interposer spring probes 136, e.g. stress metal spring probes 86 (FIG. 3), to prevent the probes 136 from damage, such as if the upper interposer 80b in FIG. 5 is bottomed out against the probe card motherboard 12. The upper interposer 80b may be plated to increase the probe force of interposer spring probes 136.

Outer alignment pins 130 typically extend from the top stiffener 38 through the probe card assembly 42, such as through the probe card interface assembly 41. The outer alignment pins 130 engage mechanical registration features 134, such as notches, slots, and/or holes, or any combination thereof, defined in components in the probe card assembly 42, such as the motherboard 12 and the Z-block flange 144. The use of registration features 134 preferably allows for differences in thermal expansion between components in the probe card assembly 42, to allow testing over a wide temperature range.

Figure 6:
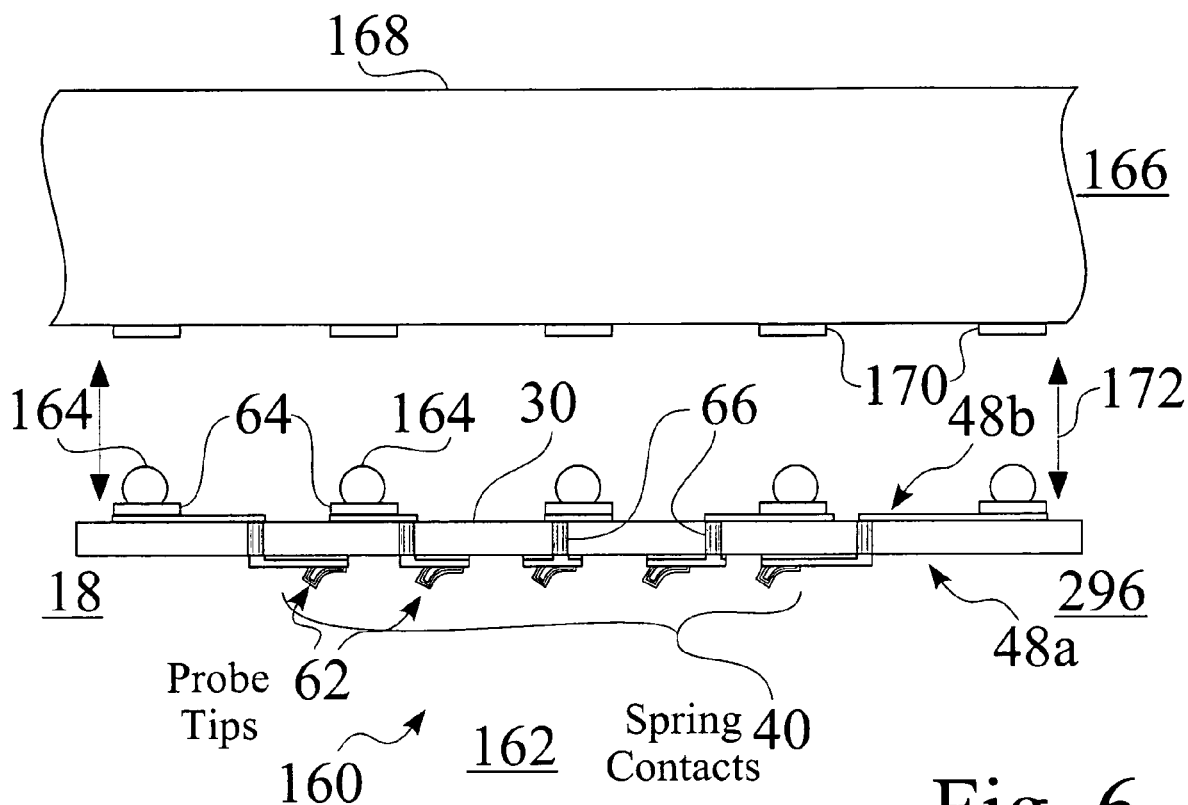
FIG. 6 is a first schematic view of solder ball re-flow contactor construction.
Figure 7:
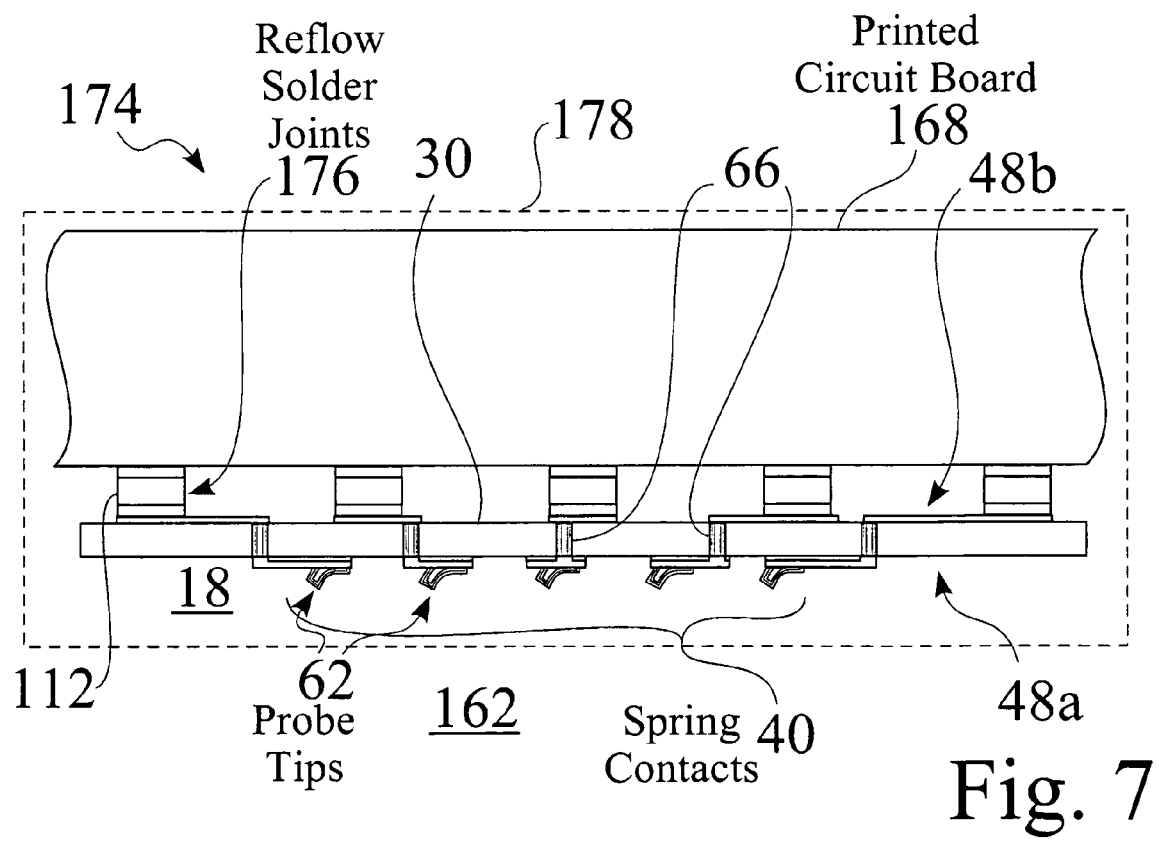
FIG. 7 is a second schematic view of solder ball re-flow contactor construction.

FIG. 6 is a first schematic view 160 of solder ball re-flow contactor construction 162. FIG. 7 is a second schematic view 174 of solder ball re-flow contactor construction 162. Several components and structures used within probe card assemblies 42 may also be used within other advanced assemblies and structures. For example, as seen in FIG. 6 and FIG. 7, a contactor assembly 18 having reflowed solder ball connections 112 to a second structure 166, such as substrate 168, e.g. such as comprising any of ceramic, multi-layer ceramic, glass ceramic, glass, quartz, glass epoxy, FR-4, polyimide, a semiconductor wafer, silicon, a printed circuit board, one or more flip chip semiconductor devices, one or more packaged semiconductor devices, a semiconductor integrated circuit, and a hybrid integrated circuit, preferably provides a structure 162 having a high degree of planarity between the contactor substrate 30 and the attached substrate 168, and also has planarity compliance associated with the spring probes 40 located on the probe surface 48a of the contactor substrate 30.

As seen in FIG. 6, solder balls 164 are located on electrically conductive pads 64 on the rear bonding surface 48b of a probe spring substrate 30, which are configured to be aligned with electrically conductive contact pads 170, e.g. gold or solder coated, etc. located on a mating structure 166, such as substrate 168, such as comprising any of ceramic, multi-layer ceramic, glass ceramic, glass, quartz, glass epoxy, FR-4, polyimide, a semiconductor wafer, silicon, a printed circuit board, one or more flip chip semiconductor devices, one or more packaged semiconductor devices, a semiconductor integrated circuit, and a hybrid integrated circuit.

The probe spring assembly 18 and the mating structure 166 are then movably positioned together 172, such as within an appropriate fixture 178. As seen in FIG. 7, heat is then applied to the assembly 162, such that the solder balls 164 reflow 176 to form probe assembly solder joints 112 (FIG. 4, FIG. 5).

As planarity between the contactor substrate 18 and the attached substrate 168 is highly controllable by the fixture 178, the established planarity of the contactor assembly 162 by the bonded solder joints 112 provides an assembly which can advantageously be used throughout a wide variety of advanced interconnection structures, such as but not limited to:

advanced probe card assemblies for probing fine pitch devices and/or large area substrates;

probe card assemblies for probing wafer level packages, flip chip devices, chip scale packages, under bump metal, solder, solder balls, displays, display drivers, area arrays, etc.;

miniaturized or high density connector assemblies, e.g. such as for consumer electronic products, cell phones, PDAs, cameras, projectors, imaging devices, etc.;

socket assemblies, e.g. high density, low insertion force, solder ball array, land grid array (LGA), etc.;

device, partial wafer, and/or full wafer level burn-in contactors (silicon substrates can be used to provide TCE match between the contactor and the device under test);

single die packages, e.g. wafer level packages (WLP) and/ or singulated die; and/or multi-die packages, e.g. system in a package (SiP) including embodiments with non-uniform die thicknesses, and/or three dimensional packages, e.g. stacked die.

Exemplary Latch Assembly Structure having Compliant Spring Interface.

Figure 8:
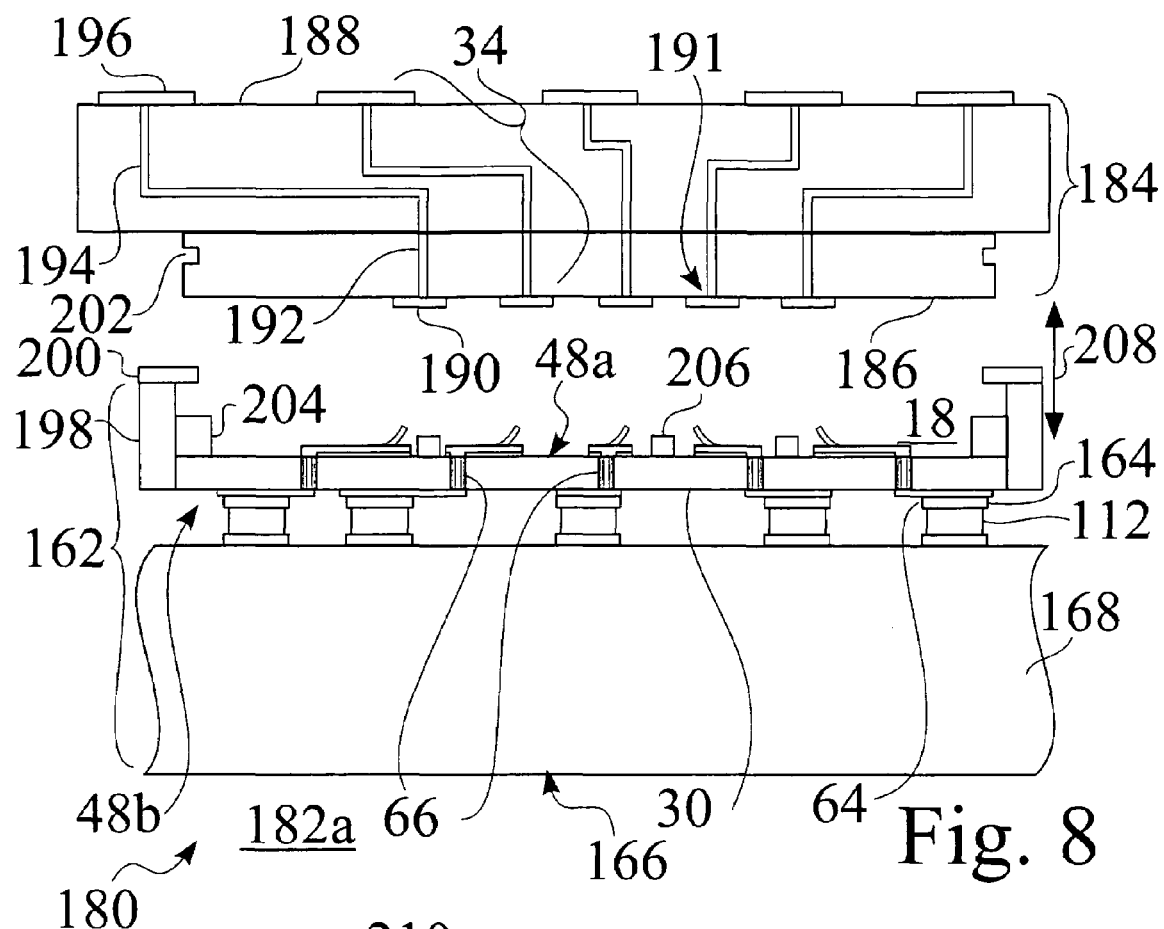
FIG. 8 is a first schematic assembly view of a high-density connector having fan-out.
Figure 9:
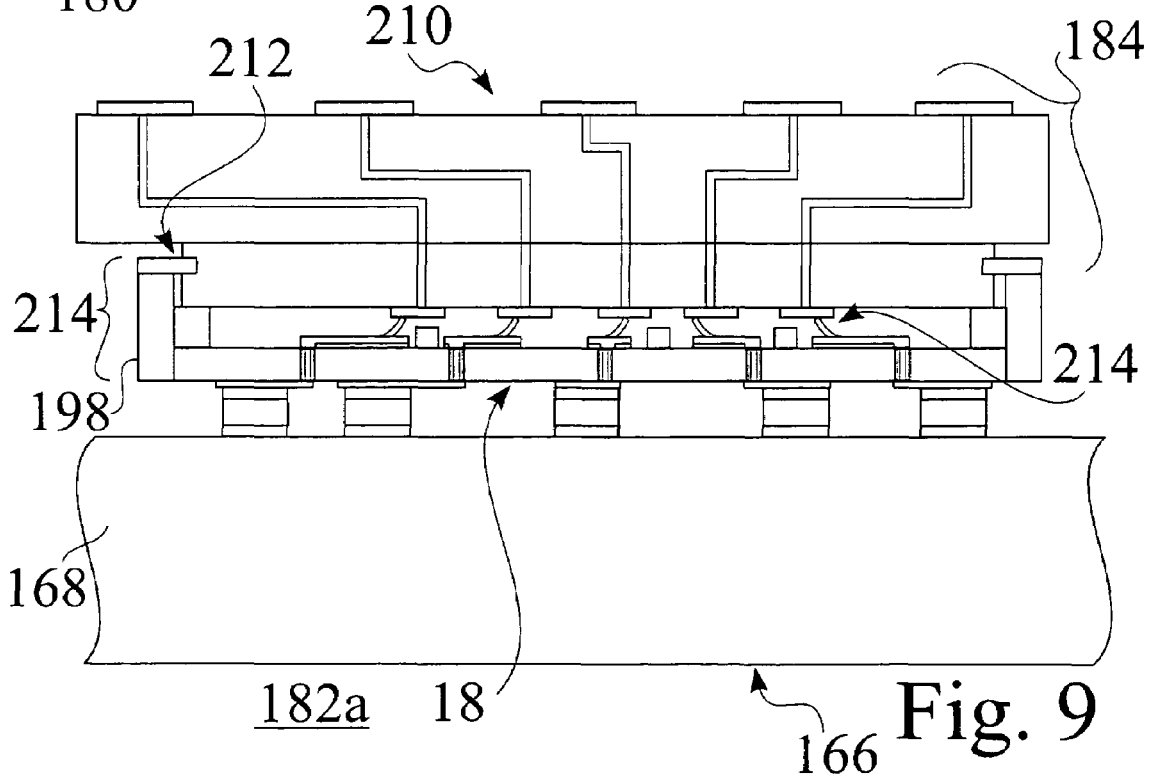
FIG. 9 is a second schematic assembly view of a high-density connector having fan-out.

FIG. 8 is a first schematic assembly view of a high-density connector 182a having fan-out 34. FIG. 9 is a second schematic assembly view of a high-density connector 182a having fan-out 34.

As seen in FIG. 8 and FIG. 9, a contactor assembly 18 provides high-density connections 214 between a contactor structure 162 and a secondary connector structure 184. The exemplary connector structure 184 shown in FIG. 8 and FIG. 9 comprises one or more substrates 186,188 having electrically conductive paths 194 defined therethorugh, typically having a first set of electrically conductive pads 190 which correspond to spring probe contacts 40 on the spring probe assembly 18, and a second set of electrically conductive pads 196 opposite the connector structure 184 from the first set of electrically conductive pads 190. In some embodiments of the connector structure 184, the second set of electrically conductive pads 196 correspond to connectors or contacts from an external structure, such as a printed circuit board or a cable connector.

In some embodiments of the high-density connector 182a, the connector structure 184 comprises a connector body 186, 188 having multi-layer thin film circuitry and electrically conductive through-vias 194.

As also seen in FIG. 8 and FIG. 9, a contactor assembly 18 comprises a top connector element within a contactor structure 162, such as seen in FIG. 6 and FIG. 7. As well, the probe card assembly 18 seen in FIG. 8 and FIG. 9 preferably comprises fan-out 34, such as 34a,34b (FIG. 2). Conductive bonds 112 are located between the contactor assembly 118 and the second structure 166, which preferably comprise solder joints 112.

The high-density connector 182a seen in FIG. 8 and FIG. 9 comprises means for connection 214 between the contactor structure 162 and the secondary connector structure 184, wherein establish connections 214 are established between the spring probes 40 and the first set of electrically conductive pads 190. The means for connection 214 preferably comprises one or more latches 212 between the contactor structure 162 and the secondary connector structure 184, such that the contactor structure 162 and the secondary connector structure 184 are movable 208 with respect to one another (FIG. 8), and also provide means for fixedly attaching, i.e. latching, when the contactor structure 162 and the secondary connector structure 184 are controllably positioned together. In some system applications, the latches 212 may provide unlatching, such as for service or for replacement of assemblies. In other applications, the latches 212 may be considered to be single-use latches, such as for but not limited to consumer electronics products.

Figure 21:
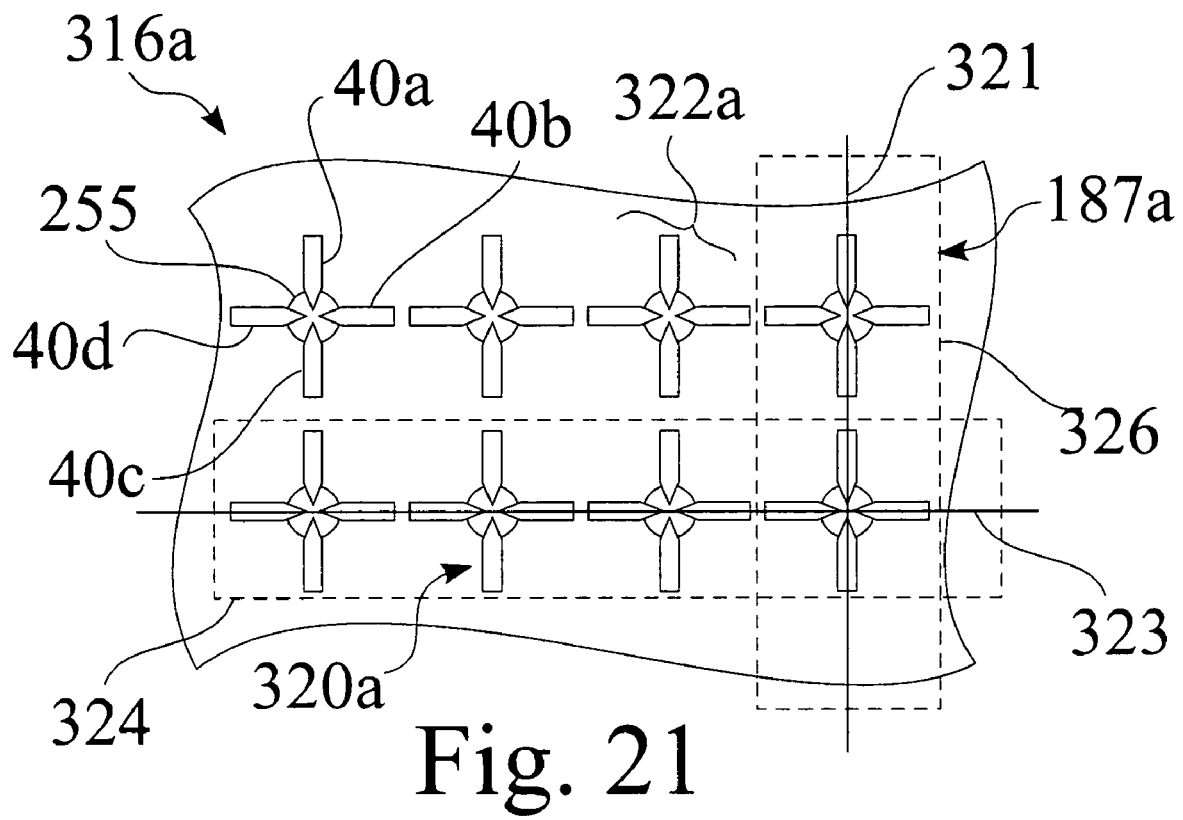
FIG. 21 is a plan view of a first embodiment of a high density BGA lattice-socket connector embodiment.
Figure 22:
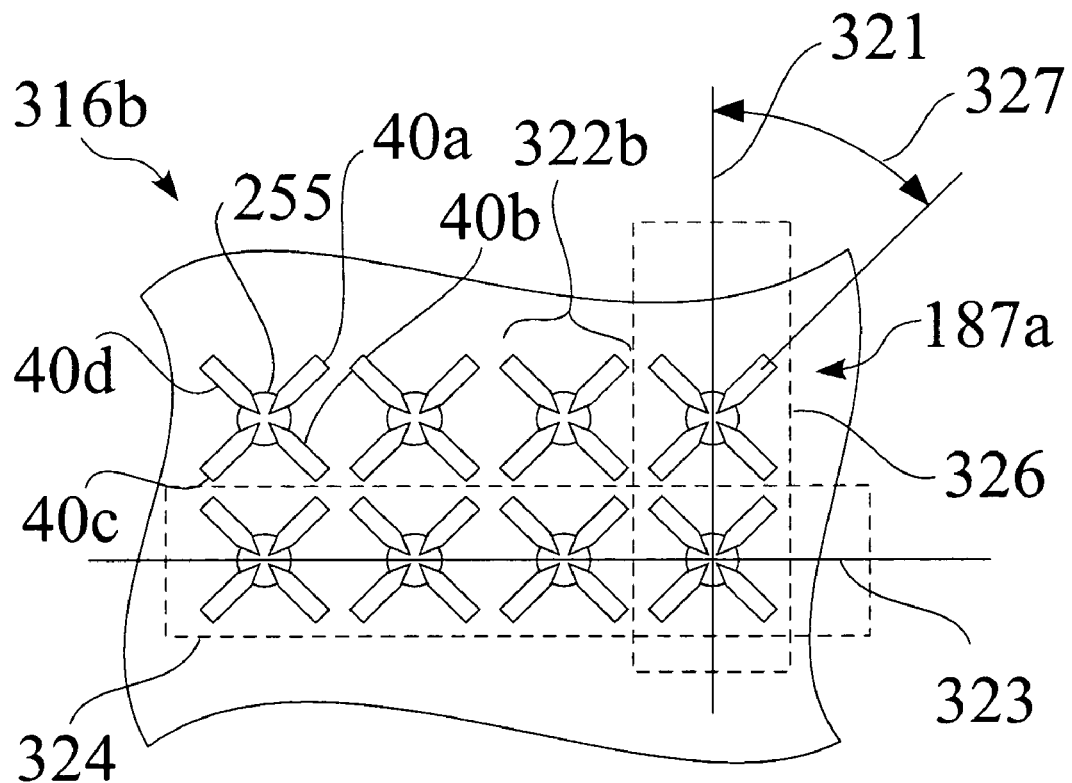
FIG. 22 is a plan view of a second embodiment of a high density BGA lattice-socket connector embodiment.

As seen in FIG. 8 and FIG. 9, the connection means 214 may preferably comprise one or more latches 212 formed by a first latch element 200 located on the contactor structure 162, which is matably connectable to a second latch structure 202 located on the secondary connector structure 184. The connection means 214 seen in FIG. 8 and FIG. 9 also preferably comprises means for alignment 198 between the contactor structure 162 and the secondary connector structure 184, such as one or more mechanical alignment guides 198, which may be affixed at a variety of locations in various embodiments of the connectors 182, such as to the contactor structure 162, e.g. directly to the contactor assembly 18, or alternately directly to the second structure 166 (FIG. 23,24), or to the secondary connector structure 184 (FIG. 21, FIG. 22).

High-density connectors 182, such as the high-density connector 182a seen in FIG. 8 and FIG. 9, may also comprise one or more travel stops 204, 206, such as to establish and/or protect the spring probes 40 and/or the electrical connections 214 between the spring probes 40 and the first set of electrically conductive pads 190. In some embodiments, a first set of travel stops 204 acts as means to dampen the latch connections 212, such as to dampen vibration or movement in the assembly 182, i.e. to absorb shock. In some embodiments, the second set of travel stops 206 prevents damage to the spring probes 40 during assembly, use, and/or service.

Exemplary Latch Structures. A wide variety of connection means 214 can be provided within various embodiments of high-density connectors 182, for latching 212 and/or alignment between contactor structures 162 and secondary connector structures 184.

Figure 10:
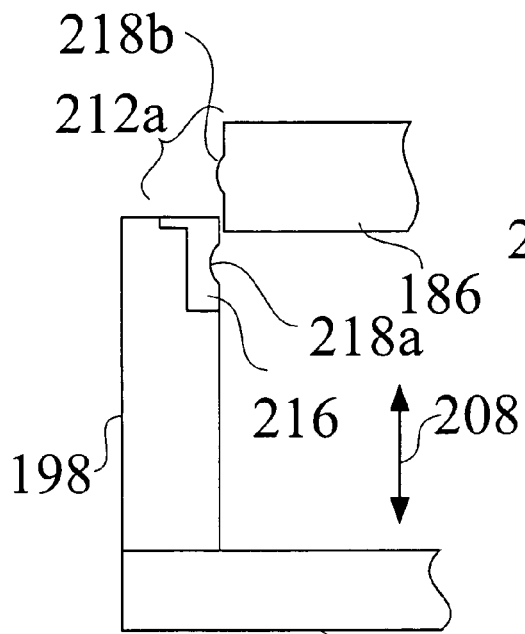
FIG. 10 is a detailed schematic view of a first exemplary embodiment of assembly latch construction.

FIG. 10 is a detailed schematic view 214 of a first exemplary embodiment of assembly latch construction 212a. A portion of a contactor structure 162, such as a contactor assembly substrate 30, may be fixedly connected or otherwise attached to one or more alignment guides 198, which may typically include a first latch element 218a, e.g. a detent or keep, either integrally or associated with a latch element 216. A portion of a secondary structure 184, such as a substrate 186, may typically include a second latch element 218b, e.g. a keep or detent. The contactor structures 162 and secondary connector structures 184 are movable 208 in relation to each other, e.g. linearly movable on Z-axis 27 (FIG. 1), to establish a mating latch connection 212a between the latch elements 218a and 218b.

Figure 11:
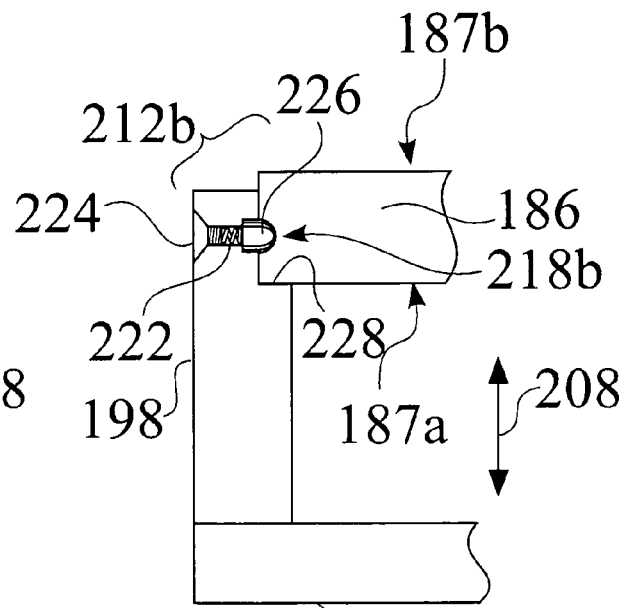
FIG. 11 is a detailed schematic view of a second exemplary embodiment of assembly latch construction.

FIG. 11 is a detailed schematic view 220 of a second exemplary embodiment of assembly latch construction 212b. A portion of a contactor structure 162, such as a contactor assembly substrate 30, may be fixedly connected or otherwise attached to one or more alignment guides 198, which may typically include a detent keep assembly, such as comprising a detent 226, a spring 222, and attachment means 224. A portion of a secondary structure 184, such as the substrate 186, may typically include a second latch element 218b, e.g. a detent, keep, hole, or groove, to attach to the first latch element 218a. As seen in FIG. 11, the alignment guides 198 may preferably include a ledge detail 228 which can act as a travel stop, such as in combination with a lower surface 187a of the substrate 186, for latching 212 and/or alignment between contactor structures 162 and secondary connector structures 184.

Figure 12:
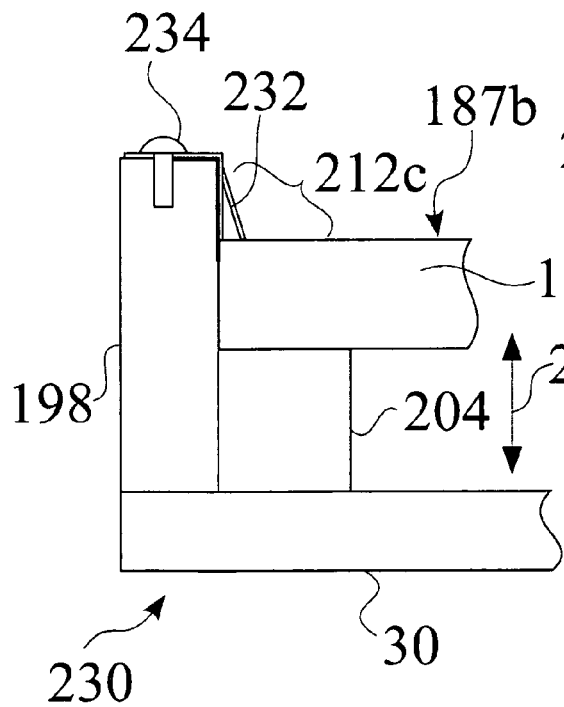
FIG. 12 is a detailed schematic view of a third exemplary embodiment of assembly latch construction.

FIG. 12 is a detailed schematic view 230 of a third exemplary embodiment of assembly latch construction 212c. One or more alignment guides 198 may alternately include first latch element 218a comprising one or more spring latches 232, fasteners 234, and one or more travel stops 204. A portion of a secondary structure 184, such as the rear surface 187b of the substrate 186, acts as a second latch element 218b. As the secondary structure 184 is moved closer 208 in relation to the contactor structure 162, as the substrate approaches or compresses the travel stop 204, the spring latches 232 catch and fixedly retain the rear surface 187b of the substrate 186.

Figure 13:
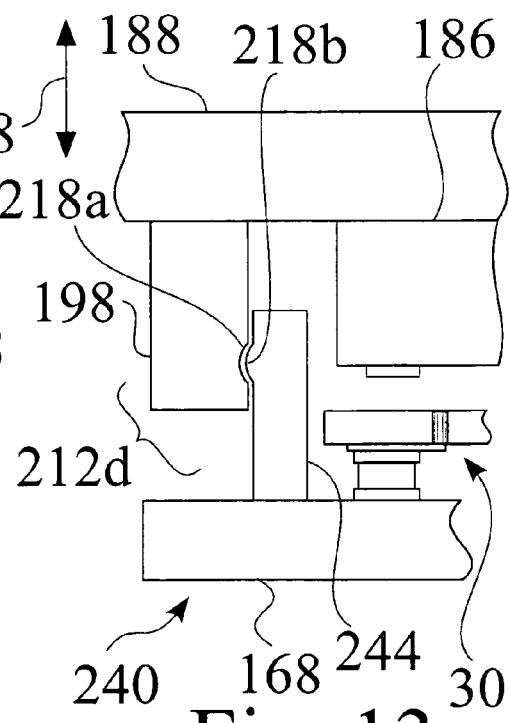
FIG. 13 is a detailed schematic view of a fourth exemplary embodiment of assembly latch construction.

FIG. 13 is a detailed schematic view 240 of a fourth exemplary embodiment of assembly latch construction 212d. A portion of secondary structure 184, such as substrate 188,186, may be fixedly connected or otherwise attached to one or more alignment guides 198, which may typically include a first latch element 218a, e.g. a detent or keep, either integrally or associated with a latch element 216 (FIG. 10). A portion of a contactor structure 162, such as the substrate 168 or the contactor substrate 30, may typically include a second latch element 218b, e.g. a keep or detent. The contactor structures 162 and secondary connector structures 184 are movable 208 in relation to each other, e.g. linearly movable on Z-axis 27 (FIG. 1), to establish a mating latch connection 212d between the latch elements 218a and 218b.

Figure 14:
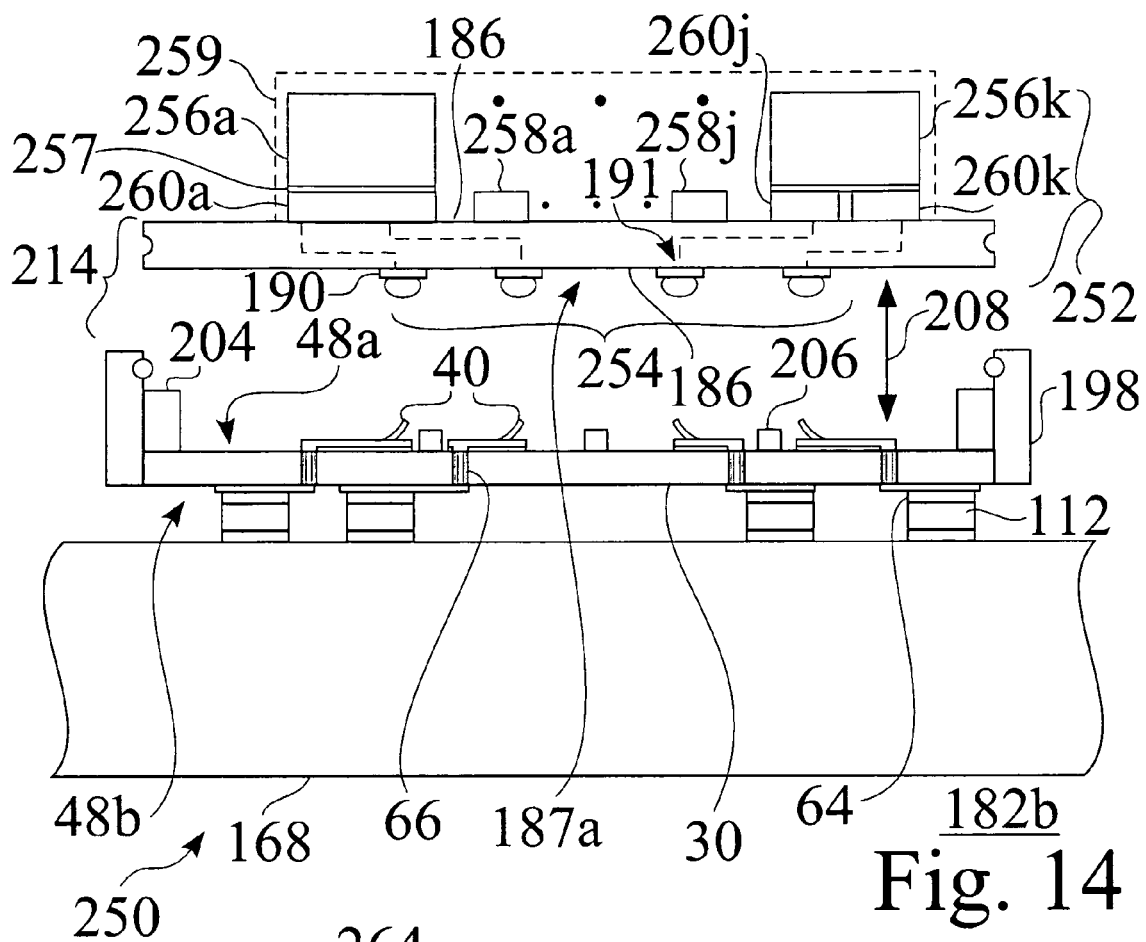
FIG. 14 is a first schematic assembly view of a high density BGA socket connector embodiment.
Figure 15:
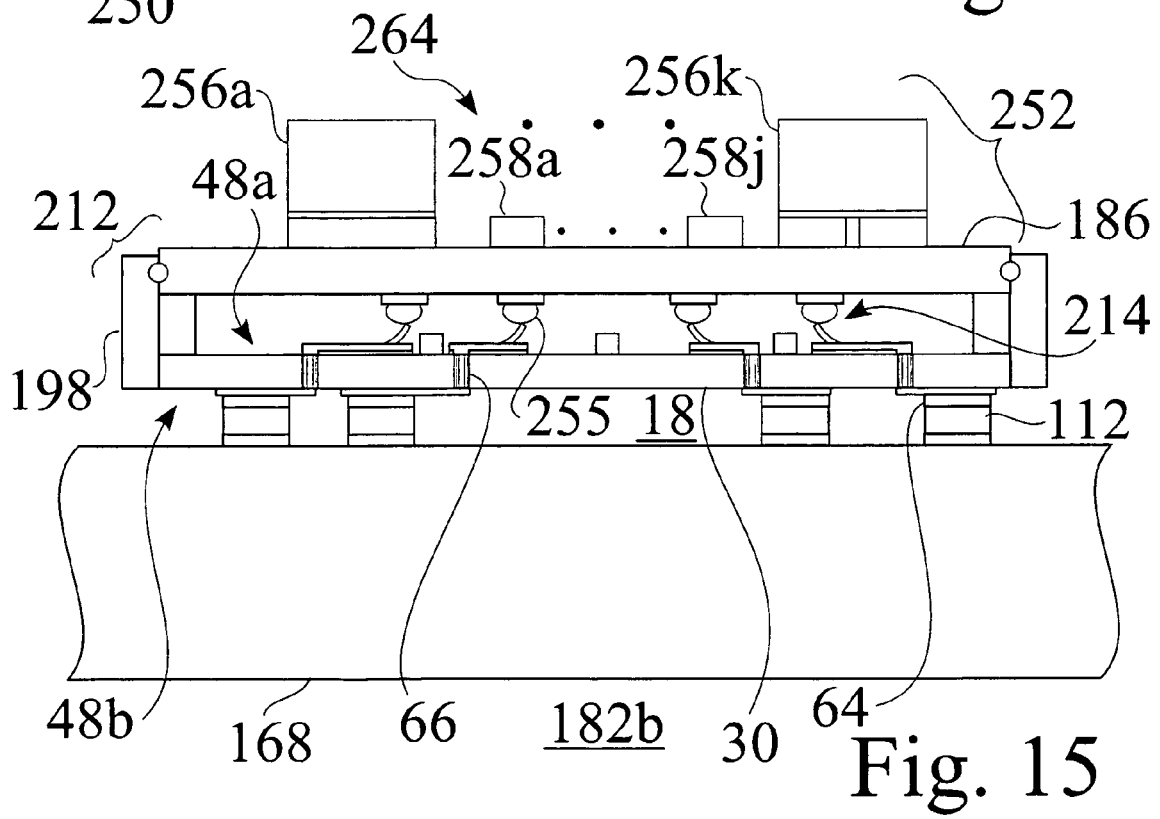
FIG. 15 is a second schematic assembly view of a high density BGA socket connector embodiment.

Other Advanced Latch Assembly Structures Having Spring Contact Interfaces. FIG. 14 is a first schematic assembly view 250 of a high-density connector 182b, in which the secondary connector structure 184 comprises a high density socketed package 252. Package 252 may be a ball grid array (BGA), a land grid array (LGA) or other device package having a substrate 186. Electrically conductive pads 190 optionally comprise a surface coating layer (e.g., gold, solder, etc.). Substrate 186 may comprise ceramic, glass ceramic, glass, glass epoxy, FR-4, polyimide, silicon, a printed circuit board, or a flip chip semiconductor device. FIG. 15 is a second schematic assembly view 264 of a high-density connector 182b, in which the secondary connector structure 184 comprises a high density socketed package 252. An array 254 of solder balls 255 are optionally located on the lower surface of the electrically conductive pads 190, which are located directly on the lower surface 187a adjacent to electrical connection terminals 191. The high-density connector 182b can be used to serve a wide variety of functions such as an intermediate connection 259, in conjunction with one or more components 258, e.g. 258a-258j, within the package 252, and/or in conjunction with one or more heat sinks 256, e.g. 256a-256k, which may preferably include thermal paste junctions 257 to facilitate heat transfer.

In the high-density connector 182b shown in FIG. 14 and FIG. 15, the components 258a-258j may comprise a variety of active and/or passive elements. In embodiments of the high-density connector 182b that include one or more heat sinks 256, the heat sinks may be used for heat transfer associated with one or more of the components 258a-258j and the contactor structure 162.

As discussed above, the connection means 214 may preferably comprise one or more matably connectable latches 212 established between the contactor structure 162 and the secondary connector structure 184. The connection means 214 seen in FIG. 14 and FIG. 15 may also preferably comprise means for alignment 198 between the contactor structure 162 and the secondary connector structure 184, such as one or more mechanical alignment guides 198, which may be affixed at a variety of locations in the high-density connector 182*b*, such as to the contactor structure 162, e.g. directly to the contactor assembly 18, or alternately directly to the second structure 166 (FIG. 23,24), or to the secondary connector structure 184 (FIG. 21, FIG. 22).

Figure 16:
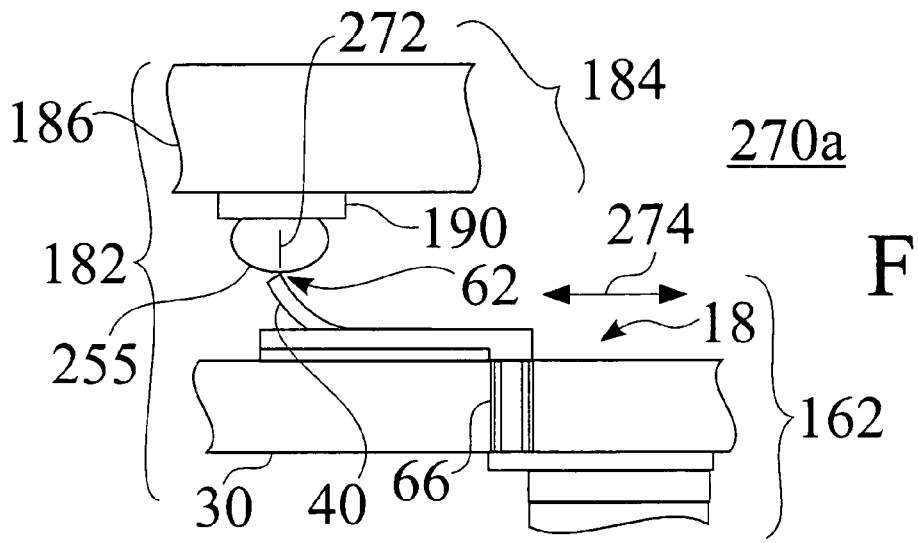
FIG. 16 is a detailed partial sectional view of a centered-contact micro-fabricated spring contact connection for an exemplary high-density connector.
Figure 17:
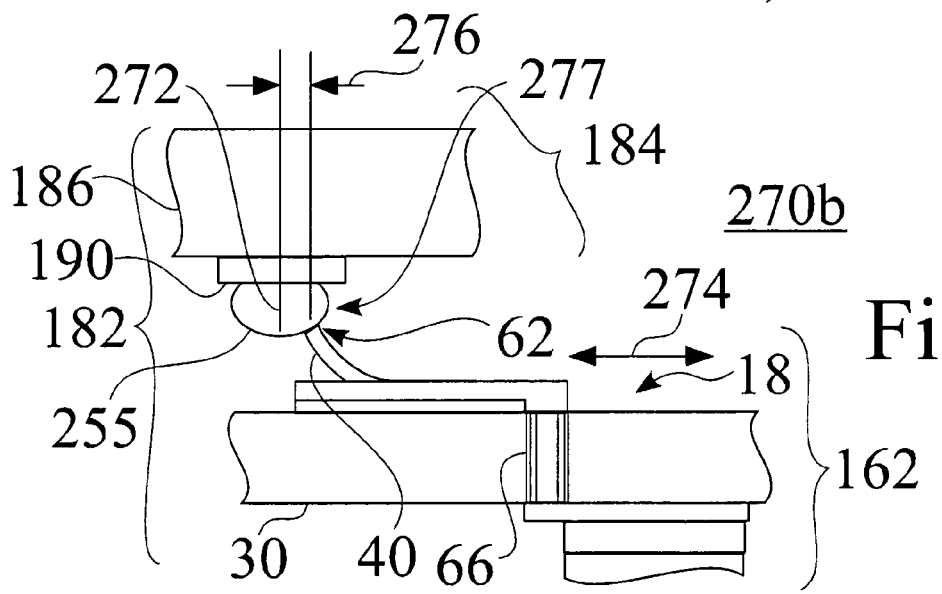
FIG. 17 is a detailed partial sectional view of a leading-edge micro-fabricated spring contact connection for an exemplary high-density connector.
Figure 18:
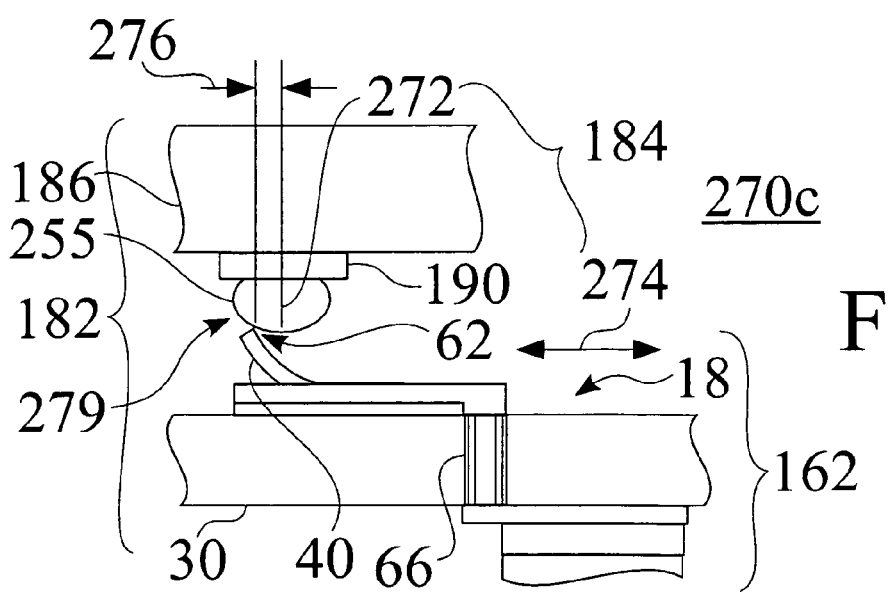
FIG. 18 is a detailed partial sectional view of an over-center micro-fabricated spring contact connection for an exemplary high-density connector.

FIG. 16 is a detailed partial sectional view of a centered-contact spring connection 270*a* for an exemplary high density connector 182. FIG. 17 is a detailed partial sectional view of a leading-edge contact spring connection 270*b* for an exemplary high density connector 182. FIG. 18 is a detailed partial sectional view of an over-center contact 270*b* spring connection for an exemplary high density connector 182.

As seen in FIG. 16, a compliant spring 40 extending from a first connector structure 162, such as from a contactor substrate 30, makes an electrical connection 272 with a correspondingly opposing electrically conductive pad 190 extending from a second connector structure 184, such as from a substrate 186. As seen in FIG. 16, an electrically conductive solder ball 255 is located on the electrically conductive pad 190, and defines a convex surface having a relatively horizontal center 272. In FIG. 16, the first connector structure 162 and the second connector structure 184 are associatively positioned 274 such that the tip 62 of the compliant spring 272 is aligned with the center 272 of electrically conductive solder ball 255.

As seen in FIG. 17, the first connector structure 162 and the second connector structure 184 are associatively positioned 274 such that the tip 62 of the compliant spring 40 is offset 276 from the center 272 of electrically conductive solder ball 255, such that the tip 62 connects to the electrically conductive solder ball 255 on a leading, i.e. face surface 277.

As seen in FIG. 18, the first connector structure 162 and the second connector structure 184 are associatively positioned 274 such that the tip 62 of the compliant spring 40 is offset 276 from the center 272 of electrically conductive solder ball 255, such that the tip 62 connects to the electrically conductive solder ball 255 on a trailing, i.e. back surface 279.

As seen in FIG. 16, FIG. 17 and FIG. 18, embodiments of the high density interconnectors can preferably provide a wide variety of electrical connections between the first connector structure 162 and the second connector structure 184, such as to prevent damage to solder balls 255 and/or compliant springs 40. For example, in probe or connection embodiments in which probe tips 62 are centered on relatively soft solder balls 255, one or more established connections between a first connector structure 162 and a second connector structure 184 may deform the center of one or more solder balls 255, whereby solder reflow may be desired to service the second connector structure 184. As seen in FIG. 17 and FIG. 18, some preferred high density interconnectors 182 may alternately provide leading-edge contact spring connections 270*b* and/or over-center contact spring connections 270*b*, such as to provide a high quality connection over repeated usage.

As well, some preferred high density interconnectors 182 provide controlled offset of an array of springs 40 associated with an array of solder balls 255, e.g. having tips 62 on opposite sides of adjacent solder balls 255, such as to balance connection forces across a connector, i.e. to promote self centering and prevent a skewed connection between the first connector structure 162 and the second connector structure 184.

Other preferred embodiments provide alternative arrangements of spring contacts 40 on the contactor substrate 30 that approximately balance the lateral forces on the solder balls 255 generated by the spring contact tips 62 across the connector 182. In some preferred embodiments, one spring contact 40 may be provided for each solder ball 255. Lateral forces across the connector 182 can be minimized and approximately balanced by providing approximately equal numbers of spring contacts 40 on opposite sides of the solder balls 255, e.g. the leading and trailing edges of every other solder ball 255. For example, at least some of the spring contacts 40 may be located to offset respective lateral forces applied to associated solder balls 255, and/or the resulting forces applied to the spring contacts 40.

Figure 19:
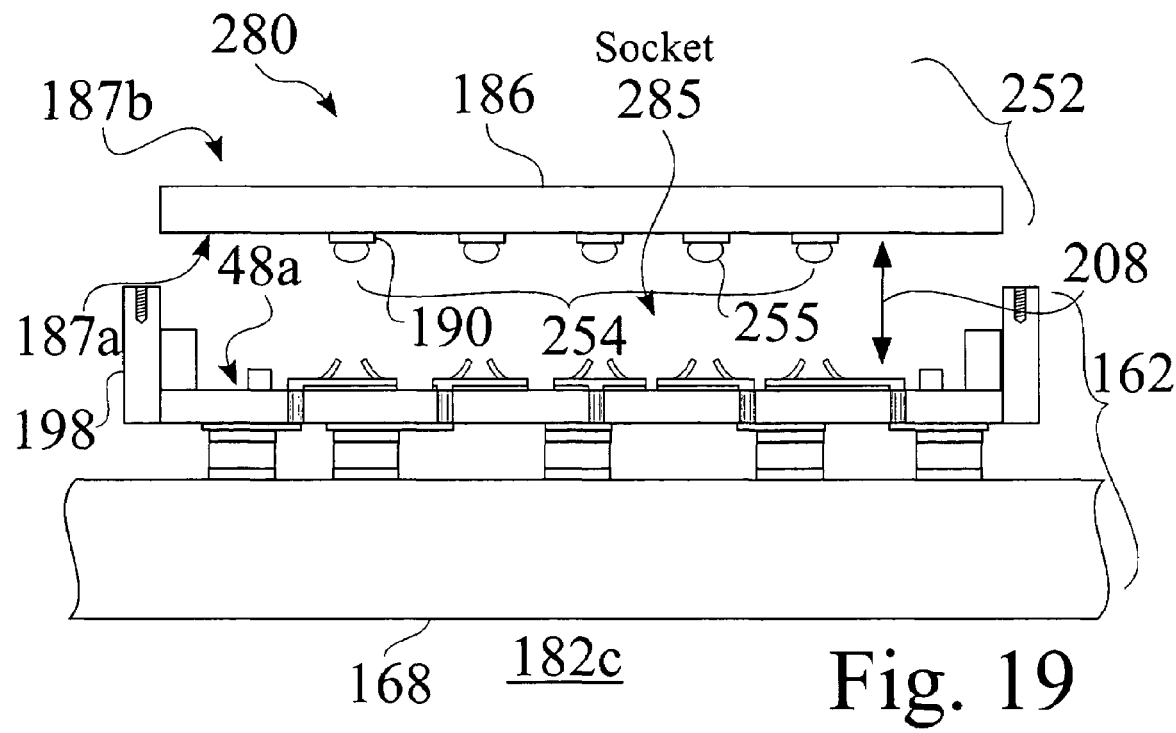
FIG. 19 is a first schematic assembly view of a BGA lattice-socket connector embodiment.
Figure 20:
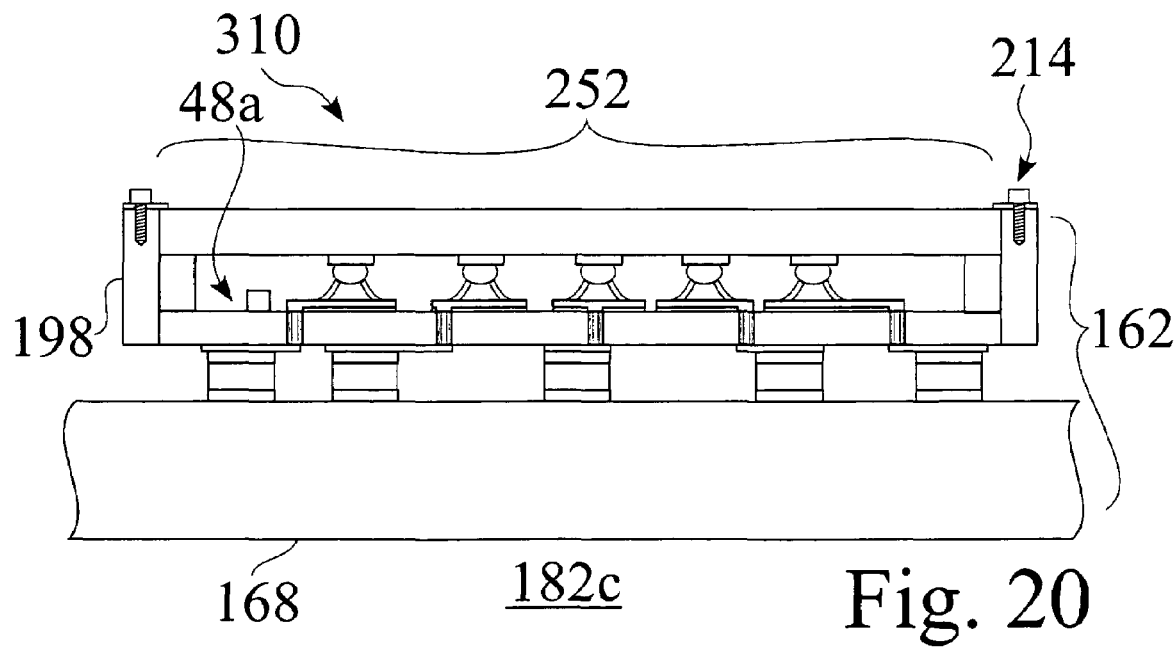
FIG. 20 is a second schematic assembly view of a high density BGA lattice-socket connector embodiment.

FIG. 19 is a first schematic assembly view 280 of a high-density connector 182*c*, in which the secondary connector structure 184 comprises a high density socketed package 252, and in which the contactor assembly 18 comprises a plurality of spring contacts 40 corresponding to each solder ball connection 255 in a ball grid array 254. Package 252 may be a ball grid array (BGA), a land grid array (LGA) or other device package having a substrate 186. In cases where optional solder balls 255 are not present, e.g. package 252 is a LGA, spring contacts 40 will directly contact the electrically conductive pads 190. The substrate 186 may comprise ceramic, glass ceramic, glass, glass epoxy, FR-4, polyimide, silicon, a printed circuit board, a semiconductor device package, or a flip chip semiconductor device. FIG. 20 is a second schematic assembly view 310 of a high-density connector 182*c*. The high-density connector 182*c* may be configured and function in a similar manner to the high-density connector 182*b*. The preferable inclusion of a plurality of spring contacts 40, e.g. 40*a*-40*d* can be used for any of reliability, redundancy, applications which require increased current or voltage requirements, and mechanical robustness, i.e. providing robust and force balanced connections to optional electrically conductive pads 190, solder balls 255, and/or ball grid array 254.

FIG. 21 is a partial plan view of a first embodiment 316*a* of a high density spring contact lattice-socket connector 182*c*. FIG. 22 is a partial plan view of a second embodiment 316*b* of a high density spring contact lattice-socket connector 182*c*.

As seen in FIG. 21, in the first embodiment 316*a* of the high-density connector 182*c*, each probe spring set 322*a* comprises a plurality of spring probes 40, e.g. 40*a*-40*d*, in which the probe spring sets 322*a* are aligned in an array of one or more rows 324 and columns 326, to correspond to solder balls 255 located on a lower surface 187*a* of a second connector structure 184. Spring probe sets 322 may comprise any convenient number of spring probes, such as but not limited to 1, 2, 3 and/or 4 springs 40. However, as seen in FIG. 21, spring probes 40 are also axially aligned 321, 323 to the rows 324 and columns 326 respectively, which can limit the density of the connector 182*c* and/or the length of the compliant springs 40.

As seen in FIG. 22, in the second embodiment 316*b* of the high-density connector 182*c*, each probe spring set 322*b* also comprises a plurality of spring contacts 40, e.g. 40*a*-40*d*, in which the spring contact sets 322*b* are aligned in an array of one or more rows 324 and columns 326, to correspond to solder balls 255 or electrically conductive pads 190 located on a lower surface 187*a* of a second connector structure 184. However, as seen in FIG. 22, spring contacts 40 are also diagonally skewed, e.g. rotated 327 with respect to the rows 324 and/or columns 326, which provides an increase in connection density for the connector 182*c* and/or provides an increased length for the compliant spring contacts 40.

Figure 23:
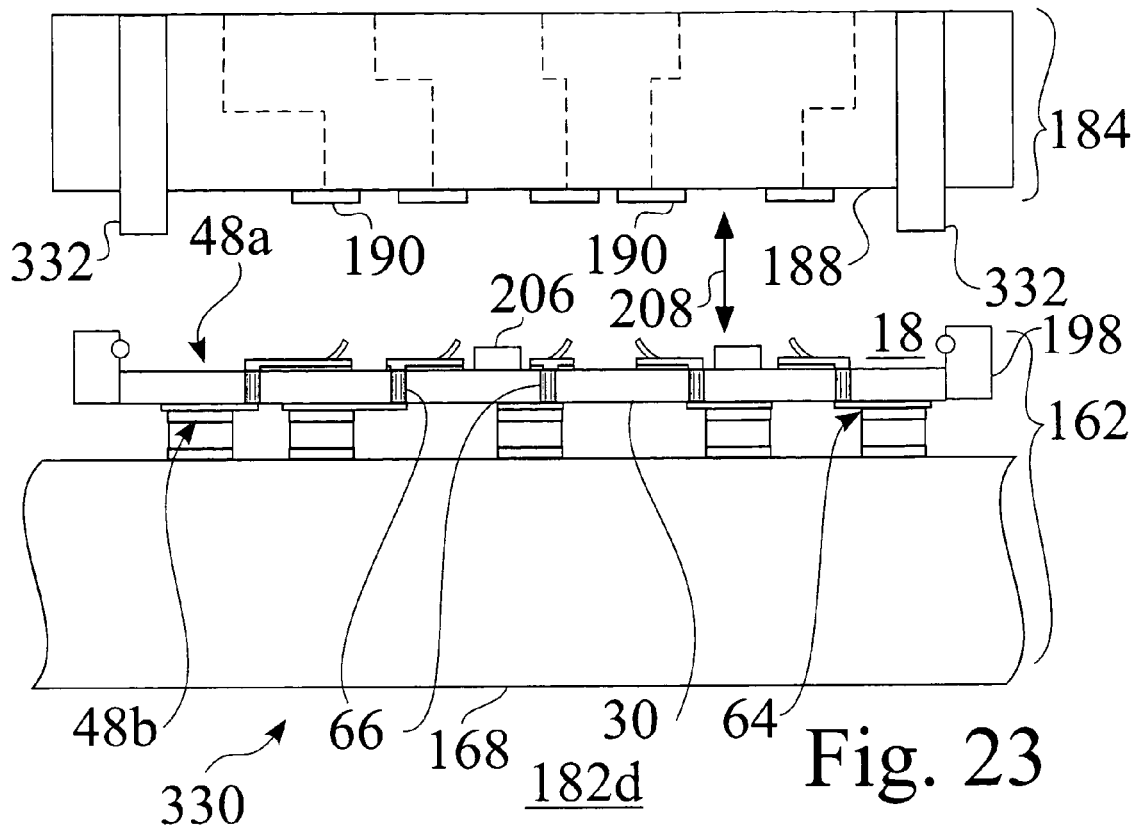
FIG. 23 is a first schematic assembly view of a high-density low profile board-to-board contactor.
Figure 24:
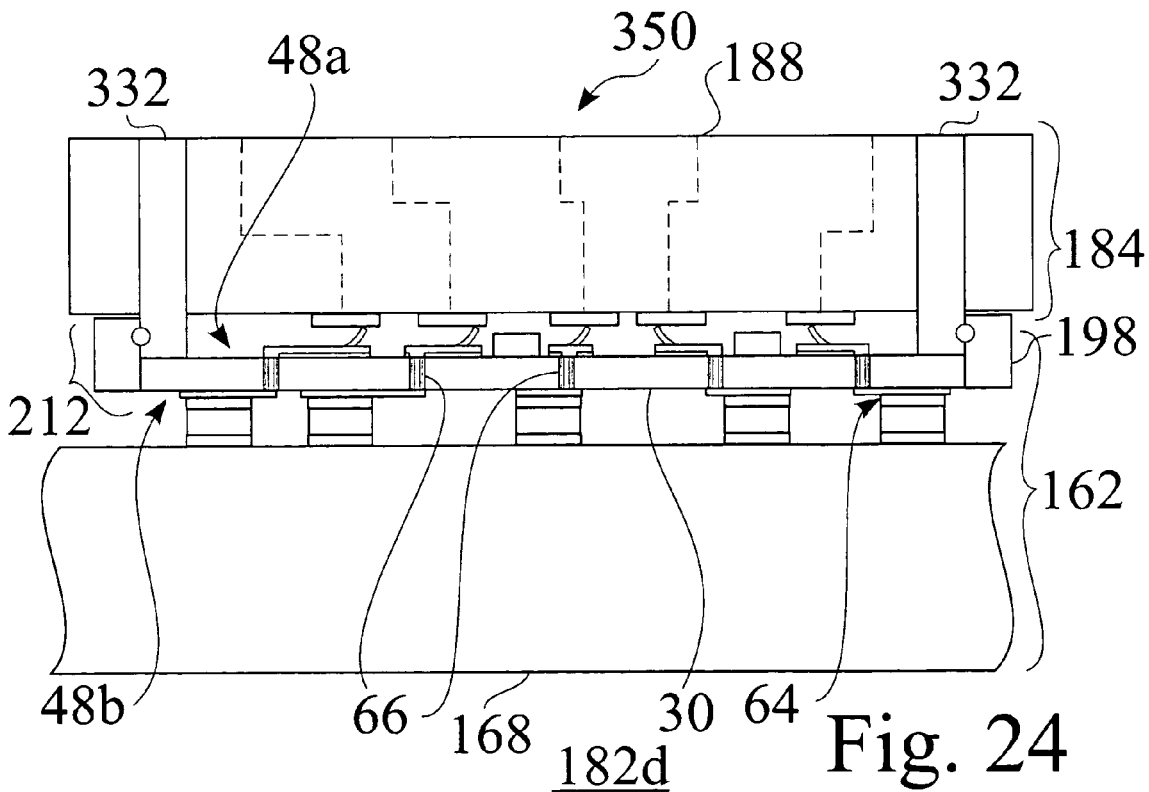
FIG. 24 is a second schematic assembly view of a high-density low profile board-to-board contactor.

FIG. 23 is a first schematic assembly view 330 of a high-density low profile substrate-to-substrate connector 182*d*. FIG. 24 is a second schematic assembly view 350 of a high density low profile substrate-to-substrate connector 182*d*. A lower substrate 166 and an upper substrate 188, are latchably connected 212, such as between standoffs 332 extending from the secondary connector structure 184, e.g. such as affixed to or through the upper substrate 188, and alignment guides 198 extending from the contactor structure 162, e.g. such as affixed to either the contactor assembly 18 or to the lower substrate structure 166. The lower and upper substrates 166 and 168 may comprise any of ceramic, multi-layer ceramic, glass ceramic, glass, quartz, glass epoxy, FR-4, polyimide, a semiconductor wafer, silicon, a printed circuit board, one or more flip chip ICs, one or more packaged semiconductor devices, a semiconductor integrated circuit, and a hybrid integrated circuit. As seen in FIG. 24, the standoffs 332 may preferably be configure to function as travel stops for a latched assembly 182, e.g. 182d.

Figure 25:
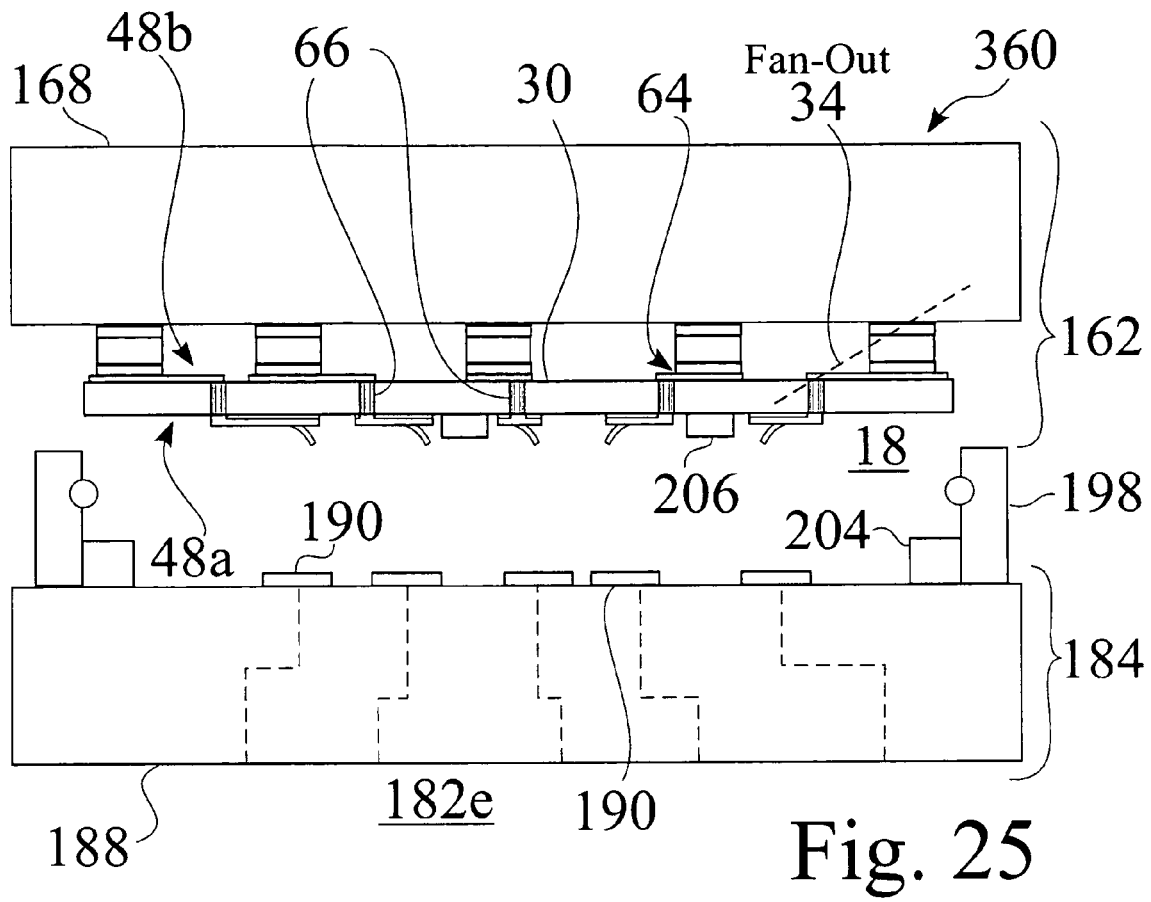
FIG. 25 is a first schematic assembly view of a high-density low profile board-to-board contactor with fan-out.
Figure 26:
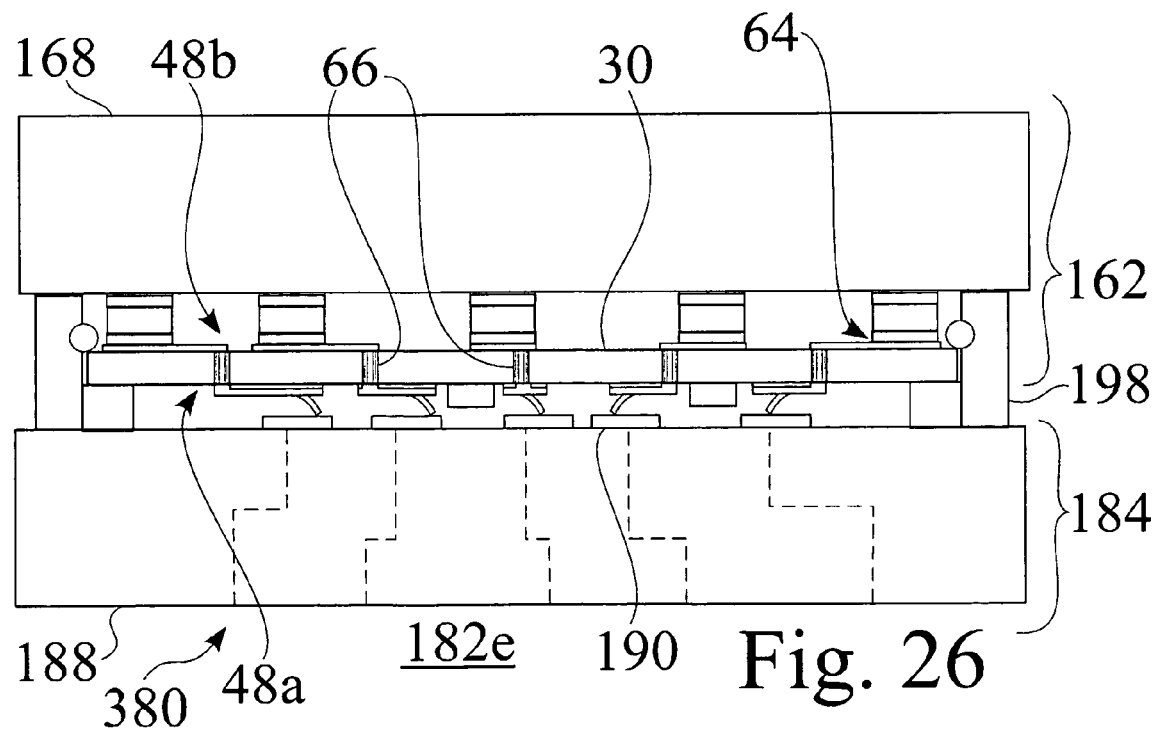
FIG. 26 is a second schematic assembly view of a high-density low profile board-to-board contactor with fan-out.

FIG. 25 is a first schematic assembly view 360 of a high density low profile substrate-to-substrate connector 182e with fan-out 34. FIG. 26 is a second schematic assembly view 380 of a high density low profile substrate-to-substrate connector 182e with fan-out 34. High-density connectors 182 inherently provide high-quality high density electrical connections within a latchable assembly, which can provide fan-out on either or both sides 162,184 of the latch region 212. Lower and upper substrates 166 and 168 may comprise ceramic, glass ceramic, glass, glass epoxy, FR-4, polyimide, silicon, a printed circuit board, one or more packaged ICs, or one or more flip chip ICs. High-density connectors 182 also inherently provide a high degree of planarity within the latching region 212, and also provide planarity compliance through the use of compliant, i.e. flexible spring probes 40.

Advanced Semiconductor Device Packages. Key problems associated with device and wafer level packaging often include:

Thermal Coefficient of Expansion (TCE) mismatch:
Lack of Co-Planarity;
Thermal management;
High frequency performance; and/or
Cost The use of high-density connectors 182 inherently provides means for cost effective solutions to each of these problems. The X-Y compliance of the spring probes 40, which preferably comprise micro-fabricated spring contacts, compensates for TCE mismatch between a device and a printed circuit board, while the Z-compliance of the spring probes 40 compensates for lack of co planarity. As well, Z-compliance and customizable length springs accommodates chips with different substrate thickness, such as for multiple-die packages, e.g. system in package (SiP). Furthermore, multilevel metal can be used to provide controlled impedance and shielded signal paths. In addition, preferred embodiments of high-density connectors 182 which utilize photolithographic self-assembling springs have an advantageous cost/performance ratio.

Figure 27:
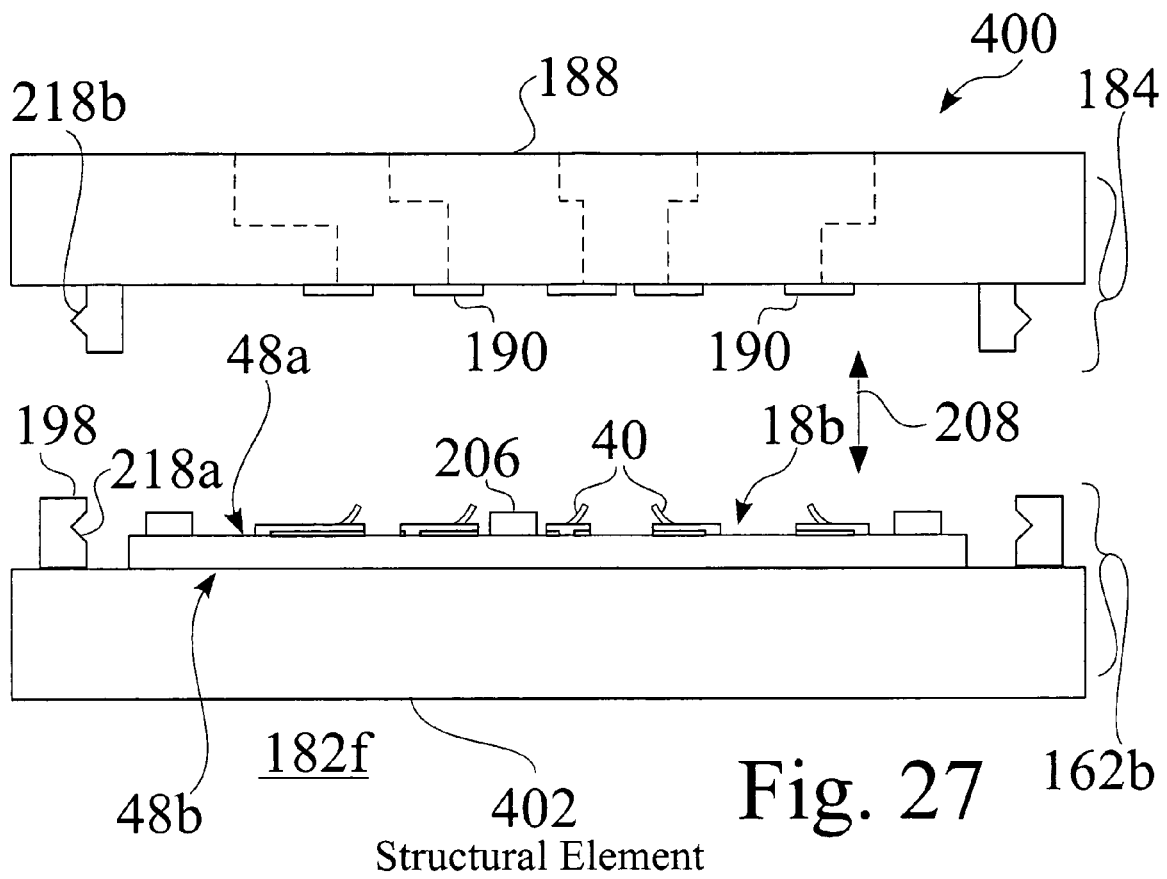
FIG. 27 is a first schematic assembly view of a solderless chip mount embodiment.
Figure 28:
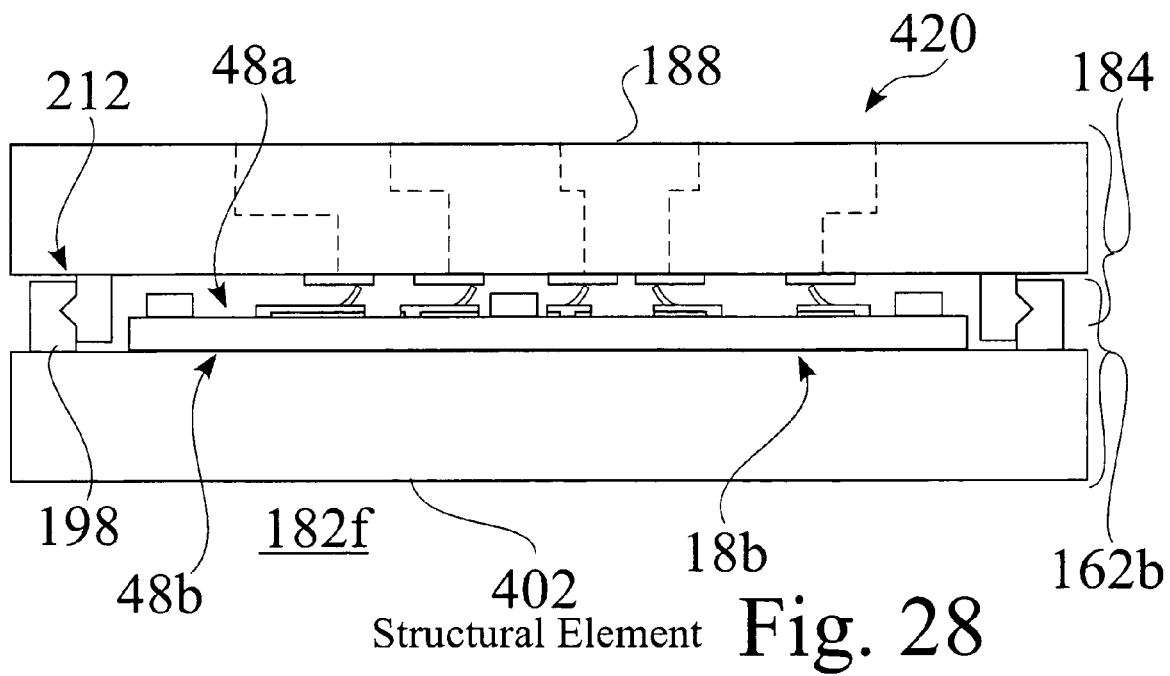
FIG. 28 is a second schematic assembly view of a solderless chip mount embodiment.

FIG. 27 is a first schematic assembly view 400 of a high-density connector 182f for the solderless mounting of one or more contactor assemblies 18, such as for a contactor assembly that comprises a chip scale package. FIG. 28 is a second schematic assembly view 420 of a high-density connector 182f for the solderless mounting of one or more contactor assemblies 18. A lower structure 162b comprises a contactor scale package 18b located on a structural element 402, such as a planar heat sink, carrier, or surface mount package substrate 402. A secondary structure 184 includes a substrate 188 comprising any of ceramic, multi-layer ceramic, glass ceramic, glass, quartz, glass epoxy, FR-4, polyimide, silicon, and a printed circuit board. The secondary structure 184 also comprises electrically conductive pads 190 on the lower surface 187a. Means are provided for positioning 198 the lower structure 162b and secondary structure 184 in relation to each other, whereby their position may be aligned by one or more travel guides 198. The secondary structure 184 is also latchably attachable 212 to the lower structure 162b, such as by corresponding latch elements 218a, 218b.

Figure 29:
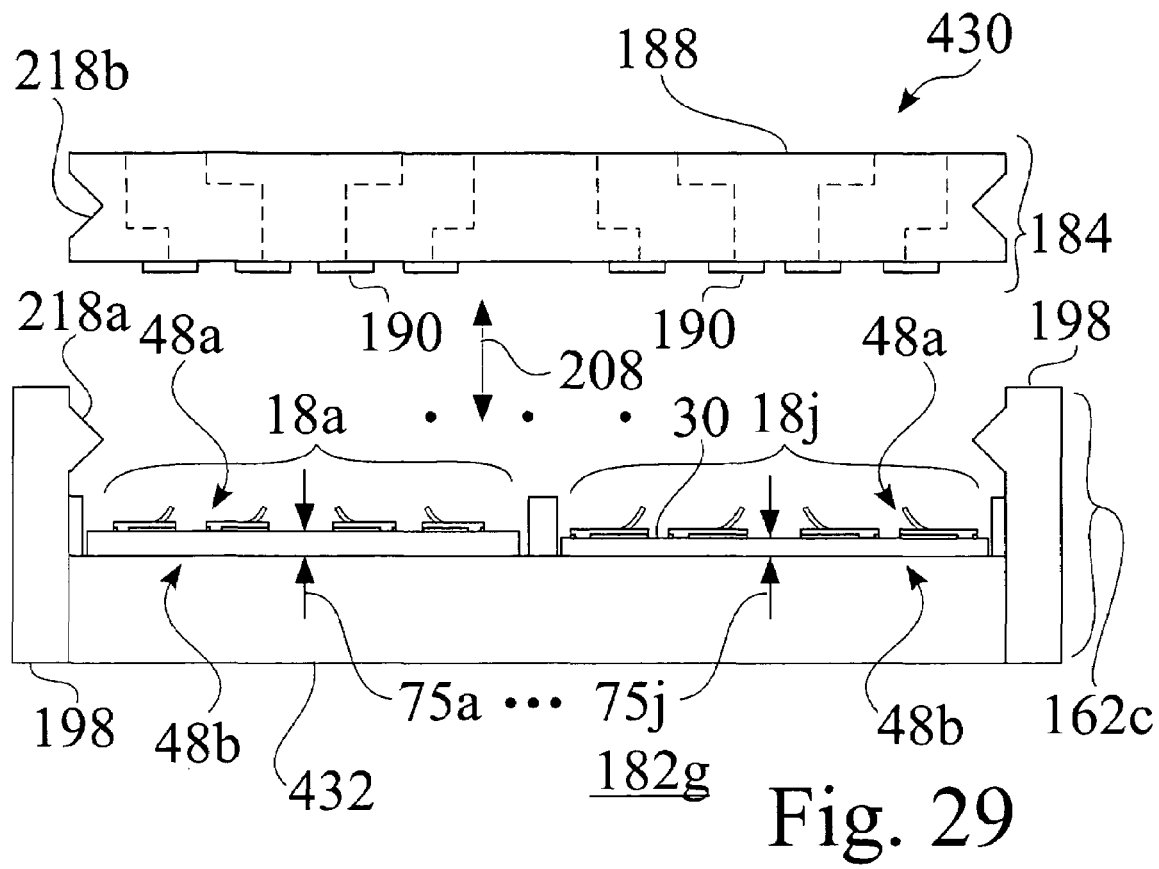
FIG. 29 is a first schematic assembly view of a system in package (SIP) embodiment.
Figure 30:
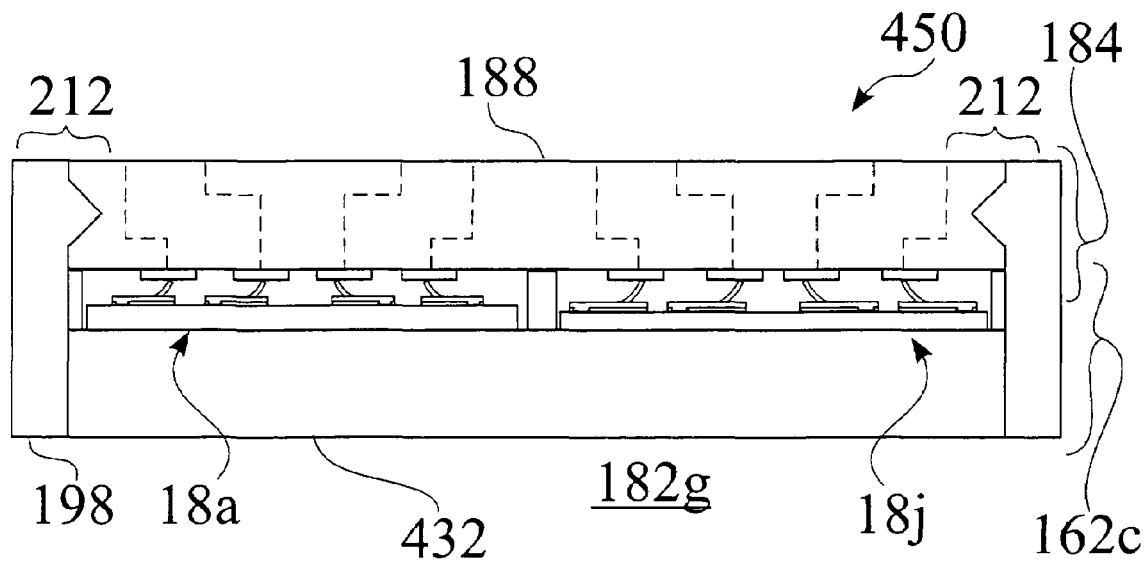
FIG. 30 is a second schematic assembly view of a system in package (SIP) embodiment.

FIG. 29 is a first schematic assembly view 430 of a high-density connector 182f for a system in package (SIP) embodiment. FIG. 30 is a second schematic assembly view 450 of a high-density connector 182f for a system in package (SIP) embodiment. A lower structure 162c comprises one ore more contactor scale packages 18, e.g. 18a-18j, located on a structural element 432, such as a planar heat sink, carrier, or surface mount package substrate 432. A secondary structure 184, such as comprising ceramic, glass ceramic, glass, glass epoxy, FR-4, polyimide, silicon, a printed circuit board 188, one or more packaged ICs, or one or more flip chip ICs, having electrically conductive contact pads 190, accommodates relative movement in relation to the lower structure 162c, whereby the movement 208 may be aligned by one or more travel guides 198. The secondary structure 184 is also latchably attachable 212 to the lower structure 162c, such as by corresponding latch elements 218a,218b.

In a preferred embodiment, contactor scale packages 18a-18j comprise integrated circuit packages which may have the same or differing substrate thicknesses 75a-75j. In some preferred embodiments, integrated circuit packages 18a-18j may comprise non-monolithic or monolithic micro-fabricated spring contacts to provide compliant electrical connections circuit board 188. In some preferred embodiments, the spring contact tips 62 are positioned at a standard height from the supported rear surface 48b of the integrated circuit devices 18, i.e. adjusted to compensate for differences in thicknesses 75 of the integrated circuit device substrates 30. In other preferred embodiments, the spring contact tips 62 may are positioned at a fixed height from the contact surface 48a of the integrated circuit device substrates 30, i.e. the compliance of the spring contacts 40 provide compensation for differences in thicknesses of the integrated circuit device substrates 30.

Figure 31:
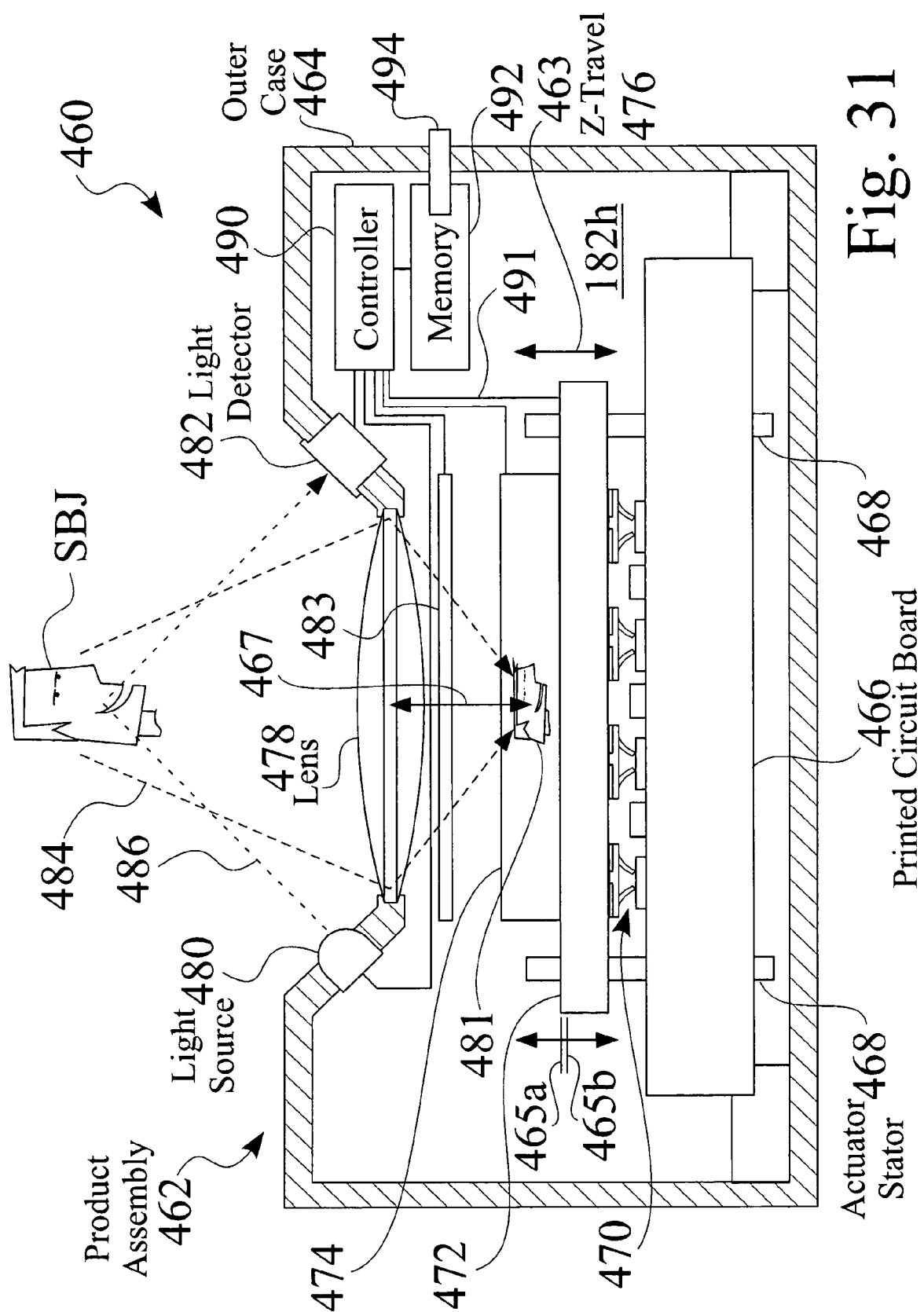
FIG. 31 is a schematic assembly view of Z-compliant connector construction for an exemplary article of manufacture.

Alternate Advanced Assembly Structures. FIG. 31 is a schematic assembly view 460 of Z-compliant connector construction for an exemplary article of manufacture 462, such as for but not limited to a camera, a video camera, a personal digital assistant (PDA), a solid state music player, e.g. an MP3 or an enhanced iPod, or for a multi-function device.

In the exemplary article of manufacture 462, a MEMS Z-Actuator 472, having probe springs 40, is slidably movable 463 on one or more actuator stators 468. An image sensor, e.g. CCD, chip 474 is mounted, e.g. surface mounted, to the opposing side of the MEMS Z-Actuator 472. The actuator stators 468 are affixed with respect to a printed circuit board 466. The printed circuit board 466 is affixed with respect to at the case structure 464 of the article 462. For an article of manufacture 462 comprising a camera, a lens 478 is typically located such that light 484 associated with a captured image 481 is controllably captured, i.e. allowed to enter and sensed by the image sensor 474, such as by a shutter 483. An auto focus light source 480 and light detector 482 may also be included, such that emitted light 486 is reflected and sensed as an input to a control 490.

In the exemplary article of manufacture 462 seen in FIG. 31, the MEMS Z-Actuator 472 is slidably movable 463 in the Z-direction 27 (FIG. 1) on the actuator stators 468, such as to any reference plane between and including a first position 465a and a second position 465b, wherein compliant contactor array 470, comprising spring contacts 40 can preferably provide compliant electrical contacts to the printed circuit board 466 throughout the range of motion 465a,465b.

The effective focal plane 467 from the lens 478 to the image sensor 474 is therefore controllably variable at any point between and including the first position 465a and the second position 465b. For example, during auto focus operation of the camera 462, emitted light 486 from the auto focus light source 480 is reflected off a subject SBJ and sensed by the light detector 482, which acts as an input for control 490. Based upon the auto focus input, the controller 490 moves the MEMS actuator 472 at any point between and including a first position 465a and a second position 465b, to provide a desired focal length 467. An image 481 is then typically controllably captured, such as by controlled opening of a shutter 483, and stored to a memory 492, which can then be downloaded or otherwise transferred, e.g. such as by a removable memory element 494.

Figure 32:
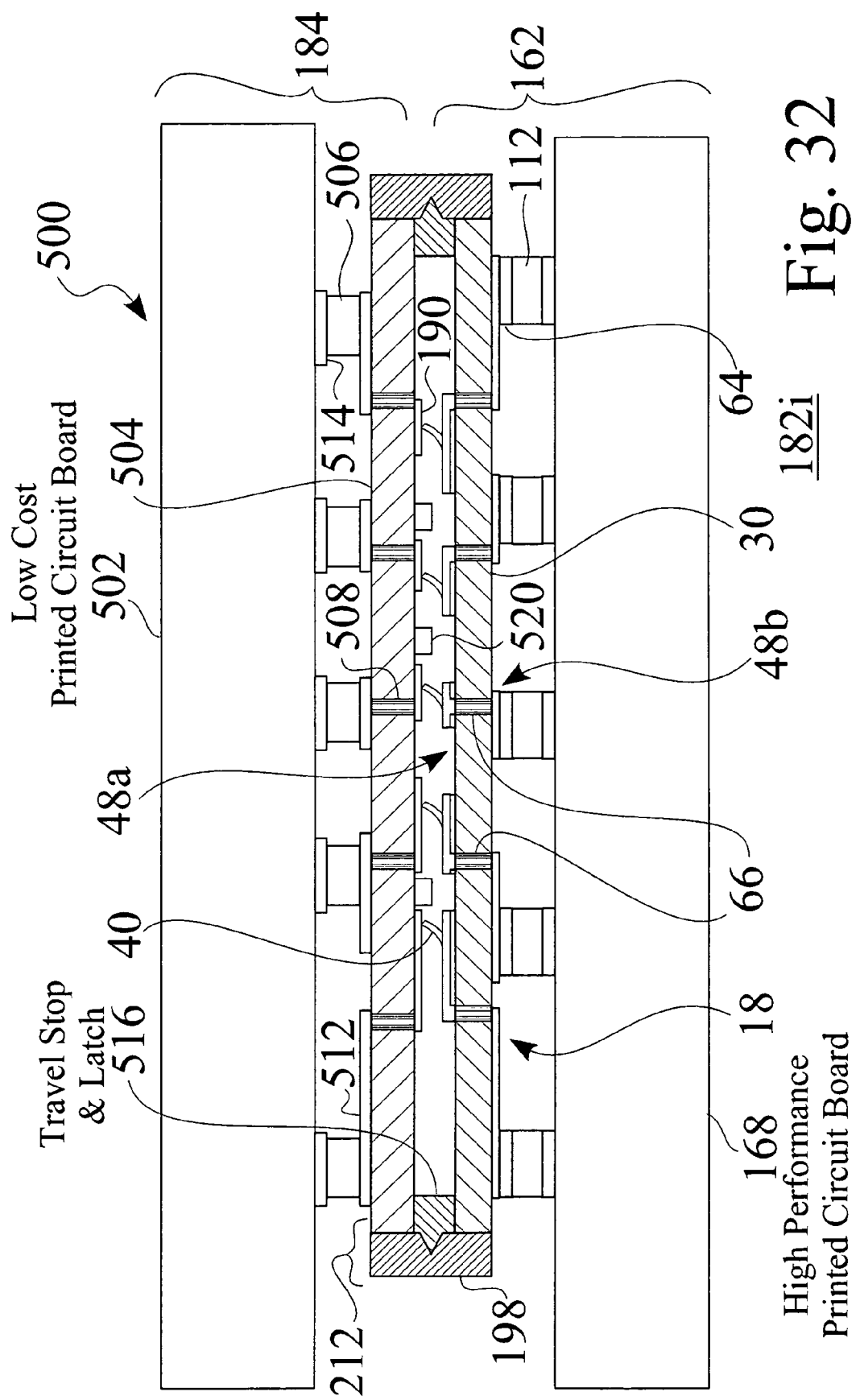
FIG. 32 shows a first exemplary embodiment of board to board connector construction.
Figure 33:
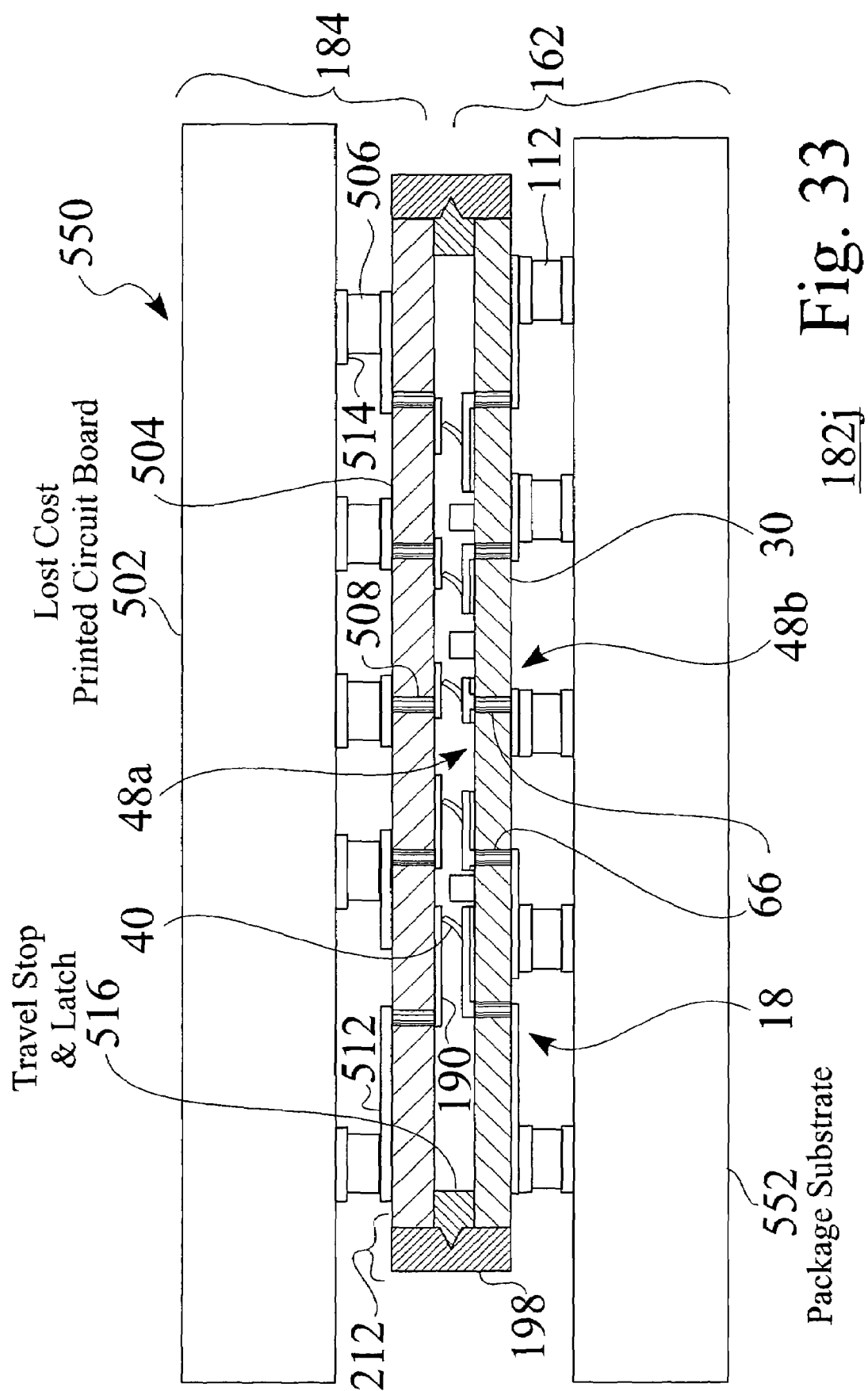
FIG. 33 shows a second exemplary embodiment of a board to board connector construction.

FIG. 32 is a detailed schematic view 500 of first exemplary board to board high-density connector 182i, such as to provide any of a releasable or permanent connection between a high cost printed wiring board 168 and a low cost printed wiring board 502. FIG. 33 is a detailed schematic view 550 of secondary exemplary board to board high-density connector 182j, such as to provide any of a releasable connection or permanent connection between a package substrate 552 and a low cost printed wiring board 502.

The exemplary secondary connector assembly 184 seen in FIG. 32 and FIG. 33 comprises electrical connections 506, such as but not limited to solder ball connections 506, e.g. such as provided by reflow 176, between a printed circuit board 502 and a lower connector substrate 504. The lower connector substrate 504 further comprises contact pads 512 on the upper surface, electrically conductive vias 508 extending through the lower connector substrate 504, and lower contacts 190, for connection with one or more corresponding probe springs 40 extending from the contactor assembly 18.

The exemplary latches 212 shown in FIG. 32 and FIG. 33 comprise one or more alignment guides 198, which latchably mate 218a,218b, e.g. FIG. 10-FIG. 13, to one or more corresponding latches 516, which may preferably further function as travel stops for the assembly. The assembly may also preferably comprise dedicated travel stops 520, such as extending from the lower connector substrate 504.

Contactors Having Asymmetric Connectivity. Some embodiments of the connector 182 provide asymmetric connectivity, which is well suited for a large number of applications, such as but not limited to accessing alternate pathways, connection to different circuits and/or devices, and/or providing alternate connection redundancy.

Figure 34:
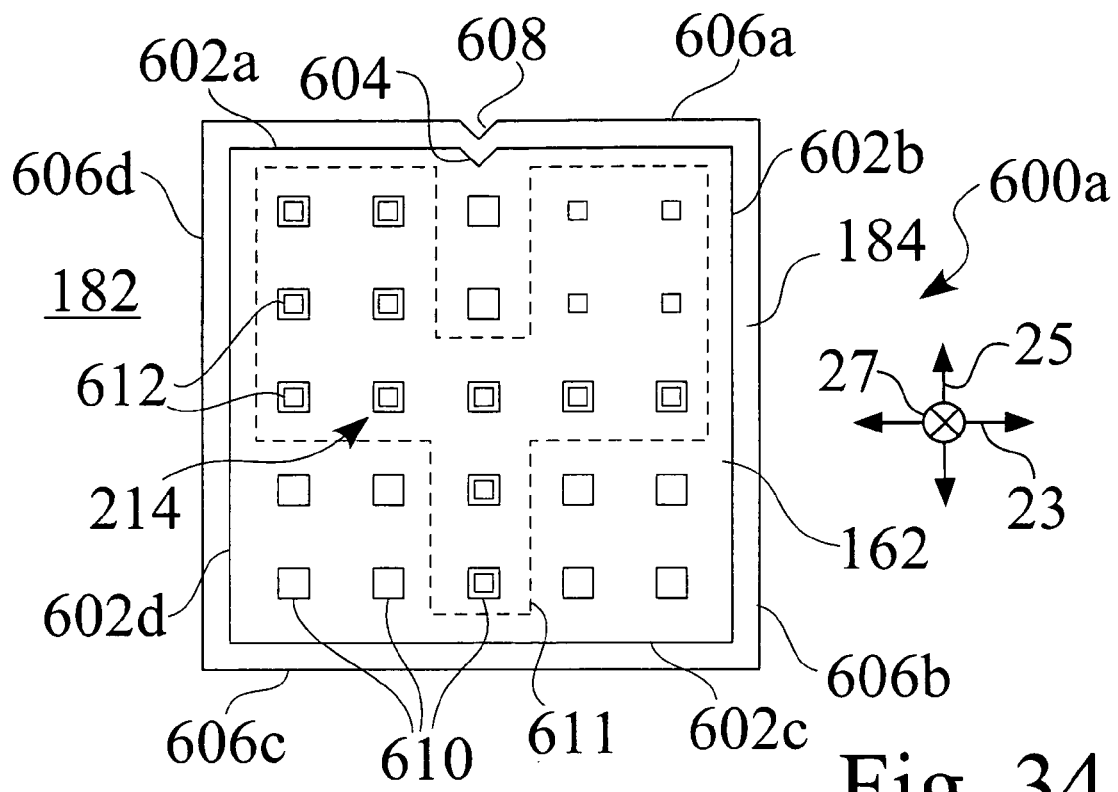
FIG. 34 is a first schematic plan view of a contactor having asymmetric connections.
Figure 35:
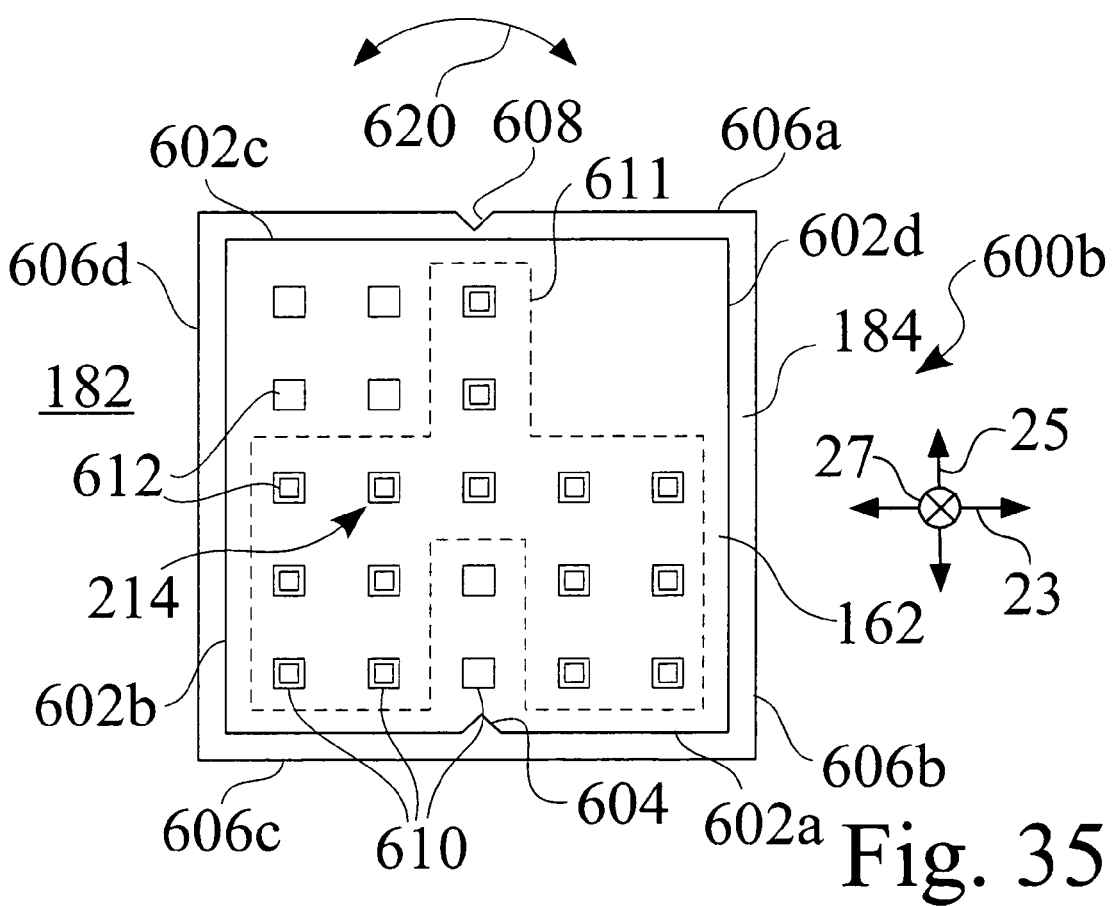
FIG. 35 is a second schematic plan view of a contactor having asymmetric connection arrays.

FIG. 34 is a first schematic plan view 600a of a connector 182 having asymmetric connections. FIG. 35 is a second schematic plan view 600b of a connector 182 having asymmetric connection arrays.

As seen in FIG. 34 and FIG. 35, a first exemplary structure 162, such as described above, comprises a plurality of sides 602a, 602b, 602c and 602d. Similarly, the second exemplary structure 184, such as described above, comprises a plurality of sides 606a, 606b, 606c and 606d. The first structure 162 may also comprise an orientation detail 604, and the second structure 184 may also comprise an orientation detail 608.

The first exemplary structure 162 seen in FIG. 34 and FIG. 35 may comprise an asymmetric array 611 of first connective paths 612, and/or the second structure 184 may comprise an asymmetric array of second connective paths 610.

As seen in FIG. 34, when the exemplary connector 182 is oriented in a first position 600a, wherein the first exemplary structure 162 and the second structure 184 are oriented such that side 602a is aligned with 606a, e.g. when details 604,608 are aligned, an array 614a of connections 214 (FIG. 9) is defined for first connective paths 612 that coincide with second connective paths 610.

As seen in FIG. 35, the first exemplary structure 162 and the second structure 184 can be selectably oriented with respect to each other, e.g. by rotating the connectors 162,184 with respect to each other about the Z-axis 27, i.e. in a plane defined by the X-axis 23 and the Y-axis 25. For example, when the exemplary connector 182 is oriented in a second position 600b, wherein the first exemplary structure 162 and the second structure 184 are oriented such that side 602a is aligned with 606c, an alternate array 614b of connections 214 is defined for first connective paths 612 that coincide with second connective paths 610.

The exemplary square connector 182 seen in FIG. 34 and FIG. 35 may preferably include more than one asymmetric position, such as to rotate ninety degrees in any direction, e.g. wherein side 602a is aligned second connector sides 606b or 606d, to provide alternate arrays 614 of connections 214.

While the exemplary connector 182 seen in FIG. 34 and FIG. 35 is shown as a square connector 182, e.g. comprising square symmetry between a first connector structure 162 and a second connector structure 184, a wide variety of component shapes and geometric symmetries may be used, such as to provide asymmetric connections 214, such as but not limited to symmetries based on rectangles, alternate polygons, and/or even cylinders with keyed, i.e. grooved mating details.

As well, some embodiments of the connector 182 provide axial asymmetric connectivity which can also be adapted for a wide variety of applications, such as but not limited to accessing alternate pathways, connection to different circuits and/or devices, and/or providing alternate connection redundancy.

For example, for a high-density interconnection assembly 182 having axial positional movement 208 in regard to a Z-axis 27, axial movement 208 can define an amount of insertion between a first connector structure 162 and a second connector structure 184. Axial movement 208 in relation to an insertion axis may define any relative movement between a first connector structure 162 and a second connector structure 184, such as between at least two positions, wherein positions may define positions of separation between springs 40 and opposing contacts 90, position of first contact for one or more springs 40, positions of compliant, i.e. compressed contact, and/or positions of contact limits, such as determined by one or more travel stops, latches, and/or detents.

Some embodiments of high-density interconnection assemblies 182 provide springs 40 having relatively similar height 702 (FIG. 36), and opposing pads 90 having relatively similar height 704 (FIG. 36), such as to provide a plurality of connections between entire arrays of opposing springs 40 and electrically conductive pads 190.

As well, alternate embodiments of high-density interconnection assemblies 182 provide springs 40 having different heights 702, and/or opposing electrically conductive pads 190 having different heights 704, such as to provide differing arrays of connections between entire arrays of opposing springs 40 and electrically conductive pads 190, based upon axial positioning relation to an insertion axis, e.g. Z-axis 27. Spring height 702 can be varied in a number of ways known to those skilled in the art, including, for example, by varying the design length of the springs on the substrate as defined by photolithography. Pad height 704 can varied in a number of ways known to those skilled in the art, for example, by varying the thickness of metal plated onto the pad support substrate 186,188.

Figure 36:
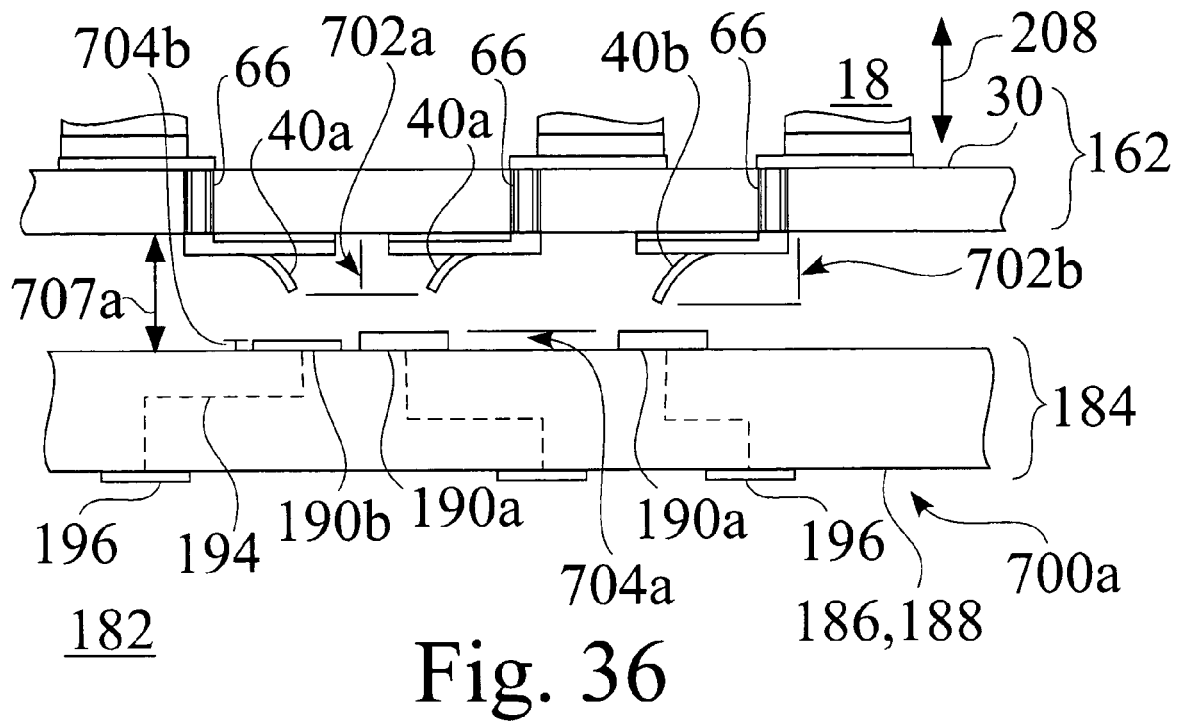
FIG. 36 is a schematic partial cutaway view of a connector having asymmetric axial connectivity in a first position.
Figure 37:
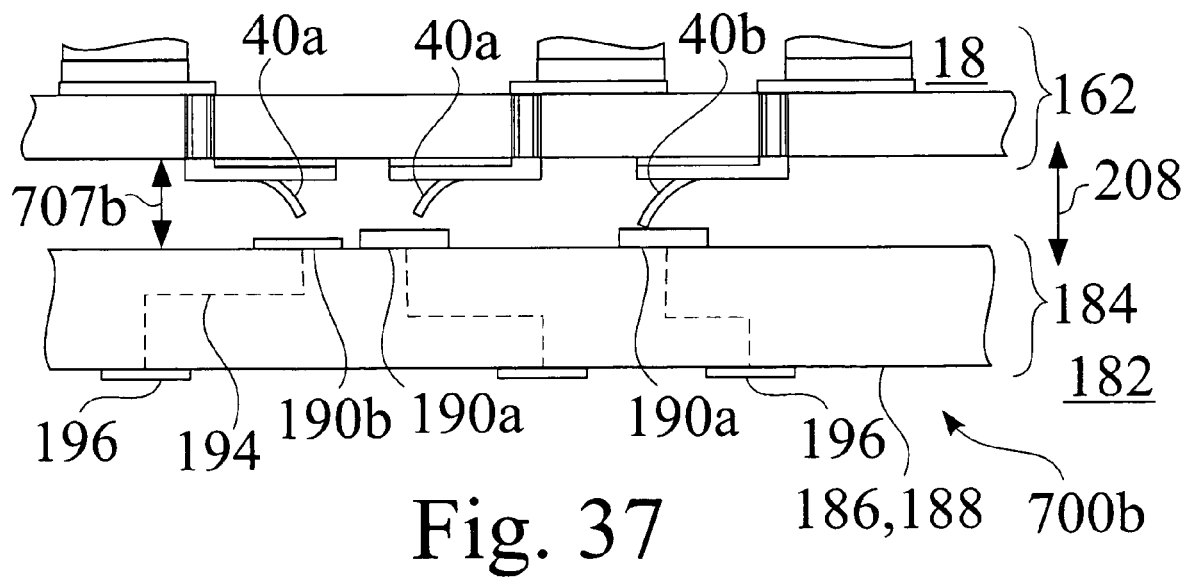
FIG. 37 is a schematic partial cutaway view of a connector having asymmetric axial connectivity in a second position.
Figure 38:
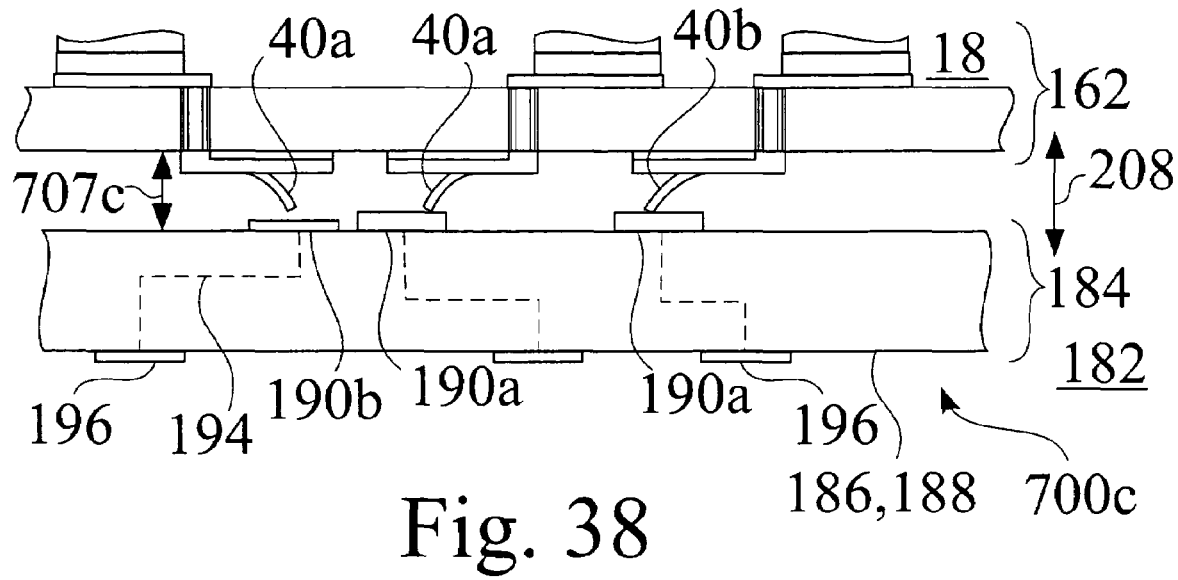
FIG. 38 is a schematic partial cutaway view of a connector having asymmetric axial connectivity in a third position.
Figure 39:
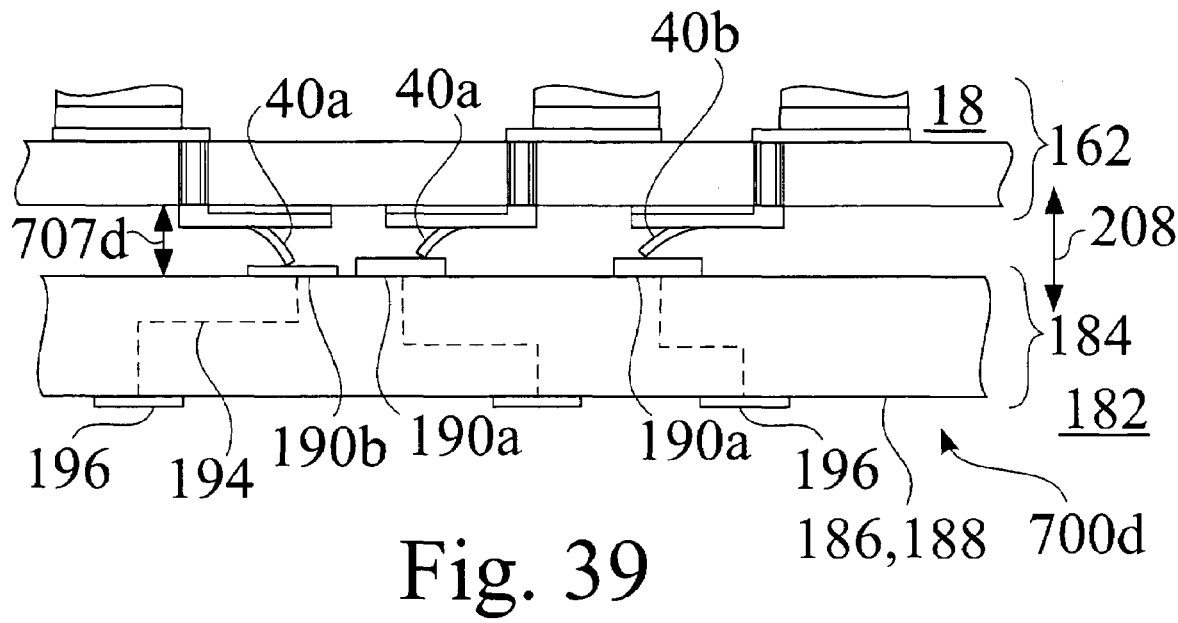
FIG. 39 is a schematic partial cutaway view of a connector having asymmetric axial connectivity in a fourth position.

FIG. 36 is a schematic partial cutaway view of a connector 182 having asymmetric axial connectivity in a first position 700a. FIG. 37 is a schematic partial cutaway view of a connector 182 having asymmetric axial connectivity in a second position 700b. FIG. 38 is a schematic partial cutaway view of a connector 182 having asymmetric axial connectivity in a third position 700c. FIG. 39 is a schematic partial cutaway view of a connector 182 having asymmetric axial connectivity in a fourth position 700d.

As seen in FIG. 36, the first connector structure 162 typically comprises a contactor substrate 30 having compliant springs 40, e.g. 40a,40b, extending away from the substrate 30 toward the second connector structure 184. The compliant springs 40 shown in FIG. 36 define a formed spring height 702, such as relative either to the substrate 30 or to one of the layers, e.g. release layer 90 (FIG. 3), upon which they are formed. As seen in FIG. 36, the spring height 702a for springs 40a is less than the spring height 702b for a spring 40b.

As also seen in FIG. 36, the second connector structure 184 typically comprises a board substrate 186,188 having electrically conductive pads 90 extending away from the substrate 186,188 toward the first connector structure 162. The pads 90 shown in FIG. 36 define a pad height 704, typically relative to the substrate 186,188. As seen in FIG. 36, pad height 704a for pads 92a is more than the pad height 704b for a spring 92b.

The difference in heights 702 and 704 inherently provides means for asymmetrical contacts with respect to an insertion axis, e.g. Z-axis 27. As seen in FIG. 37, at a position 700b, wherein a first distance 707a is defined between the contactor substrate 30 and the substrate 186,188, the spring 40b is electrically connected to an opposing 90b, while springs 40a are not electrically connected to corresponding pads 92a,92b. As seen in FIG. 38, at a position 700c, the spring 40b is partially compressed and is electrically connected to an opposing pad 90b, while a second pad 90b is electrically connected to an opposing spring 40a, and while pad 92b is not electrically connected to its corresponding pad 40a. As seen in FIG. 38, at a position 700d, the spring 40b is further compressed and is electrically connected to an opposing pad 90b, the second pad 90b is electrically connected to an opposing compressed spring 40a, and pad 92b is electrically connected to its corresponding pad 40a.

The connectors 182 having asymmetric axial connectivity seen in FIGS. 36-39 can therefore preferably provide one or more contactor states at different distances 707, e.g. 707a-707d, and can be used for a wide variety of applications, such as to connect one or more connected circuits based upon position 700, and/or to provide sensing or control, such as to sense a limit for insertion travel 208.

High density connectors 182 utilize arrays of micro-fabricated spring contacts 40, fabricated on a substrate 18, to provide simultaneous electrical contact between two objects, such as but not limited to components, devices, systems, sub-systems, and/or substrates. Some preferred embodiments of the connectors 182 can be utilized for space confined applications, such as but not limited to cell phones, personal digital assistants (PDAs), computers, portable computers, medical devices, cameras, video cameras, printers, imaging devices, digital media players, and/or other portable electronic systems where it is desired to minimize the space required in the X, Y, or Z directions 23,25,27 or any combination thereof.

The force versus displacement characteristics of the springs 40 are controlled by the design of the spring 40, and multiple types of spring characteristics can be provided in a single device, e.g. 18, since the springs 40 are batch processed with photolithographic chip processing technologies. Force can be increased by adding plated metal layers, e.g. such as one or more layers (68,70 (FIG. 2); 104 (FIG. 3)) or decreased by making the springs 40 longer, narrower, or thinner. Low force springs 40 can maintain electrical contact, while imparting minimal loading to external actuation systems.

Some embodiments of high density connectors 182 comprise arrays of micro-fabricated spring contacts, fabricated on a substrate, to provide simultaneous electrical contact between two objects (including components, devices, systems, sub-systems, substrates, etc.) in applications where it is desired to maximize connection density or minimize the space required in the X, Y, or Z directions or any combination thereof and where it is desired to interconnect components with IC bond bad spacings to components with printed circuit board spacings.

As well, some embodiments of high density connectors 182 comprise arrays of micro-fabricated spring contacts fabricated on multiple integrated circuit devices, to provide electrical contact between the integrated circuit devices and a common support substrate and thermal contact with a common heat sink wherein each device may have different thicknesses and/or coefficients of thermal expansion.

Furthermore, some embodiments of high density connectors 182 comprise arrays of micro-fabricated spring contacts 40, fabricated on a substrate, e.g. contactor substrate 30, at very high density to provide a small area, thin and inexpensive electrical connector between two objects (including components, devices, systems, sub-systems, and/or substrates).

In addition, some embodiments of high density connectors 182 comprise arrays of micro-fabricated spring contacts 40, fabricated on one side of a flexible thin substrate, e.g. contactor substrate 30, at very high density and the other side of the substrate 30 at a low density, so as to provide a space transforming function and thus to provide an inexpensive electrical connector between two objects, e.g. such as but not limited to components, devices, systems, sub-systems, and/or substrates, having widely varying electrical connection pitches.

As described above, some embodiments of high density connectors 182 comprise arrays of micro-fabricated spring contacts 40, fabricated on a substrate 30, to provide simultaneous electrical contact between two objects, e.g. such as but not limited to components, devices, systems, sub-systems, and/or substrates, over a range of distances between the objects and/or during relative motion of the objects with respect to each other.

In some embodiments of the present invention, the tips 62 of the spring contacts 40 can be soldered or otherwise affixed to the targeted electrical contact pads. Affixing the probe tips 62 to the electrically conductive pads 190 eliminates tip sliding and resists X, Y, and Z motion, however with an appropriate applied force, the position or orientation of one object with respect to the other can be changed and when the applied force is removed, the objects reposition themselves to the initial position assuming that all displacements have been small enough to avoid plastic deformation of the springs. With the tips of the spring contacts affixed to a support substrate, the spring contacts are capable of supplying both a pushing and a pulling force against external actuators.

In an additional aspect of the present invention, more than one spring contact design may be employed to provide springs with differing characteristics to carry out differing functions. In an exemplary embodiment, one type spring contacts can be designed and positioned to provide electrical contacts at specific locations whereas other types springs can be designed and positioned at other locations to provide mechanical forces to perform separate functions. This is possible since the mechanical characteristics of the springs can be changed by changing their length, width or their position yet since all of the springs are fabricated simultaneously, multiple types of springs can be provided with the same fabrication steps.

The aspects of the invention described above can be used individually or in combinations to create alternative embodiments of the present invention. In the foregoing examples, the term substrate is intended to mean a thin or thick, inflexible or flexible, hard or soft insulating material that is chosen to be best suited for a particular application. Substrates are typically fabricated from single or multi-layer ceramic, glass ceramic, glass, quartz, semiconductors such as silicon, and/or polymers such as polyimide or printed circuit board materials, e.g. FR-4. Substrates may also be complete integrated circuits or hybrid integrated circuits. Substrates may be sacrificial or temporary wherein springs are fabricated, using either monolithic or non-monolithic processing methods, on a fabrication substrate. Springs can be removed from the fabrication substrate after fabrication and used in either free standing applications or in combination with other structures.

System Advantages. The use of high-density connectors 182 inherently provides improvements for several areas of connector design, such as:

Thermal Coefficient of Expansion (TCE) mismatch:
Lack of Co-Planarity;
Thermal management;
High frequency performance; and/or
Cost The X-Y compliance provided by spring probes 40 in high-density connectors 182, which preferably comprise micro-fabricated spring contacts 40, compensates for TCE mismatch between a first connector assembly 162 and a second connector assembly 184, such as between a device and a printed circuit board, while the Z-compliance of the spring probes 40 compensates for lack of co planarity.

As well, Z-compliance and customizable length springs 40 accommodate chip packages 18 with different contactor scale package substrate thickness 75, such as for multiple-die packages, e.g. system in package (SiP). Furthermore, multilevel metal can be used to provide controlled impedance and shielded signal paths. In addition, preferred embodiments of high-density connectors 182 which utilize photolithographic self-assembling springs have an advantageous cost/performance ratio.

In addition, the use of one or more latches 212 between a first connector assembly 162 and a second connector assembly 184 provides both a mechanical connection between the assemblies 162,184, as well as a controlled connection environment, such as between the compliant spring probes 40 and opposing electrically conductive pads 190.

The use of high-density connectors 182 lowers the cost of ownership for many high-density assemblies, by allowing users to easily change contactor assemblies 18 and associated connector assemblies 162, such as by disconnecting the latches 212. The high-density connectors 182 allow a trained user or field service engineer to quickly change either the first connector assembly, i.e. contactor 162 and/or a second connector assembly 184, such as at a customer site.

As well, customers can keep an inventory of first connector assemblies 162 and/or second connector assemblies 184 on hand, and swap first connector assemblies 162 and/or second connector assemblies 184 as needed, instead of an entire high density electronic assembly. This capability minimizes downtime related to contactor issues, such as for regular scheduled cleaning, tip wear, tip failure, and/or unexpected tip contamination.

The disclosed methods of design and fabrication associated with the manufacture of high density connectors 182 reduce or eliminate the need for planarity adjustments at final assembly.

High-density connectors 182 comprise components with mechanical surfaces that are sufficiently flat and parallel to one another, that enable them to act as reference surfaces for other components either within the probe card assembly system, or that interface to the probe card assembly system. As well, the high density connectors 182 and associated processes maintain low resistance electrical connections to a device under test at either elevated or depressed operating temperatures.

Furthermore, high-density connectors 182 have relatively flat and parallel component surfaces, which more evenly distributes and vertically transmits the high forces associated with high I/O count connectors, to reduce peak-to peak mechanical deflections within the connector system, wherein the forces are generated either by the various spring pre-loading mechanisms or by the compression of the spring probes during connection.

In addition, the high-density connectors 182 have components with improved flatness and parallelism that can rest against each other, that enable pre-aligned, easy to replace components and sub-assemblies. Relatively flat and parallel surfaces and probe tip arrays having smaller deviations from co-planarity reduce the need for planarity adjustment. Additionally, the use of relatively flat and parallel reference surfaces enables the use of very low force interposers if used, e.g. 0.05 g to 5 g per contact, to make low resistance high-density electrical connections over large areas, e.g. 1,000 sq cm for 300 mm wafers. Furthermore, low force interposers combined with flat and parallel reference and support surfaces enable simpler methods of clamping and achieving and maintaining planarity. Alternatively, large area components such as mother boards, Z-blocks, etc. with flat surfaces enable the use of vacuum actuated systems to achieve high levels of surface parallelism. Additionally, large area solid electrical interface connections fabricated with materials such as solder, gold wire bond bumps, plated bumps, or adhesives all have higher manufacturing yields and perform better and more reliably with flatter and more parallel interconnection support surfaces.

As well, time is often critical factor for users of high-density connector assemblies 182, such as semiconductor manufacturers and testers. For example, conventional probe card assemblies typically comprise one or more key components that have long lead times, such as for multilayered ceramic components. As conventional assembly structures and manufacturing methods include such long lead time components, the resulting fabrication cycle for one or more assemblies is long.

In contrast, high-density connector assemblies 182 have improved, i.e. rapid, fabrication cycles, for which portions of the probe card assembly can be fabricated, assembled, and/or pre-planarized, while long-lead lead time components, such as complex, custom, or semi-custom components, are readily mountable and/or remountable from the other components and assemblies.

The methods according to the present invention adjust for the planarity differences during high density connector assembly fabrication, by reducing or eliminating requirements for applying pressure to flexible connectors and/or adjusting linear actuators. The methods according the present teachings include creating co-planar arrays of probe springs using two or more plating steps and planarizing a contactor assembly by causing variations in solder joint height to compensate for planar differences between the sub-components. Both manufacturing methods create flat reference tooling surfaces and use vacuum or other means to hold components under assembly flat against the reference tooling surfaces. In the case of probe springs, the first layer of plating is applied and the tips are made co-planar by heating while holding the tips against a reference tooling surface prior to completing the additional plating which is required to provide adequate probing force to insure a reliable electrical contact over an acceptable cycle life. In the case of the mother board to probe spring assembly, these components can be pulled flat to a reference tooling surface parallel to the WRS and solder can be reflowed to retain the parallelism.

The invention also utilizes standard components for both reducing manufacturing cost and manufacturing time.

Although high-density interconnect systems having spring probes with improved co-planarity and parallelism, and methods for manufacturing are described herein in connection with integrated circuit test probes, probe cards, electrical assemblies, articles of manufacture, and/or packages, the system and techniques can be implemented with a wide variety of devices, such as interconnections between integrated circuits and substrates within a wide variety of electronic components or devices, burn-in devices and MEMS devices, or any combination thereof, as desired.

As well, those knowledgeable and skilled in the art will readily appreciate that various alternative types of probe tips could be substituted for the stress metal spring (SMS) probe tips described herein and that therefore the teachings relating to the methods and apparatus of the present invention should not be interpreted as being limited to the use of the SMS probe tips described herein.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. An apparatus, comprising:
   a first connector structure comprising at least one contactor substrate having a contact surface and a bonding surface, the at least one contactor substrate comprising an array of at least one electrically conductive monolithically formed micro-fabricated stress metal spring contact located on and extending from the contact surface;
   a second connector structure comprising a substrate having a first connector surface and a second surface opposite the connector surface, and comprising an array of at least one electrically conductive contact pad located on the first connector surface and corresponding to the array of at least one electrically conductive spring contact, and an array of at least one electrically conductive path extending from the first connector surface to the second surface;
   means for any of movably positioning and aligning the first connector structure and the second connector structure between at least a first position and a second position with respect to each other; and
   means for mechanically affixing the first connector structure and the second connector structure, wherein the affixing means comprises at least one latchable interface between the first connector structure and the second connector structure.

2. The apparatus of claim 1, wherein the means for any of movably positioning and aligning the first connector structure and the second connector structure comprises means for axially positioning any of the first connector structure and the second connector structure.

3. The apparatus of claim 1, wherein the affixing means is any of temporary, demountable, and permanent.

4. The apparatus of claim 1, wherein the latchable interface comprises at least one latch element associated with any of the first connector structure and the second connector structure.

5. The apparatus of claim 4, wherein the at least one latch element comprises any of a groove, a ridge, a detent, a spring, a fastener, a hole, a catch, and any combination thereof.

6. The apparatus of claim 1, further comprising:
   a travel stop associated with and extending from any of the first connector structure and the second connector structure and toward the other of the first connector structure and the second connector structure.

7. The apparatus of claim 1, wherein the at least one contactor substrate further comprises an array of electrically conductive contacts on the bonding surface, and an array of at electrically conductive paths extending from respective electrically conductive spring contacts to corresponding electrically conductive contacts.

8. The apparatus of claim 7, wherein the first connector structure further comprises
   a board substrate having a first side and a second side opposite the first side, and a plurality of electrical contacts located on the first side; and
   at least one electrical connection between the board substrate and at least one contact located on the bonding surface of the spring contact substrate, the electrical connection located between at least one of the electrical contacts on the first side of the board substrate and the at least one contact located on the bonding surface of the spring contact substrate.

9. The apparatus of claim 8, wherein the electrical connection between the board substrate and the at least one contact located on the bonding surface of the spring contact substrate comprises any of a solder ball and a solder joint connection.

10. The apparatus of claim 1, wherein in at least one of any of the first position and the second position, at least one electrically conductive spring contact is electrically connected to at least one electrically conductive contact pad.

11. The apparatus of claim 10, further comprising an article of manufacture associated with any of the first connector structure and the second connector structure, the article of manufacture having a plurality of operating states, wherein at least one operating state of the article of manufacture is at least partially associated with the respective position of the first connector structure and the second connector structure relative to each other.

12. The apparatus of claim 1, wherein in at least the first position and the second position, at least one electrically conductive spring contact is electrically connected to at least one electrically conductive contact pad.

13. The apparatus of claim 1, wherein fan-out is provided by any of the first connector structure and the second connector structure;
   wherein for the first connector structure, the at least one contactor substrate further comprises an array of electrically conductive contacts on the bonding surface, and an array of electrically conductive paths extending from respective electrically conductive spring contacts to corresponding electrically conductive contacts, wherein the distance between at least two electrically conductive spring contacts on the contact surface is less than the distance between any of the electrically conductive contacts on the bonding surface; and wherein for the second connector structure, the array of at least one electrically conductive contact pad on the first connector surface of the second connector structure comprises a plurality of electrically conductive contact pads, wherein the second connector structure further comprises an array of electrical contacts on the second surface, wherein that the distance between at least two electrically conductive contact pads on the first connector surface is less than the distance between any of the electrical contacts on the second surface.

14. The apparatus of claim 1, wherein the second connector structure further comprises an array comprising a solder ball located on at least one of the electrically conductive contact pads on the first connector surface.

15. The apparatus of claim 14, wherein the spring contacts define a leading tip;

wherein when the first connector structure and the second connector structure are in at least one position proximate to each other, the spring contacts are axially positioned with respect to the solder balls.

16. The apparatus of claim 15, wherein the solder balls define a convex contact surface, and wherein the leading tips are aligned with any of an inclined leading face, a horizontal center face and an inclined trailing face of the solder balls.

17. The apparatus of claim 16, wherein at least two of the spring contacts are located to offset respective lateral forces applied to associated solder balls.

18. The apparatus of claim 16, wherein at least two spring contacts are associated with each solder ball.

19. The apparatus of claim 18, wherein at least two of the spring contacts are located to offset respective lateral forces applied between their respective leading tips and associated solder balls.

20. The apparatus of claim 1, wherein the second connector structure further comprises at least one element located on the back surface of the substrate, the element comprising any of a second substrate, a component, a heat sink, and a connector.

21. The apparatus of claim 1, further comprising:
at least one structural element;
wherein the bonding surface of the at least one contactor substrate is in contact with the structural element; and
wherein each of the at least one contactor substrate comprises a package assembly.

22. The apparatus of claim 21, wherein the structural element comprises any of a heat sink, a carrier, and a surface mount package.

23. The apparatus of claim 1, wherein the spring contacts comprise any of flexible springs, compliant springs, and elongate resilient probe elements.

24. The apparatus of claim 1, wherein the contactor substrate comprises any of ceramic, multi-layer ceramic, glass ceramic, glass, quartz, glass epoxy, FR-4, polyimide, a semiconductor wafer, silicon, a printed circuit board, one or more flip chip semiconductor devices, one or more packaged semiconductor devices, a semiconductor integrated circuit, and a hybrid integrated circuit.

25. The apparatus of claim 1, wherein the substrate of the second connector structure comprises any of ceramic, multi-layer ceramic, glass ceramic, glass, quartz, glass epoxy, FR-4, polyimide, a semiconductor wafer, silicon, a printed circuit board, one or more flip chip semiconductor devices, one or more packaged semiconductor devices, a semiconductor integrated circuit, and a hybrid integrated circuit.

26. The apparatus of claim 1, wherein the array of electrically conductive monolithically formed micro-fabricated stress metal spring contacts is either
formed on any of a sacrificial substrate and a temporary substrate and thereafter removed and affixed to the contactor substrate; or
formed in place on the contactor substrate.

27. An apparatus, comprising:
a first connector structure comprising at least one contactor substrate having a contact surface and a bonding surface, the at least one contactor substrate comprising an array of at least one electrically conductive monolithically formed micro-fabricated stress metal spring contact located on and extending from the contact surface, wherein the spring contacts define a leading tip;
a second connector structure comprising a substrate having a first connector surface and a second surface opposite the connector surface, and comprising
an array of at least one electrically conductive contact pad located on the first connector surface and corresponding to the array of at least one electrically conductive spring contact,
an array of at least one electrically conductive path extending from the first connector surface to the second surface, and
an array comprising solder balls located on at least one of the electrically conductive contact pads on the first connector surface, wherein the solder balls define a convex contact surface; and
means for any of movably positioning and aligning the first connector structure and the second connector structure between at least a first position and a second position with respect to each other;
wherein when the first connector structure and the second connector structure are in at least one position proximate to each other, the spring contacts are axially positioned with respect to the solder balls, wherein the leading tips are aligned with any of an inclined leading face, a horizontal center face and an inclined trailing face of the solder balls.

28. The apparatus of claim 27, wherein at least two of the spring contacts are located to offset respective lateral forces applied to associated solder balls.

29. The apparatus of claim 27, wherein at least two spring contacts are associated with each solder ball.

30. The apparatus of claim 29, wherein at least two of the spring contacts are located to offset respective lateral forces applied between their respective leading tips and associated solder balls.

31. The apparatus of claim 27, wherein the means for any of movably positioning and aligning the first connector structure and the second connector structure comprises means for axially positioning any of the first connector structure and the second connector structure.

32. The apparatus of claim 27, further comprising:
means for mechanically affixing the first connector structure and the second connector structure.

33. The apparatus of claim 32, wherein the affixing means is any of temporary, demountable, and permanent.

34. The apparatus of claim 27, further comprising:
a travel stop associated with and extending from any of the first connector structure and the second connector structure and toward the other of the first connector structure and the second connector structure.

35. The apparatus of claim 27, wherein the at least one contactor substrate further comprises an array of electrically conductive contacts on the bonding surface, and an array of electrically conductive paths extending from respective electrically conductive spring contacts to corresponding electrically conductive contacts.

36. The apparatus of claim 35, wherein the first connector structure further comprises
   a board substrate having a first side and a second side opposite the first side, and a plurality of electrical contacts located on the first side; and
   at least one electrical connection between the board substrate and at least one contact located on the bonding surface of the spring contact substrate, the electrical connection located between at least one of the electrical contacts on the first side of the board substrate and the at least one contact located on the bonding surface of the spring contact substrate.

37. The apparatus of claim 36, wherein the electrical connection between the board substrate and the at least one contact located on the bonding surface of the spring contact substrate comprises any of a solder ball and a solder joint connection.

38. The apparatus of claim 27, wherein in at least one of any of the first position and the second position, at least one electrically conductive spring contact is electrically connected to at least one electrically conductive contact pad.

39. The apparatus of claim 38, further comprising an article of manufacture associated with any of the first connector structure and the second connector structure, the article of manufacture having a plurality of operating states, wherein at least one operating state of the article of manufacture is at least partially associated with the respective position of the first connector structure and the second connector structure relative to each other.

40. The apparatus of claim 27, wherein in at least the first position and the second position, at least one electrically conductive spring contact is electrically connected to at least one electrically conductive contact pad.

41. The apparatus of claim 27, wherein fan-out is provided by any of the first connector structure and the second connector structure;
   wherein for the first connector structure, the at least one contactor substrate further comprises an array of electrically conductive contacts on the bonding surface, and an array of electrically conductive paths extending from respective electrically conductive spring contacts to corresponding electrically conductive contacts, wherein the distance between at least two electrically conductive spring contacts on the contact surface is less than the distance between any of the electrically conductive contacts on the bonding surface; and
   wherein for the second connector structure, the array of at least one electrically conductive contact pad on the first connector surface of the second connector structure comprises a plurality of electrically conductive contact pads, wherein the second connector structure further comprises an array of electrical contacts on the second surface, wherein the distance between at least two electrically conductive contact pads on the first connector surface is less than the distance between any of the electrical contacts on the second surface.

42. The apparatus of claim 27, wherein the second connector structure further comprises an array comprising a solder ball located on at least one of the electrically conductive contact pads on the first connector surface.

43. The apparatus of claim 42, wherein the spring contacts define a leading tip;
   wherein when the first connector structure and the second connector structure are in at least one position proximate to each other, the spring contacts are axially positioned with respect to the solder balls.

44. The apparatus of claim 27, wherein the second connector structure further comprises at least one element located on the back surface of the substrate, the element comprising any of a second substrate, a component, a heat sink, and a connector.

45. The apparatus of claim 27, further comprising:
   at least one structural element;
   wherein the bonding surface of the at least one contactor substrate is in contact with the structural element; and
   wherein each of the at least one contactor substrate comprises a package assembly.

46. The apparatus of claim 45, wherein the structural element comprises any of a heat sink, a carrier, and a surface mount package.

47. The apparatus of claim 27, wherein the spring contacts comprise any of flexible springs, compliant springs, and elongate resilient probe elements.

48. The apparatus of claim 27, wherein the contactor substrate comprises any of ceramic, multi-layer ceramic, glass ceramic, glass, quartz, glass epoxy, FR-4, polyimide, a semiconductor wafer, silicon, a printed circuit board, one or more flip chip semiconductor devices, one or more packaged semiconductor devices, a semiconductor integrated circuit, and a hybrid integrated circuit.

49. The apparatus of claim 27, wherein the substrate of the second connector structure comprises any of ceramic, multi-layer ceramic, glass ceramic, glass, quartz, glass epoxy, FR-4, polyimide, a semiconductor wafer, silicon, a printed circuit board, one or more flip chip semiconductor devices, one or more packaged semiconductor devices, a semiconductor integrated circuit, and a hybrid integrated circuit.

50. The apparatus of claim 27, wherein the array of electrically conductive monolithically formed micro-fabricated stress metal spring contacts is either
   formed on any of a sacrificial substrate and a temporary substrate and thereafter removed and affixed to the contactor substrate; or
   formed in place on the contactor substrate.

* * * * *

UNITED STATES PATENT AND TRADEMARK OFFICE
CERTIFICATE OF CORRECTION

| | | |
|---|---|---|
| PATENT NO. | : 7,579,848 B2 | Page 1 of 1 |
| APPLICATION NO. | : 11/350049 | |
| DATED | : August 25, 2009 | |
| INVENTOR(S) | : Wilmer R. Bottoms et al. | |

It is certified that error appears in the above-identified patent and that said Letters Patent is hereby corrected as shown below:

On the Title Page Item (63)
Add to Related U.S. Application Data, last line, immediately following "now Pat. No. 6,799,976":
--which is a national stage of PCT Patent Application Serial No. PCT/US00/21012, filed on July 27, 2000.--
And add Item (86)
--PCT Patent Application No. PCT/US05/17881, filed on May 20, 2005--
--U.S. Provisional Application No. 60/573,541, filed on May 20, 2004--
--U.S. Provisional Application No. 60/592,908, filed on July 29, 2004--

Signed and Sealed this

Fifteenth Day of December, 2009

David J. Kappos
*Director of the United States Patent and Trademark Office*